(12) United States Patent
Lakkis

(10) Patent No.: US 7,349,478 B2
(45) Date of Patent: Mar. 25, 2008

(54) ULTRA-WIDEBAND COMMUNICATION APPARATUS AND METHODS

(75) Inventor: Ismail Lakkis, San Diego, CA (US)

(73) Assignee: Pulse-LINK, Inc., Carlsbad, CA (US)

( * ) Notice: Subject to any disclaimer, the term of this patent is extended or adjusted under 35 U.S.C. 154(b) by 358 days.

(21) Appl. No.: 10/988,373

(22) Filed: Nov. 12, 2004

(65) Prior Publication Data

US 2005/0117557 A1   Jun. 2, 2005

Related U.S. Application Data

(63) Continuation-in-part of application No. 10/952,485, filed on Sep. 27, 2004, which is a continuation-in-part of application No. 10/120,456, filed on Apr. 9, 2002, which is a continuation-in-part of application No. 10/010,601, filed on Dec. 6, 2001, now abandoned.

(51) Int. Cl.
*H04B 1/66* (2006.01)
*H04L 23/02* (2006.01)

(52) U.S. Cl. .................. 375/240.27; 375/265; 375/262; 375/295

(58) Field of Classification Search ................ 375/295, 375/149, 240.26–240.28, 240.24, 316, 243, 375/246, 265, 262; 704/501, 504; 358/539; 714/755, 759

See application file for complete search history.

(56) References Cited

U.S. PATENT DOCUMENTS 3,568,148 A  *  3/1971  Clark, Jr. .................... 714/785

| 5,422,952 | A |  6/1995 | Kennedy et al. |
| 5,563,909 | A | 10/1996 | Nakazawa |
| 5,675,572 | A | 10/1997 | Hidejima et al. |
| 5,949,813 | A |  9/1999 | Hunsinger et al. |
| 6,049,707 | A |  4/2000 | Buer et al. |
| 6,067,290 | A |  5/2000 | Paulraj et al. |
| 6,128,330 | A | 10/2000 | Schilling |

(Continued)

OTHER PUBLICATIONS

Suk Won Kim, Dong Sam Ha & Jeong Ho Kim, Performance Gain of Smart Antennas with Diversity Combining at Handsets for the 3GPP WCDMA System, 13th International Conference on Wireless Communications (Wireless 2001), Jul. 2001, pp. 235-242, Calgary, ALberta, Canada.

(Continued)

*Primary Examiner*—David C. Payne
*Assistant Examiner*—Linda Wong

(57) ABSTRACT

Apparatus and methods of ultra-wideband (UWB) communication are provided. In one embodiment, an ultra-wideband transmitter includes a processor configured to generate data for transmission in the form of a plurality of ultra-wideband pulses. The transmitter includes a FEC encoder that generates a code word based on the data. The FEC includes a plurality of cyclic shift registers configured to receive and process the data, a plurality of fixed connections between each of the plurality of cyclic shift registers and a plurality of XOR gates communicating with the plurality of fixed connections. This Abstract is provided for the sole purpose of complying with the Abstract requirement rules that allow a reader to quickly ascertain the subject matter of the disclosure contained herein. This Abstract is submitted with the explicit understanding that it will not be used to interpret or to limit the scope or the meaning of the claims.

3 Claims, 35 Drawing Sheets

U.S. PATENT DOCUMENTS

| | | | |
|---|---|---|---|
| 6,191,724 B1* | 2/2001 | McEwan | 342/21 |
| 6,192,068 B1 | 2/2001 | Fattouche et al. | |
| 6,298,092 B1 | 10/2001 | Heath, Jr. et al. | |
| 6,317,411 B1 | 11/2001 | Whinnett et al. | |
| 6,320,897 B1 | 11/2001 | Fattouche et al. | |
| 6,351,499 B1 | 2/2002 | Paulraj et al. | |
| RE37,802 E | 7/2002 | Fattouche et al. | |
| 6,466,610 B1 | 10/2002 | Schilling | |
| 6,700,939 B1* | 3/2004 | McCorkle et al. | 375/295 |
| 6,701,129 B1 | 3/2004 | Hashem et al. | |
| 6,851,086 B2* | 2/2005 | Szymanski | 714/781 |
| 2002/0042899 A1 | 4/2002 | Tzannes et al. | |
| 2003/0033575 A1 | 2/2003 | Richardson et al. | |
| 2004/0034828 A1 | 2/2004 | Hocevar | |
| 2004/0057575 A1 | 3/2004 | Zhang et al. | |
| 2004/0098659 A1 | 5/2004 | Bjerke et al. | |
| 2004/0153938 A1 | 8/2004 | Okamura et al. | |

OTHER PUBLICATIONS

Yiannia Argyropoulos, Scott Jordan & Srikanta P. R. Kumar, Dynamic Channel Allocation in Interference-Limited Cellular SYstems with Uneven Traffic Distribution, IEEE Transactions on Vehicular Technology, vol. 48, No. 1, Jan. 1999, pp. 224-232.

Anurag Kahol, Sumit Khurana, Sandeep K Gupta & Pradip K Srimani, Adaptive Distributed Dynamic Channel Allocation for Wireless Networks, Computer Science Technical Report CS-98-105, May 27, 1998, 11 pages.

Shengli Zhou & Georgios B. Giannakis, Space-Time Coding with Maximum DIversity Gains Over Frequency-Selective Fading Channels, IEEE Signal Processing Letters, vol. 8, No. 10, Oct. 2001, pp. 269-272.

Zhiqiang Liu, Yan Xin & Georios B. Giannakis, Space-Time-Frequency Coded OFDM Over Frequency-Selective Fading Channels, IEEE Transactions on Signal Processing, vol. 50, No. 10, Oct. 2002, pp. 2465-2476.

Hector Salgado, Marvin Sirbu & Jon Peha, Spectrum Sharing Through Dynamic Channel Assignment for Open Access to Personal Communications Services, Proc. of IEEE Intl. COmmunications Comference (ICC), Jun. 1995, pp. 417-422.

Helmut Bolcskei, Moritz Borgmann & Arogyaswami J. Paulraj, Space-Frequency Coded MIMO-OFDM with Variable Multiplexing-Diversity Tradeoff, IEEE 2003, pp. 2837-2841.

Timothy X Brown, Dynamic Channel Assignment in Shotgun Cellular Systems, Proc. of 1999 IEEE Radio and Wireless Conference (RAWCON99), pp. 147-150.

Chi Chung Lam, An Efficient Distrubuted Channel Allocation Algorithm Based on Dynamic Channel Boundaries, IEEE 1996, pp. 236-243.

Azzedine Boukerche, Sungbum Hong & Tom Jacob, Distributed Dynamic Channel Allocation for Mobile Communication System, Proceedings of the Eighth International Symposium on Modeling, Analysis and Simulation of Computer and Telecommunications Systems, IEEE 2000.

Jonathan S. Blogh, Peter J. Cherriman & Lajos Hanzo, Dynamic Channel Allocation Techniques Using Adaptive Modulation and Adaptive Antennas, IEEE Journal on Selected Areas in Communication, vol. 19, No. 2, Feb. 2001, pp. 312-321.

Sergio Verdu, Wireless Bandwidth in the Making, Multiple Access for Broadband Wireless Networks, IEEE Communications Magazine, Jul. 2000, pp. 53-58.

Jeff Foerster et al., Intel CFP Presentation for a UWB PHY, IEEE P802.15 Working Group for Wireless Personal Area Networks, IEEE 802.15-03/109, Mar. 3, 2003, 53 pages.

Joy Kelly et al., Multi-band OFDM Physical Layer Proposal Update, IEEE P802.15 Working Group for Wireless Personal Area Networks, IEEE 802.15-04/0122r4, Mar. 15, 2004, 26 pages.

David G. Leeper, Wireless Data Blaster, Scientific American, May 2002, pp. 64-69.

Bruno Pattan, A Brief Exposure to Ultra-Wideband Signaling, Microwace Journal, Dec. 2003, 5 pages.

Zhong Ye, Gary J. Saulnier, Kenneth S. Vastola and Michael J. Medley, Throuput Analysis for a Packet Radio Network Using Rate Adaptive OFDM Signaling, IEEE International Conference on Communications, Jun. 1999, 7 pages.

Patrick Vandenameele, Liesbet van der Perre, Marc Engels, Bert Gyselinckx and Hugo de Man, A Combined OFDM/SDMA Approach, IEEE Journal on Selected Areas in Communications, Nov. 2000, 27 pages.

Justin Chuang and Nelson Sollenberger, Beyond 3G: Wideband Wireless Data Access Based on OFDM and Dynamic Packet Assignment, Multiple Access for Broadband Wireless Networks, IEEE Communications Magazine, Jul. 2000, pp. 78-87.

Ove Edfords, Magnus Sandell, Jan-Jaap van de Beek, Daniel Lamdstrom and Frank Sjoberg, An Introduction to orthogonal frequency-division multiplexing, Sep. 1996, 50 pages.

Rick S. Blum, Ye Li, Jack H. Winters and Qing Yan, Improved Space—Time Coding for MIMO-OFDM Wireless Communications, IEEE Transactions on Communications, vol. 49, No. 11, Nov. 2001, pp. 1873-1878.

Cheong Yui Wong, Roger S. Cheng, Khaled Ben Letaief and Ross D. Murch, Multiuser OFDM with Adaptive Subcarrier, Bit, and Power Allocation, IEEE Journal on Selected Areas in Communications, vol. 17, No. 10, Oct. 1999, pp. 1747-1758.

John A. C. Bingham, Multicarrier Modulation for Data Transmission: An Idea Whose Time Has Come, IEEE Communications Magazine, May 1990, pp. 5-14.

Robert G Gallager, Low-Density Parity-Check Codes, Cambridge, Massachussets, Jul. 1963, 90 pages.

Marjan Karkooti, Semi-Parallel Architectures For Real-Time LDPC Coding, A Thesis Submitted in Partial Fulfillment of the Requirements for the Degree Master of Science, Rice University, Houston, Texas, May 2004, 78 pages.

Khiam-Boon Png, Xiaoming Peng & Francois Chin, Performance Studies of a Multi-band OFDM System Using a Simplified LDPC Code, 0-7803-8373-7/04 IEEE 2004, pp. 376-380, Singapore.

A. M'Sir, F Monteiro, A. Dandache & B. Lepley, Designing a High Speed Decoder for Cycling Codes, Proceedings of the 10th IEEE International On-Live Testing Symposium (IOTS'04), 6 pages, France.

Benjamin Levine, R. Reed Taylor & Herman Schmit, Implementation of Near Shannon Limit Error-Correction Codes Using Reconfigurable Hardware, Carnegie Mellon University, Pittsburg, Pennsylvania, 10 pages.

Ben Lu, Xiaodong Wang & Krishna R. Narayanan, LDPC-Based Space-Time Coded OFDM Systems Over Correlated Fading Channels: Performance Analysis and Receiver Design, IEEE Transactions on Communications, vol. 50, No. 1, Jan. 2002, pp. 74-88.

Tong Zhang & Keshab K. Parhi, A 54 MBPS (3,6)-Regular FPGA LDPC Decoder, University of Minnesota, Minneapolis, Minnesota, 6 pages.

William E. Ryan, An Introduction to LDPC Codes, University of Arizona, Tucson, Arizona, Aug. 19, 2003, 23 pages.

Frederic Guilloud, Generic Architecture for LDPC Codes Decoding, Telecom Paris, Jul. 2004, 174 pages.

* cited by examiner

ULTRA-WIDEBAND COMMUNICATION APPARATUS AND METHODS

This is a continuation-in-part of U.S. patent application Ser. No. 10/952,485, filed Sep. 27, 2004, entitled "Systems and Methods for Forward Error Correction in a Wireless Communication Network," which is a continuation-in-part of U.S. patent application Ser. No. 10/120,456, entitled "Systems and Methods for Recovering Bandwidth in a Wireless Communication Network," filed Apr. 9, 2002, which is a continuation-in-part of U.S. patent application Ser. No. 10/010,601, filed Dec. 6, 2001, now abandoned entitled "Systems and Methods for Wireless Communication over a Wide Bandwidth Channel using a Plurality of Sub-Channels."

BACKGROUND OF THE INVENTION

1. Field of the Invention

The invention relates generally to ultra-wideband communications, and more particularly to systems and methods for communication using ultra-wideband technology.

2. Background

Wireless communication systems are proliferating at the Wide Area Network (WAN), Local Area Network (LAN), and Personal Area Network (PAN) levels. These wireless communication systems use a variety of techniques to allow simultaneous access to multiple users. The most common of these techniques are Frequency Division Multiple Access (FDMA), which assigns specific frequencies to each user, Time Division Multiple Access (TDMA), which assigns particular time slots to each user, and Code Division Multiple Access (CDMA), which assigns specific codes to each user. But these wireless communication systems and various modulation techniques are afflicted by a host of problems that limit the capacity and the quality of service provided to the users. The following paragraphs briefly describe a few of these problems for the purpose of illustration.

One problem that can exist in a wireless communication system is multipath interference. Multipath interference, or multipath, occurs because some of the energy in a transmitted wireless signal bounces off of obstacles, such as buildings or mountains, as it travels from source to destination. The obstacles in effect create reflections of the transmitted signal and the more obstacles there are, the more reflections they generate. The reflections then travel along their own transmission paths to the destination (or receiver). The reflections will contain the same information as the original signal; however, because of the differing transmission path lengths, the reflected signals will be out of phase with the original signal. As a result, they will often combine destructively with the original signal in the receiver. This is referred to as fading. To combat fading, current systems typically try to estimate the multipath effects and then compensate for them in the receiver using an equalizer. In practice, however, it is very difficult to achieve effective multipath compensation.

A second problem that can affect the operation of wireless communication systems is interference from adjacent communication cells within the system. In FDMA/TDMA systems, this type of interference is prevented through a frequency reuse plan. Under a frequency reuse plan, available communication frequencies are allocated to communication cells within the communication system such that the same frequency will not be used in adjacent cells. Essentially, the available frequencies are split into groups. The number of groups is termed the reuse factor. Then the communication cells are grouped into clusters, each cluster containing the same number of cells as there are frequency groups. Each frequency group is then assigned to a cell in each cluster. Thus, if a frequency reuse factor of 7 is used, for example, then a particular communication frequency will be used only once in every seven communication cells. As a result, in any group of seven communication cells, each cell can only use $\frac{1}{7}^{th}$ of the available frequencies, i.e., each cell is only able to use $\frac{1}{7}^{th}$ of the available bandwidth.

In a CDMA communication system, each cell uses the same wideband communication channel. In order to avoid interference with adjacent cells, each communication cell uses a particular set of spread spectrum codes to differentiate communications within the cell from those originating outside of the cell. Thus, CDMA systems preserve the bandwidth in the sense that they avoid limitations inherent to conventional reuse planning. But as will be discussed, there are other issues that limit the bandwidth in CDMA systems as well Thus, in overcoming interference, system bandwidth is often sacrificed. Bandwidth is becoming a very valuable commodity as wireless communication systems continue to expand by adding more and more users. Therefore, trading off bandwidth for system performance is a costly, albeit necessary, proposition that is inherent in all wireless communication systems.

The foregoing are just two examples of the types of problems that can affect conventional wireless communication systems. The examples also illustrate that there are many aspects of wireless communication system performance that can be improved through systems and methods that, for example, reduce interference, increase bandwidth, or both.

Ultra-wideband (UWB) communications systems, while somewhat more resistant to multipath, also suffer from its effects. UWB is a pulsed form of communications wherein the continuous carrier wave of traditional communications is replaced with discrete pulses of electro-magnetic energy. Some UWB communications systems employ modulation techniques where the data is carried by the precise timing of pulses. As described above, reflected energy travels a different path from the transmitter to the receiver. The path length additionally causes the reflected energy to arrive at the receiver at a different time. Since some UWB systems use timing to impart data, reflected copies of pulses may interfere with the demodulation of the UWB signal.

Not only are conventional wireless communication systems effected by problems, such as those described in the preceding paragraphs, but also different types of systems are effected in different ways and to different degrees. Wireless communication systems can be split into three types: 1) line-of-sight systems, which can include point-to-point or point-to-multipoint systems; 2) indoor non-line of sight systems; and 3) outdoor systems such as wireless WANs. Line-of-sight systems are least affected by the problems described above, while indoor systems are more affected, due for example to signals bouncing off of building walls. Outdoor systems are by far the most affected of the three systems. Because these types of problems are limiting factors in the design of wireless transmitters and receivers, such designs must be tailored to the specific types of system in which it will operate. In practice, each type of system implements unique communication standards that address the issues unique to the particular type of system. Even if an indoor system used the same communication protocols and modulation techniques as an outdoor system, for example, the receiver designs would still be different because multipath and other problems are unique to a given type of system and must be addressed with unique solutions. This would not necessarily be the case if cost efficient and effective methodologies can be developed to combat such problems as described above that build in programmability so that a device can be reconfigured for different types of systems and still maintain superior performance.

SUMMARY OF THE INVENTION

In order to combat the above problems, apparatus, systems and methods described herein provide a novel forward error correction (FEC) technology. In one embodiment of the present invention, an ultra-wideband transmitter includes a processor configured to generate data for transmission in the form of a plurality of ultra-wideband pulses. The transmitter includes a FEC encoder that generates a code word based on the data. The FEC includes a plurality of cyclic shift registers configured to receive and process the data, a plurality of fixed connections between each of the plurality of cyclic shift registers and a plurality of XOR gates communicating with the plurality of fixed connections. In one embodiment, the fixed connections are arranged such that the first fixed connection communicates with the first of the plurality of XOR gates, the second fixed connection communicates with the second of the plurality of XOR gates, and so on until the last of the fixed connections communicates with the last of the plurality of XOR gates.

Generally, the FEC encoder encodes data words into code words that comprise a parity matrix. In one embodiment, the encoder is optimized based on the properties of the parity matrix in order to reduce routing overhead and size. In another embodiment, a decoder is optimized to receive and decode the code word in the face of noise introduced when the code word is transmitted over a physical channel.

These and other features and advantages of the present invention will be appreciated from review of the following Detailed Description of the Preferred Embodiments, along with the accompanying figures in which like reference numerals are used to describe the same, similar or corresponding parts in the several views of the drawings.

BRIEF DESCRIPTION OF THE DRAWINGS

Preferred embodiments of the present inventions taught herein are illustrated by way of example, and not by way of limitation, in the figures of the accompanying drawings, in which.

Figure 1:
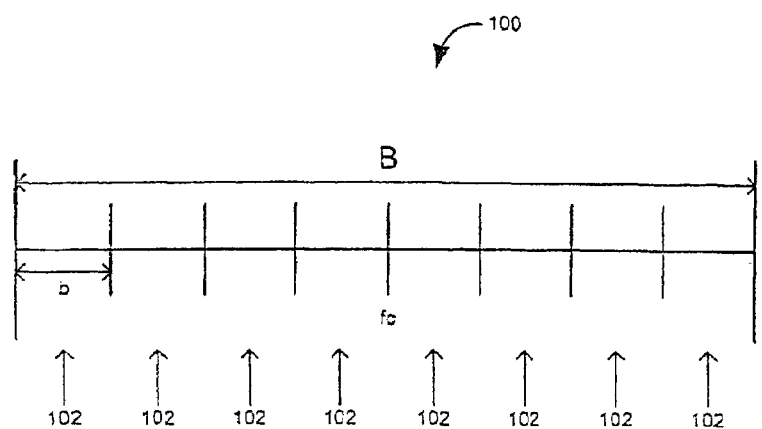
FIG. 1 is a diagram illustrating an example embodiment of a wideband channel divided into a plurality of sub-channels in accordance with the invention.

It will be recognized that some or all of the Figures are schematic representations for purposes of illustration and do not necessarily depict the actual relative sizes or locations of the elements shown. The Figures are provided for the purpose of illustrating one or more embodiments of the invention with the explicit understanding that they will not be used to limit the scope or the meaning of the claims.

DETAILED DESCRIPTION OF THE PREFERRED EMBODIMENTS

In the following paragraphs, the present invention will be described in detail by way of example with reference to the attached drawings. While this invention is capable of embodiment in many different forms, there is shown in the drawings and will herein be described in detail specific embodiments, with the understanding that the present disclosure is to be considered as an example of the principles of the invention and not intended to limit the invention to the specific embodiments shown and described. That is, throughout this description, the embodiments and examples shown should be considered as exemplars, rather than as limitations on the present invention. As used herein, the "present invention" refers to any one of the embodiments of the invention described herein, and any equivalents. Furthermore, reference to various feature(s) of the "present invention" throughout this document does not mean that all claimed embodiments or methods must include the referenced feature(s).

1. Introduction

In order to improve wireless communication system performance and allow a single device to move from one type of system to another, while still maintaining superior performance, the systems and methods described herein provide various communication methodologies that enhance performance of transmitters and receivers with regard to various common problems that afflict such systems and that allow the transmitters and/or receivers to be reconfigured for optimal performance in a variety of systems. Accordingly, the systems and methods described herein define a channel access protocol that uses a common wideband communication channel for all communication cells. The wideband channel, however, is then divided into a plurality of sub-channels. Different sub-channels are then assigned to one or more users within each cell. But the base station, or service access point, within each cell transmits one message that occupies the entire bandwidth of the wideband channel. Each user's communication device receives the entire message, but only decodes those portions of the message that reside in sub-channels assigned to the user. For a point-to-point system, for example, a single user may be assigned all sub-channels and, therefore, has the full wide band channel available to them. In a wireless WAN, on the other hand, the sub-channels may be divided among a plurality of users, In the descriptions of example embodiments that follow, implementation differences, or unique concerns, relating to different types of systems will be pointed out to the extent possible. But it should be understood that the systems and methods described herein are applicable to any type of communication systems. In addition, terms such as communication cell, base station, service access point, etc. are used interchangeably to refer to the common aspects of networks at these different levels.

To begin illustrating the advantages of the systems and methods described herein, one can start by looking at the multipath effects for a single wideband communication channel 100 of bandwidth B as shown in FIG. 1. Communications sent over channel 100 in a traditional wireless communication system will comprise digital data symbols, or symbols, that are encoded and modulated onto a RF carrier that is centered at frequency $f_c$ and occupies bandwidth B. Generally, the width of the symbols (or the symbol duration) T is defined as 1/B. Thus, if the bandwidth B is equal to 100 MHz, then the symbol duration T is defined by the following equation:

$$T=1/B=1/100 \text{ MHZ}=10 \text{ ns}. \quad (1)$$

Figure 2:
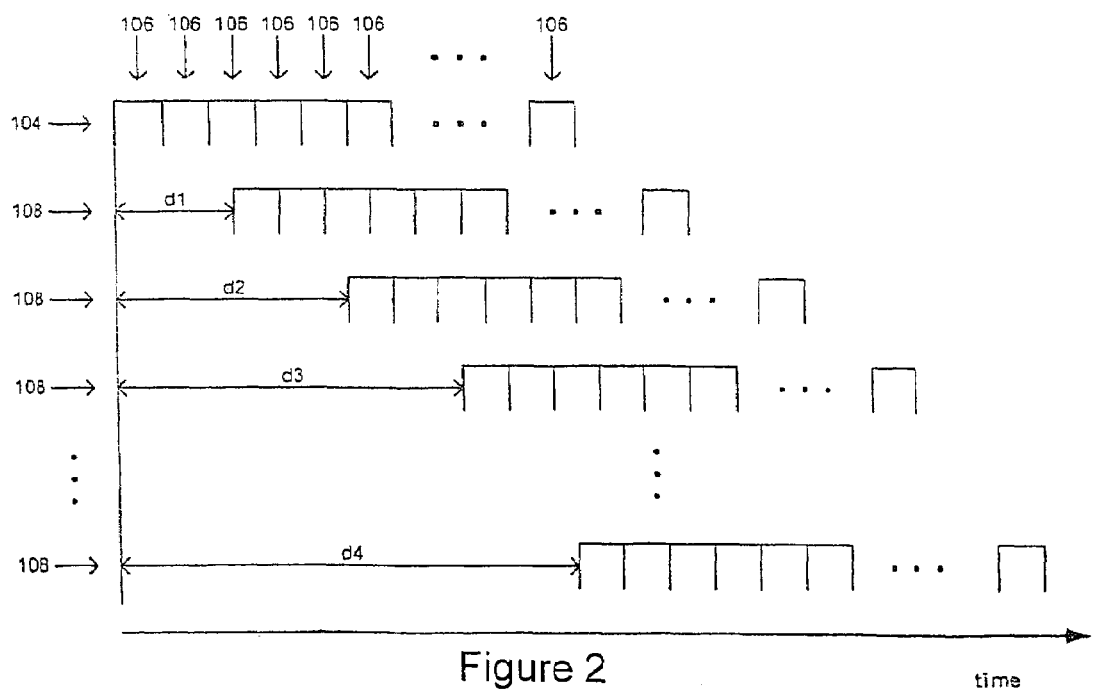
FIG. 2 is a diagram illustrating the effects of multipath in a wireless communication system.

When a receiver receives the communication, demodulates it, and then decodes it, it will recreate a stream 104 of data symbols 106 as illustrated in FIG. 2. But the receiver will also receive multipath versions 108 of the same data stream. Because multipath data streams 108 are delayed in time relative to data stream 104 by delays d1, d2, d3, and d4, for example, they may combine destructively with data stream 104.

A delay spread $d_s$ is defined as the delay from reception of data stream 104 to the reception of the last multipath data stream 108 that interferes with the reception of data stream 104, Thus, in the example illustrated in FIG. 2, the delay spread $d_s$ is equal to delay d4. The delay spread $d_s$ will vary for, different environments. An environment with a lot of obstacles will create a lot of multipath reflections. Thus, the delay spread $d_s$ will be longer. Experiments have shown that for outdoor WAN type environments, the delay spread $d_s$ can be as long as 20 μs. Using the 10 ns symbol duration of equation (1), this translates to 2000 symbols. Thus, with a very large bandwidth, such as 100 MHz, multipath interference can cause a significant amount of interference at the symbol level for which adequate compensation is difficult to achieve. This is true even for indoor environments. For indoor LAN type systems, the delay spread $d_s$ is significantly shorter, typically about 1 µs. For a 10 ns symbol duration, this is equivalent to 100 symbols, which is more manageable but still significant.

Figure 3:
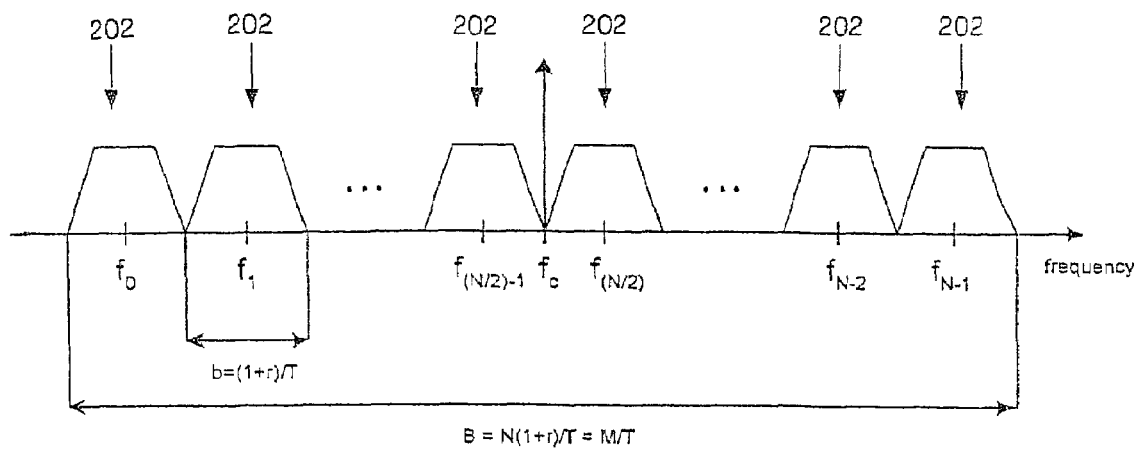
FIG. 3 is a diagram illustrating another example embodiment of a wideband communication channel divided into a plurality of sub-channels in accordance with the invention.

By segmenting the bandwidth B into a plurality of sub-channels 200, as illustrated in FIG. 3, and generating a distinct data stream for each sub-channel, the multipath effect can be reduced to a much more manageable level. For example, if the bandwidth B of each sub-channel 200 is 500 KHz, then the symbol duration is 2 µs. Thus, the delay spread $d_s$ for each sub-channel is equivalent to only 10 symbols (outdoor) or half a symbol (indoor). Thus, by breaking up a message that occupies the entire bandwidth B into discrete messages, each occupying the bandwidth B of sub-channels 200, a very wideband signal that suffers from relatively minor multipath effects is created.

Before discussing further features, and advantages of using a wideband communication channel segmented into a plurality of sub-channels as described, certain aspects of the sub-channels will be explained in more detail. Referring back to FIG. 3, the overall bandwidth B is segmented into N sub-channels center at frequencies $f_0$ to $f_{N-1}$. Thus, the sub-channel 200 that is immediately to the right of fc is offset from fc by b/2, where b is the bandwidth of each sub-channel 200. The next sub-channel 200 is offset by 3b/2, the next by 5b/2, and so on. To the left of fc, each sub-channel 200 is offset by −b/s, −3b/s, −5b/2, etc Preferably, sub-channels 200 are non-overlapping as this allows each sub-channel to be processed independently in the receiver. To accomplish this, a roll-off factor is preferably applied to the signals in each sub-channel in a pulse-shaping step. The effect of such a pulse-shaping step is illustrated in FIG. 3 by the non-rectangular shape of the pulses in each sub-channel 200. Thus, the bandwidth B of each sub-channel can be represented by an equation such as the following:

$$b=(1+r)/T;  \quad (2)$$

Where r=the roll-off factor; and
T=the symbol duration.

Figure 4:
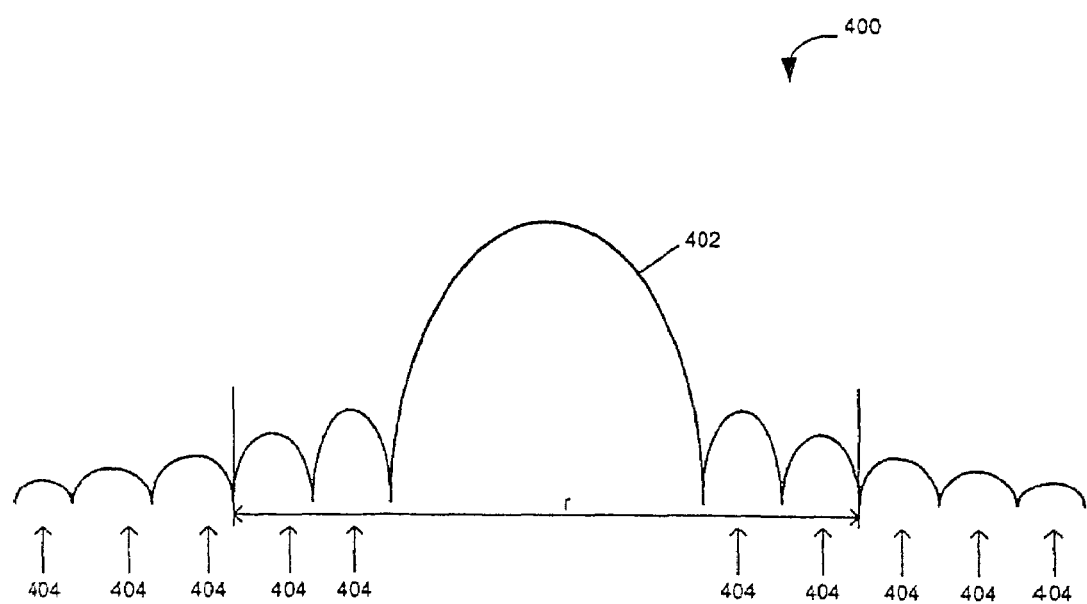
FIG. 4 is a diagram illustrating the application of a roll-off factor to the sub-channels of FIGS. 1, 2 and 3.

Without the roll-off factor, i.e., b=1/T, the pulse shape would be rectangular in the frequency domain, which corresponds to a $((\sin x)/x)^2$ function in the time domain. The time domain signal for a $((\sin x)/x)^2$ signal 400 is shown in FIG. 4 in order to illustrate the problems associated with a rectangular pulse shape and the need to use a roll-off factor.

As can be seen, main lobe 402 comprises almost all of signal 400. But some of the signal also resides in side lobes 404, which stretch out indefinitely in both directions from main lobe 402. Side lobes 404 make processing signal 400 much more difficult, which increases the complexity of the receiver. Applying a roll-off factor r, as in equation (2), causes signal 400 to decay faster, reducing the number of side lobes 404. Thus, increasing the roll-off factor decreases the length of signal 400, i.e., signal 400 becomes shorter in time. But including the roll-off factor also decreases the available bandwidth in each sub-channel 200. Therefore, r must be selected so as to reduce the number of side lobes 404 to a sufficient number, e.g., 15, while still maximizing the available bandwidth in each sub-channel 200.

Thus, the overall bandwidth B for communication channel 200 is given by the following equation:

$$B=N(1+r)/T;  \quad (3)$$

or $$B=M/T;  \quad (4)$$

Where $$M=(1+r)N. \quad (5)$$

For efficiency purposes related to transmitter design, it is preferable that r is chosen so that M in equation (5) is an integer. Choosing r so that M is an integer allows for more efficient transmitters designs using, for example, Inverse Fast Fourier Transform (IFFT) techniques. Since M=N+N (r), and N is always an integer, this means that r must be chosen so that N(r) is an integer, Generally, it is preferable for r to be between 0.1 and 0.5. Therefore, if N is 16, for example, then 0.5 could be selected for r so that N(r) is an integer. Alternatively, if a value for r is chosen in the above example so that N(r) is not an integer, B can be made slightly wider than M/T to compensate. In this case, it is still preferable that r be chosen so that N(r) is approximately an integer.

2. Example Embodiment of a Wireless Communication System

Figure 6:
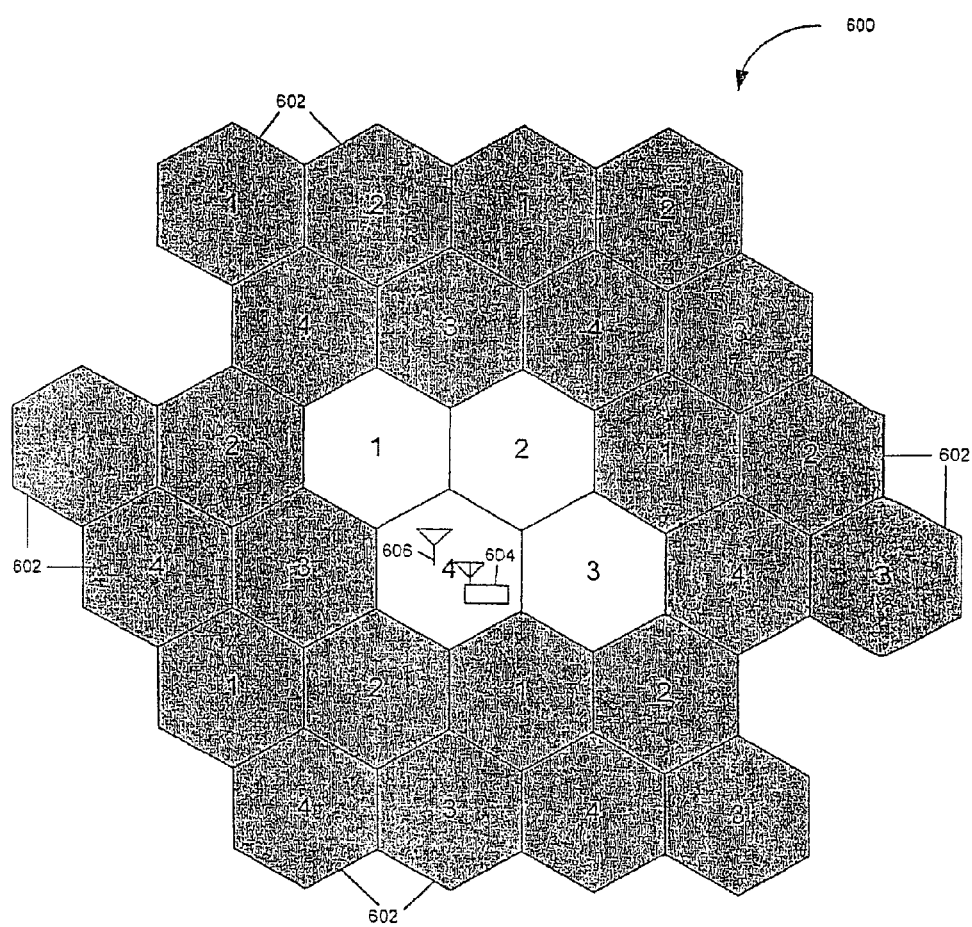
FIG. 6 is a diagram illustrating an example embodiment of a wireless communication in accordance with the invention.

With the above in mind, FIG. 6 illustrates an example communication system 600 comprising a plurality of cells 602 that each use a common wideband communication channel to communicate with communication devices 604 within each cell 602. The common communication channel is a wideband communication channel as described above. Each communication cell 602 is defined as the coverage area of a base station, or service access point, 606 within the cell. One such base station 606 is shown for illustration in FIG. 6. For purposes of this specification and the claims that follow, the term base station will be used generically to refer to a device that provides wireless access to the wireless communication system for a plurality of communication devices, whether the system is a line of sight, indoor, or outdoor system.

Because each cell 602 uses the same communication channel, signals in one cell 602 must be distinguishable from signals in adjacent cells 602. To differentiate signals from one cell 602 to another, adjacent base stations 606 use different synchronization codes according to a code reuse plan. In FIG. 6, system 600 uses a synchronization code reuse factor of 4, although the reuse factor can vary depending on the application.

Figure 7:
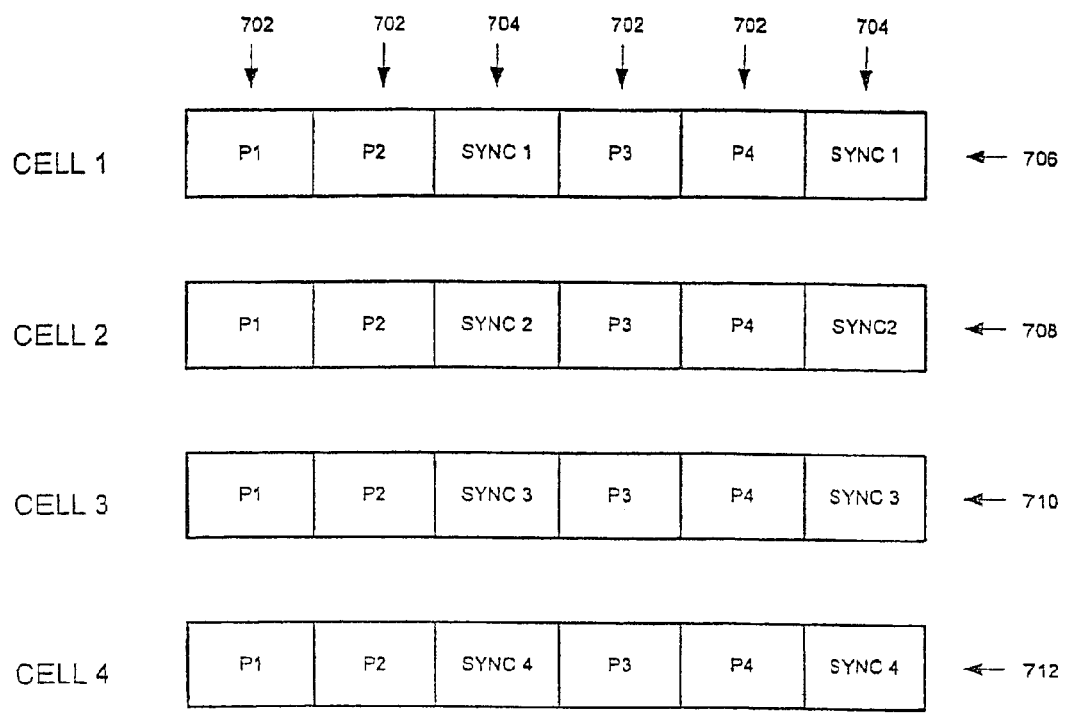
FIG. 7 is a diagram illustrating the use of synchronization codes in the wireless communication system of FIG. 6 in accordance with the invention.

Preferably, the synchronization code is periodically inserted into a communication from a base station 606 to a communication device 604 as illustrated in FIG. 7. After a predetermined number of data packets 702, in this case two, the particular synchronization code 704 is inserted into the information being transmitted by each base station 606. A synchronization code is a sequence of data bits known to both the base station 606 and any communication devices 604 with which it is communicating. The synchronization code allows such a communication device 604 to synchronize its timing to that of base station 606, which, in turn, allows device 604 to decode the data properly. Thus, in cell 1 (see lightly shaded cells 602 in FIG. 6), for example, synchronization code 1 (SYNC1) is inserted into data stream 706, which is generated by base station 606 in cell 1, after every two packets 702; in cell 2 SYNC2 is inserted after every two packets 702; in cell 3 SYNC3 is inserted; and in cell 4 SYNC4 is inserted. Use of the synchronization codes is discussed in more detail below.

Figure 5A:
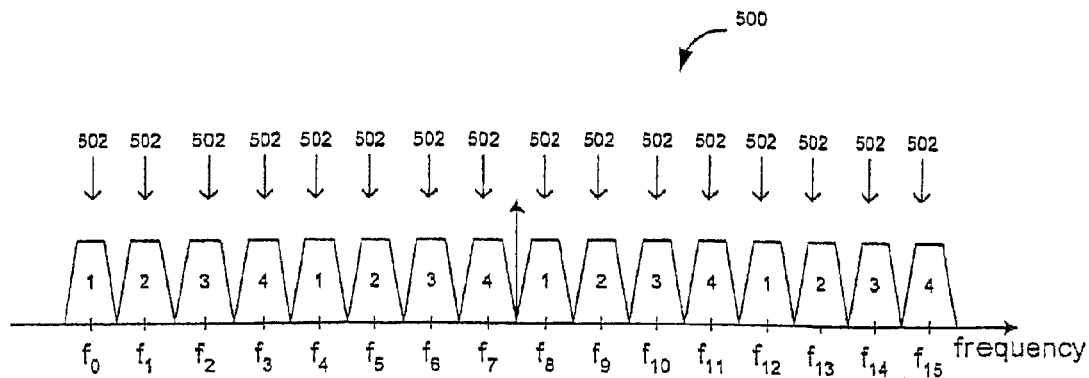
FIG. 5A is a diagram illustrating the assignment of sub-channels for a wideband communication channel in accordance with the invention.

In FIG. 5A, an example wideband communication channel 500 for use in communication system 600 is divided into 16 sub-channels 502, centered at frequencies $f_0$ to $f_{15}$. A base station 606 at the center of each communication cell 602 transmits a single packet occupying the whole bandwidth B of wideband channel 500. Such a packet is illustrated by packet 504 in FIG. 5B. Packet 504 comprises sub-packets 506 that are encoded with a frequency offset corresponding to one of sub-channels 502. Sub-packets 506 in effect define available time slots in packet 504. Similarly, sub-channels 502 can be said to define available frequency bins in communication channel 500. Therefore, the resources available in communication cell 602 are time slots 506 and frequency bins 502, which can be assigned to different communication devices 604 within each cell 602.

Figure 5B:
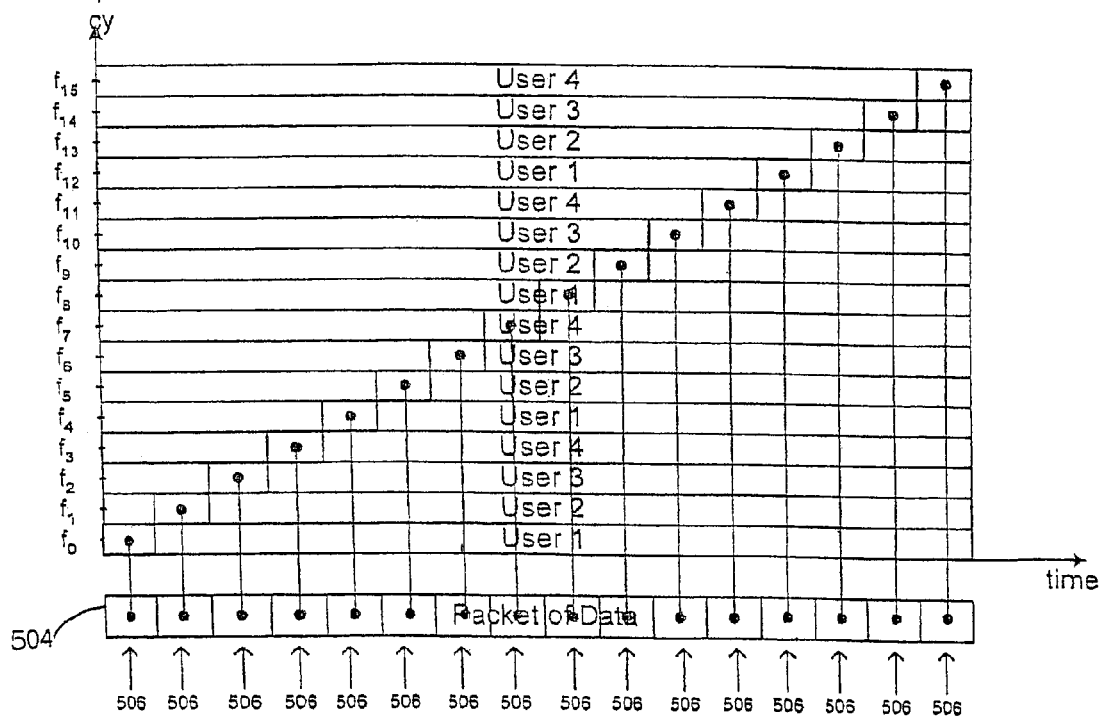
FIG. 5B is a diagram illustrating the assignment of time slots for a wideband communication channel in accordance with the invention.

Thus, for example, frequency bins 502 and time slots 506 can be assigned to 4 different communication devices 604 within a cell 602 as shown in FIG. 5. Each communication device 604 receives the entire packet 504, but only processes those frequency bins 502 and/or timeslots 506 that are assigned to it. Preferably, each device 604 is assigned non-adjacent frequency bins 502, as in FIG. 5B. This way, if interference corrupts the information in a portion of communication channel 500, then the effects are spread across all devices 604 within a cell 602. Hopefully, by spreading out the effects of interference in this manner the effects are minimized and the entire information sent to each device 604 can still be recreated from the unaffected information received in other frequency bins. For example, if interference, such as fading, corrupted the information in bins $f_0$-$f_4$, then each user 1-4 loses one packet of data. But each user potentially receives three unaffected packets from the other bins assigned to them. Hopefully, the unaffected data in the other three bins provides enough information to recreate the entire message for each user. Thus, frequency diversity can be achieved by assigning non-adjacent bins to each of multiple users.

Ensuring that the bins assigned to one user are separated by more than the coherence bandwidth ensures frequency diversity. As discussed above, the coherence bandwidth is approximately equal to $1/d_s$. For outdoor systems, where $d_s$ is typically 1 µs, $1/d_s=1/1$ µs=1 MHz. Thus, the non-adjacent frequency bands assigned to a user are preferably separated by at least 1 MHz. It can be even more preferable, however, if the coherence bandwidth plus some guard band to ensure sufficient frequency diversity separate the non-adjacent bins assigned to each user. For example, it is preferable in certain implementations to ensure that at least 5 times the coherence bandwidth, or 5 MHz in the above example, separates the non-adjacent bins.

Another way to provide frequency diversity is to repeat blocks of data in frequency bins assigned to a particular user that are separated by more than the coherence bandwidth. In other words, if 4 sub-channels 200 are assigned to a user, then data block a can be repeated in the first and third sub-channels 200 and data block b can be repeated in the second and fourth sub-channels 202, provided the sub-channels are sufficiently separated in frequency. In this case, the system can be said to be using a diversity length factor of 2. The system can similarly be configured to implement other diversity lengths, e.g., 3, 4, . . . , l.

It should be noted that spatial diversity can also be included depending on the embodiment. Spatial diversity can comprise transmit spatial diversity, receive spatial diversity, or both. In transmit spatial diversity, the transmitter uses a plurality of separate transmitters and a plurality of separate antennas to transmit each message. In other words, each transmitter transmits the same message in parallel. The messages are then received from the transmitters and combined in the receiver. Because the parallel transmissions travel different paths, if one is affected by fading, the others will likely not be affected. Thus, when they are combined in the receiver, the message should be recoverable even if one or more of the other transmission paths experienced severe fading.

Receive spatial diversity uses a plurality of separate receivers and a plurality of separate antennas to receive a single message. If an adequate distance separates the antennas, then the transmission path for the signals received by the antennas will be different. Again, this difference in the transmission paths will provide imperviousness to fading when the signals from the receivers are combined.

Transmit and receive spatial diversity can also be combined within a system such as system 600 so that two antennas are used to transmit and two antennas are used to receive. Thus, each base station 606 transmitter can include two antennas, for transmit spatial diversity, and each communication device 604 receiver can include two antennas, for receive spatial diversity. If only transmit spatial diversity is implemented in system 600, then it can be implemented in base stations 606 or in communication devices 604. Similarly, if only receive spatial diversity is included in system 600, then it can be implemented in base stations 606 or communication devices 604.

The number of communication devices 604 assigned frequency bins 502 and/or time slots 506 in each cell 602 is preferably programmable in real time. La other words, the resource allocation within a communication cell 602 is preferably programmable in the face of varying external conditions, i.e.", multipath or adjacent, cell interference, and varying requirements, i.e., bandwidth requirements for various users within the cell. Thus, if user 1 requires the whole bandwidth to download a large video file, for example, then the allocation of bins 502 can be adjust to provide user 1 with more, or even all, of bins 502. Once user 1 no longer requires such large amounts of bandwidth, the allocation of bins 502 can be readjusted among all of users 1-4.

It should also be noted that all of the bins assigned to a particular user can be used for both the forward and reverse link. Alternatively, some bins 502 can be assigned as the forward link and some can be assigned for use on the reverse link, depending on the implementation.

To increase capacity, the entire bandwidth B is preferably reused in each communication cell 602, with each cell 602 being differentiated by a unique synchronization code (see discussion below). Thus, system 600 provides increased immunity to multipath and fading as well as increased band width due to the elimination of frequency reuse requirements.

3. Synchronization

Figure 8:
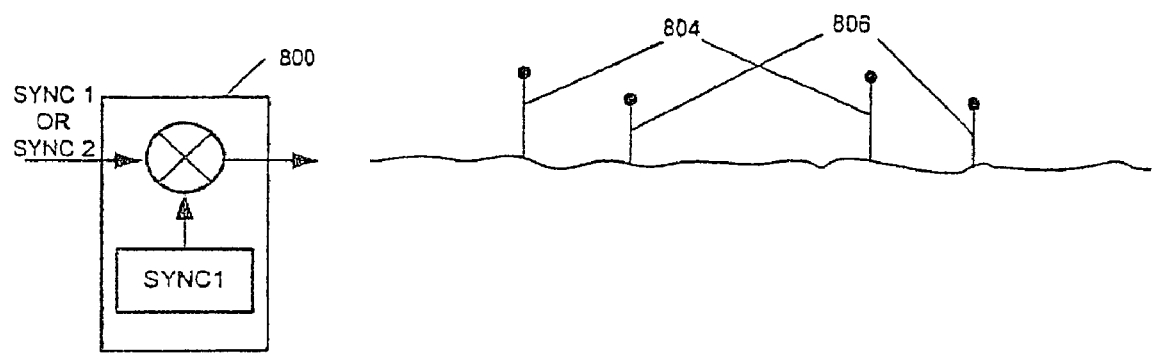
FIG. 8 is a diagram illustrating a correlator that can be used to correlate synchronization codes in the wireless communication system of FIG. 6.

FIG. 8 illustrates an example embodiment of a synchronization code correlator 800. When a device 604 in cell 1 (see FIG. 6), for example, receives an incoming communication from the cell 1 base station 606, it compares the incoming data with SYNC1 in correlator 800. Essentially, the device scans the incoming data trying to correlate the data with the known synchronization code, in this case SYNC1. Once correlator 800 matches the incoming data to SYNC1 it generates a correlation peak 804 at the output. Multipath versions of the data will also generate correlation peaks 806, although these peaks 806 are generally smaller than correlation peak 804. The device can then use the correlation peaks to perform channel estimation, which allows the device to adjust for the multipath using, e.g., an equalizer. Thus, in cell 1, if correlator 800 receives a data stream comprising SYNC1, it will generate correlation peaks 804 and 806. If on the other hand, the data stream comprises SYNC2, for example, then no peaks will be generated and the device will essentially ignore the incoming communication.

Even though a data stream that comprises SYNC2 will not create any correlation peaks, it can create noise in correlator 800 that can prevent detection of correlation peaks 804 and 806. Several steps can be taken to prevent this from occurring. One way to minimize the noise created in correlator 800 by signals from adjacent cells 602, is to configure system 600 so that each base station 606 transmits at the same time. This way, the synchronization codes can preferably be generated in such a manner that only the synchronization codes 704 of adjacent cell data streams, e.g., streams 708, 710, and 712, as opposed to packets 702 within those streams, will interfere with detection of the correct synchronization code 704, e.g., SYNC1. The synchronization codes can then be further configured to eliminate or reduce the interference.

Figure 9:
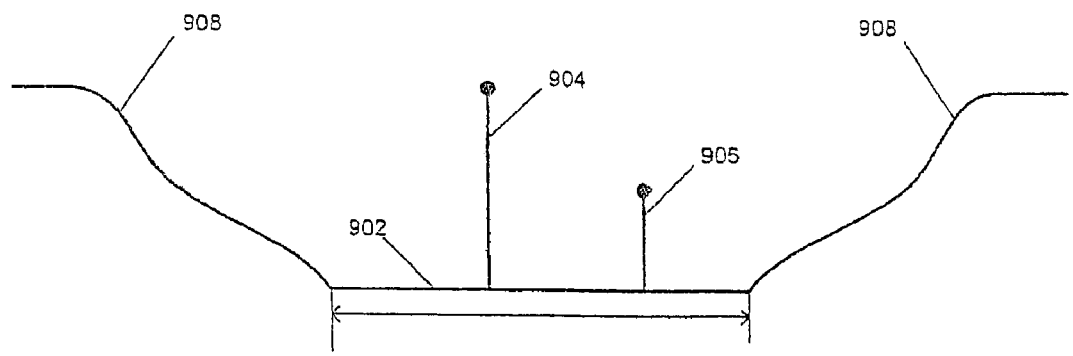
FIG. 9 is a diagram illustrating synchronization code correlation in accordance with the invention.

For example, the noise or interference caused by an incorrect synchronization code is a function of the cross correlation of that synchronization code with respect to the correct code. The better the cross correlation between the two, the lower the noise level. When the cross correlation is ideal, then the noise level will be virtually zero as illustrated in FIG. 9 by noise level 902. Therefore, a preferred embodiment of system 600 uses synchronization codes that exhibit ideal cross correlation, i.e., zero. Preferably, the ideal cross correlation of the synchronization codes covers a period 1 that is sufficient to allow accurate detection of multipath correlation peaks 906 as well as correlation peak 904. This is important so that accurate channel estimation and equalization can take place. Outside of period 1, the noise level 908 goes up, because the data in packets 702 is random and will exhibit low cross correlation with the synchronization code, e.g., SYNC1. Preferably, period 1 is actually slightly longer then the multipath length in order to ensure that the multipath can be detected.

a. Synchronization Code Generation

Conventional systems use orthogonal codes to achieve cross correlation in correlator 800. In system 600 for example, SYNC1, SYNC2, SYNC3, and SYNC4, corresponding to cells 1-4 (see lightly shaded cells 602 of FIG. 6) respectively, will all need to be generated in such a manner that they will have ideal cross correlation with each other. In one embodiment, if the data streams involved comprise high and low data bits, then the value "1" can be assigned to the high data bits and "−1" to the low data bits. Orthogonal data sequences are then those that produce a "0" output when they are exclusively ORed (XORed) together in correlator 800. The following example illustrates this point for orthogonal sequences 1 and 2:

sequence 1:  1 1 -1  1
sequence 2:  1 1  1 -1
             ―――――――――
             1 1 -1 -1 = 0

Thus, when the results of XORing each bit pair are added, the result is "0."

But in system 600, for example, each code must have ideal, or zero, cross correlation with each of the other codes used in adjacent cells 602. Therefore, in one example embodiment of a method for generating synchronization codes exhibiting the properties described above, the process begins by selecting a "perfect sequence" to be used as the basis for the codes. A perfect sequence is one that when correlated with itself produces a number equal to the number of bits in the sequence. For example:

Perfect sequence 1:  1 1 -1  1
                     1 1 -1  1
                     ―――――――――
                     1 1  1  1 = 4

But each time a perfect sequence is cyclically shifted by one bit, the new sequence is orthogonal with the original sequence. Thus, for example, if perfect sequence 1 is cyclically shifted by one bit and then correlated with the original, the correlation produces a "0" as in the following example:

Perfect sequence 1:  1 1 -1  1
                     1 1  1 -1
                     ―――――――――
                     1 1 -1 -1 = 0

If the perfect sequence 1 is again cyclically shifted by one bit, and again correlated with the original then it will produce a "0". In general, you can cyclically shift a perfect sequence by any number of bits up to its length and correlate the shifted sequence with the original to obtain a "0".

Once a perfect sequence of the correct length is selected, the first synchronization code is preferably generated in one embodiment by repeating the sequence 4 times. Thus, if perfect sequence 1 is being used, then a first synchronization code y would be the following:

$y$=1 1 −1 1 1 1 −1 1 1 1 −1 1 1 1 −1 1.

Or in generic form:

$y=x(0)x(1)x(2)x(3)x(0)x(1)x(2)x(3)x(0)x(1)x(2)x(3)x(0)x(1)x(2)x(3)$.

For a sequence of length L:

$y=x(0)x(1) \ldots x(L)x(0)x(1) \ldots x(L)x(0)\ x(1) \ldots x(L)x(0)x(1) \ldots x(L)$.

Repeating the perfect sequence allows correlator 800 a better opportunity to detect the synchronization code and allows generation of other uncorrelated frequencies as well. Repeating has the effect of sampling in the frequency domain. This effect is illustrated by the graphs in FIG. 10. Thus, in trace 1, which corresponds to synchronization code y, a sample 1002 is generated every fourth sample bin 1000. Each sample bin is separated by $1/(4L \times T)$, where T is the symbol duration. Thus in the above example, where L=4, each sample bin is separated by $1/(16 \times T)$ in the frequency domain. Traces 2-4 illustrate the next three synchronization codes. As can be seen, the samples for each subsequent synchronization code are shifted by one sample bin relative to the samples for the previous sequence. Therefore, none of sequences interfere with each other.

To generate the subsequent sequences, corresponding to traces 2-4, sequence y must be shifted in frequency. This can be accomplished using the following equation:

$$z^r(m)=y(m)*\exp(j*2*\pi*r*m/(n*L)), \quad (5)$$

for r=1 to L (# of sequences) and m=0 to 4*L−1 (time); and where: $z^r(m)$=each subsequent sequence, y(m)=the first sequence, and n=the number of times the sequence is repeated.

Figure 10:
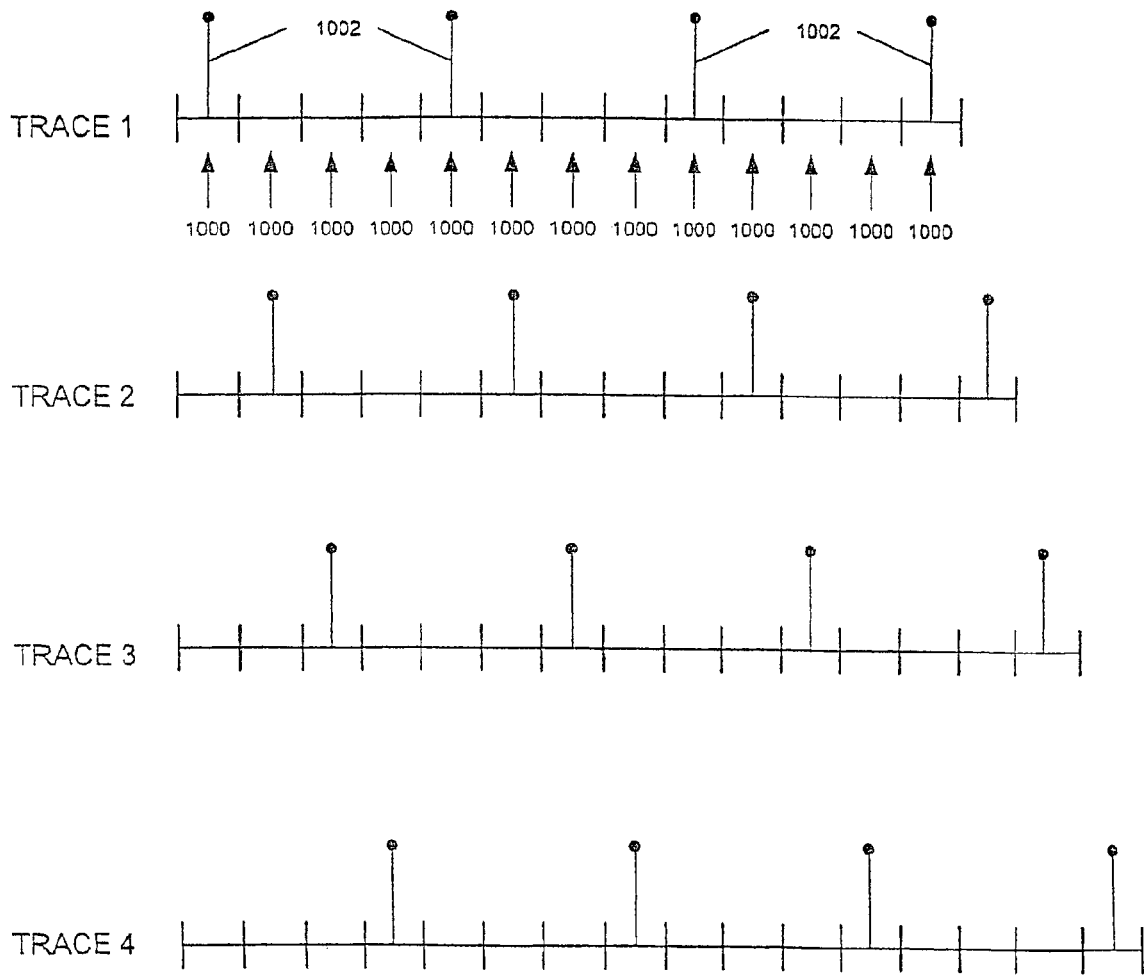
FIG. 10 is a diagram illustrating the cross-correlation properties of synchronization codes configured in accordance with the invention.

It will be understood that multiplying by an exp(j2π(r*m/N)) factor, where N is equal to the number of times the sequence is repeated (n) multiplied by the length of the underlying perfect sequence L, in the time domain results in a shift in the frequency domain. Equation (5) results in the desired shift as illustrated in FIG. 10 for each of synchronization codes 2-4, relative to synchronization code 1. The final step in generating each synchronization code is to append the copies of the last M samples, where M is the length of the multipath, to the front of each code. This is done to make the convolution with the multipath cyclic and to allow easier detection of the multipath.

It should be noted that synchronization codes can be generated from more than one perfect sequence using the same methodology. For example, a perfect sequence can be generated and repeated for times and then a second perfect sequence can be generated and repeated four times to get a n factor equal to eight. The resulting sequence can then be shifted as described above to create the synchronization codes.

b. Signal Measurements Using Synchronization Codes

Figure 11:
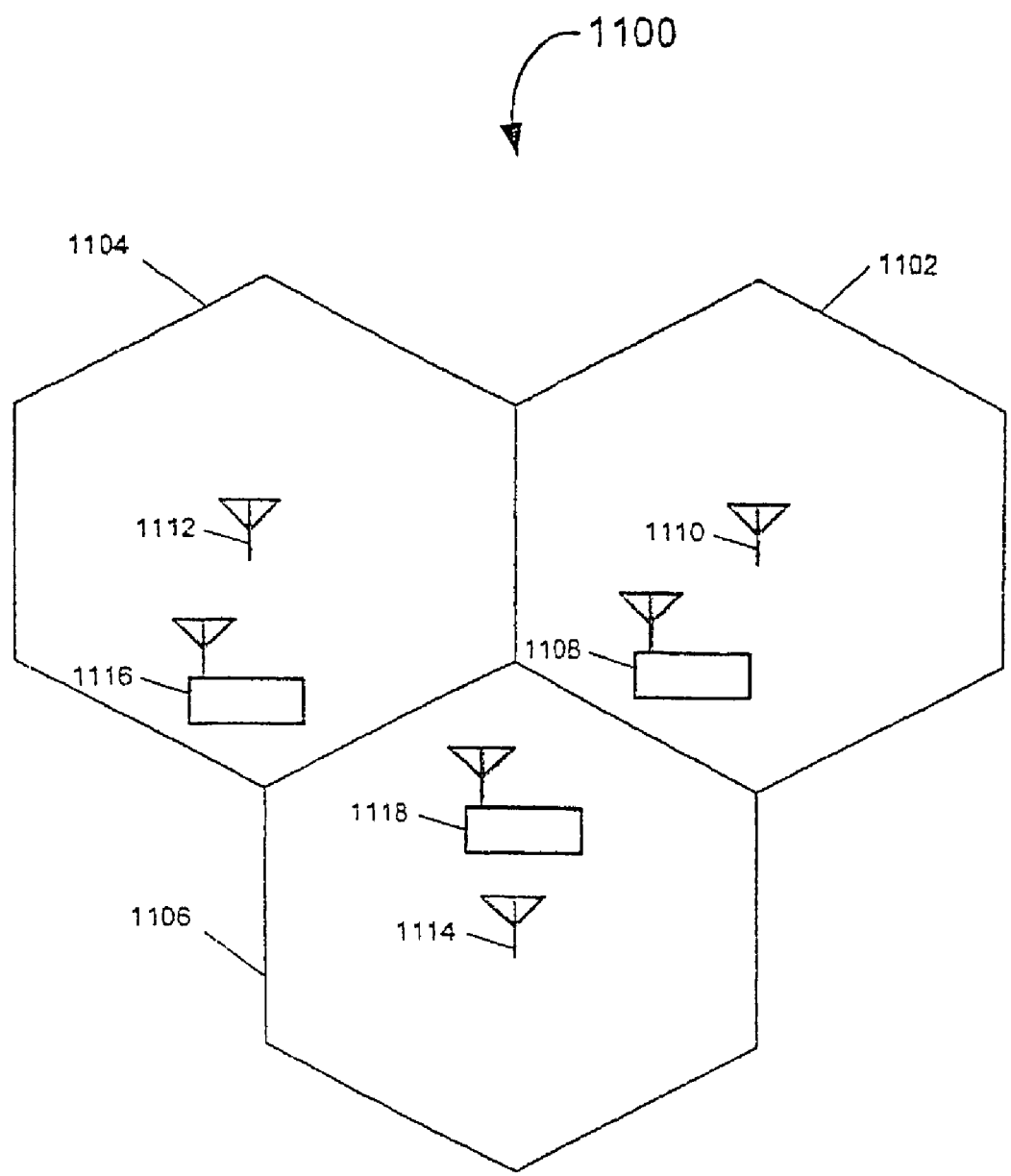
FIG. 11 is a diagram illustrating another example embodiment of a wireless communication system in accordance with the invention.

Therefore, when a communication device is at the edge of a cell, it will receive signals from multiple base stations and, therefore, will be decoding several synchronization codes at the same time. This can be illustrated with the help of FIG. 11, which illustrates another example embodiment of a wireless communication system 1100 comprising communication cells 1102, 1104, and 1106 as well as communication device 1108, which is in communication with base station 1110 of cell 1102 but also receiving communication from base stations 1112 and 1114 of cells 1104 and 1106, respectively.

If communications from base station 1110 comprise synchronization code SYNC1 and communications from base station 1112 and 1114 comprise SYNC2 and SYNC3 respectively, then device 1108 will effectively receive the sum of these three synchronization codes. This is because, as explained above, base stations 1110, 1112, and 1114 are configured to transmit at the same time. Also, the synchronization codes arrive at device 1108 at almost the same time because they are generated in accordance with the description above.

Again as described above, the synchronization codes SYNC1, SYNC2, and SYNC3 exhibit ideal cross correlation. Therefore, when device 1108 correlates the sum x of codes SYNC1, SYNC2, and SYNC3, the latter two will not interfere with proper detection of SYNC1 by device 1108. Importantly, the sum x can also be used to determine important signal characteristics, because the sum x is equal to the sum of the synchronization code signal in accordance with the following equation:

$$x = SYNC1 + SYNC2 + SYNC3 \quad (6)$$

Therefore, when SYNC1 is removed, the sum of SYNC2 and SYNC3 is left, as shown in the following:

$$x - SYNC1 = SYNC2 + SYNC3 \quad (7)$$

The energy computed from the sum (SYNC2+SYNC3) is equal to the noise or interference seen by device 1108. Since the purpose of correlating the synchronization code in device 1106 is to extract the energy in SYNC1, device 1108 also has the energy in the signal from base station 1110, i.e., the energy represented by SYNC1. Therefore, device 1106 can use the energy of SYNC1 and of (SYNC2+SYNC3) to perform a signal-to-interference measurement for the communication channel over which it is communicating with base station 1110. The result of the measurement is preferably a signal-to-interference ratio (SIR). The SIR measurement can then be communicated back to base station. 1110 for purposes that will be discussed below to perform extremely accurate determinations of the Channel Impulse Response (CIR), or channel estimation, from the correlation produced by correlator 800. This allows for highly accurate equalization using low cost, low complexity equalizers, thus overcoming a significant draw back of conventional systems.

4. Sub-channel Assignments

Figure 12A:
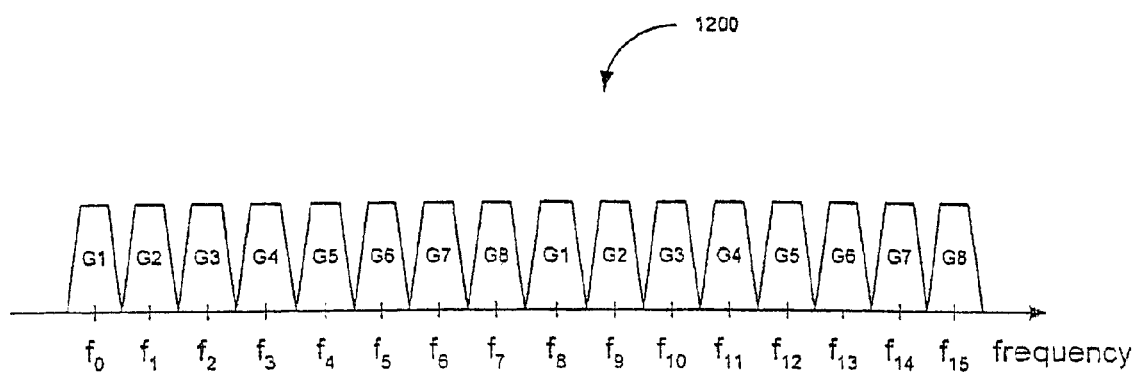
FIG. 12A is a diagram illustrating how sub-channels of a wideband communication channel according to the present invention can be grouped in accordance with the present invention.

As mentioned, the SIR as determined by device 1108 can be communicated back to base station 1110 for use in the assignment of slots 502. In one embodiment, due to the fact that each sub-channel 502 is processed independently, the SIR for each sub-channel 502 can be measured and communicated back to base station 1110. In such an embodiment therefore, sub-channels 502 can be divided into groups and a SIR measurement for each group can be sent to base station 1110. This is illustrated in FIG. 12A, which shows a wideband communication channel 1200 segmented into sub-channels $f_0$ to $f_{15}$. Sub-channels $f_0$ to $f_{15}$ are then grouped into 8 groups G1 to G8. Thus, in one embodiment, device 1108 and base station 1110 communicate over a channel such as channel 1200.

Sub-channels in the same group are preferably separated by as many sub-channels as possible to ensure diversity. In FIG. 12A for example, sub-channels within the same group are 7 sub-channels apart, e.g., group G1 comprises $f_0$ and $f_8$.

Device 1102 reports a SIR measurement for each of the groups G1 to G8. These SIR measurements are preferably compared with a threshold value to determine which sub-channels groups are useable by device 1108. This comparison can occur in device 1108 or base station 1110. If it occurs in device 1108, then device 1108 can simply report to base station 1110 which sub-channel groups are useable by device 1108.

Figure 12B:
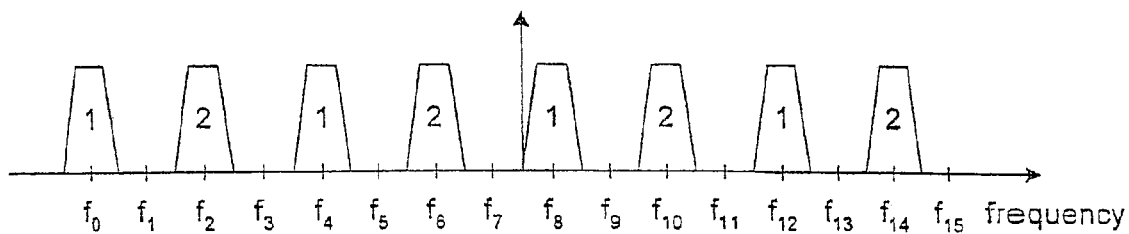
FIG. 12B is a diagram illustrating the assignment of the groups of sub-channels of FIG. 12A in accordance with the invention.

SIR reporting will be simultaneously occurring for a plurality of devices within cell 1102. Thus, FIG. 12B illustrates the situation where two communication devices corresponding to user1 and user2 report SIR levels above the threshold for groups G1, G3, G5, and G7. Base station 1110 preferably then assigns sub-channel groups to user1 and user2 based on the SIR reporting as illustrated in FIG. 12B. When assigning the "good" sub-channel groups to user1 and user2, base station 1110 also preferably assigns them based on the principles of frequency diversity. In FIG. 12B, therefore, user1 and user2 are alternately assigned every other "good" sub-channel.

Figure 13:
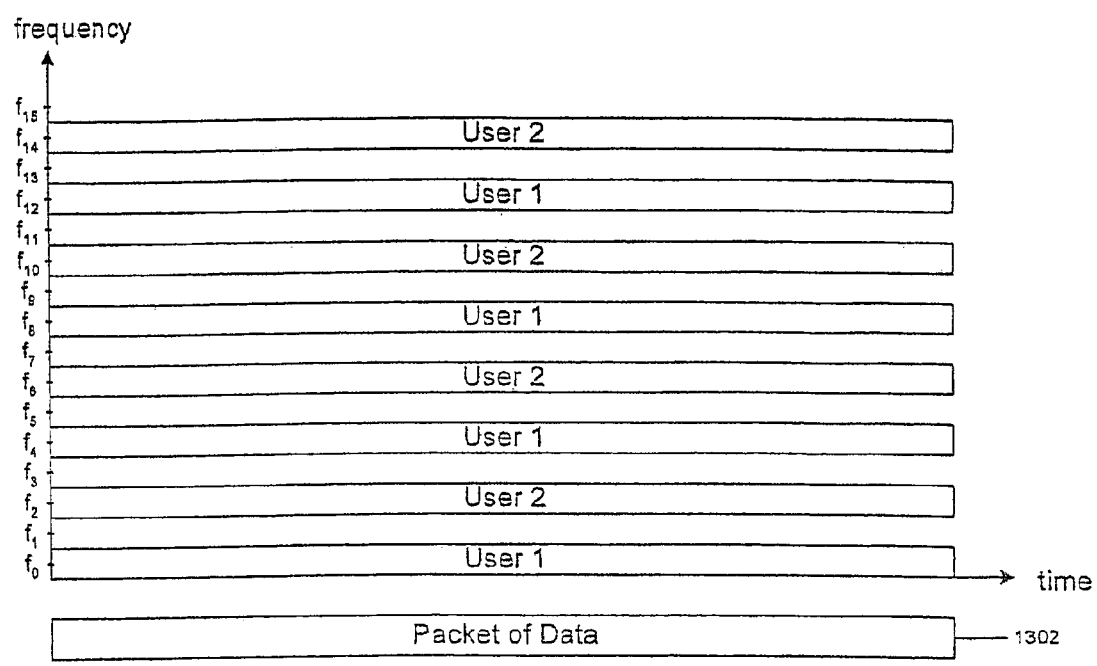
FIG. 13 is a diagram illustrating the group assignments of FIG. 12B in the time domain.

The assignment of sub-channels in the frequency domain is equivalent to the assignment of time slots in the time domain. Therefore, as illustrated in FIG. 13, two users, user1 and user2, receive packet 1302 transmitted over communication channel 1200. FIG. 13 also illustrated the sub-channel assignment of FIG. 12B. While FIGS. 12 and 13 illustrate sub-channel/time slot assignment based on SIR for two users, the principles illustrated can be extended for any number of users. Thus, a packet within cell 1102 can be received by 3 or more users. Although, as the number of available sub-channels is reduced due to high SIR, so is the available bandwidth. In other words, as available sub-channels are reduced, the number of users that can gain access to communication channel 1200 is also reduced.

Poor SIR can be caused for a variety of reasons, but frequently it results from a device at the edge of a cell receiving communication signals from adjacent cells. Because each cell is using the same bandwidth B, the adjacent cell signals will eventually raise the noise level and degrade SIR for certain sub-channels. In certain embodiments, therefore, sub-channel assignment can be coordinated between cells, such as cells 1102, 1104, and 1106 in FIG. 11, in order to prevent interference from adjacent cells.

Thus, if communication device 1108 is near the edge of cell 1102, and device 1118 is near the edge of cell 1106, then the two can interfere with each other. As a result, the SIR measurements that device 1108 and 1118 report back to base stations 1110 and 1114, respectively, will indicate that the interference level is too high. Base station 1110 can then be configured to assign only the odd groups, i.e., G1, G3, G5, etc., to device 1108, while base station 1114 can be configured to assign the even groups to device 1118 in—a coordinated fashion. The two devices 1108 and 1118 will then not interfere with each other due to the coordinated assignment of sub-channel groups.

Assigning the sub-channels in this manner reduces the overall bandwidth available to devices 1108 and 1118, respectively. La this case the bandwidth is reduced by a factor of two. But it should be remembered that devices operating closer to each base station 1110 and 1114, respectively, will still be able to use all sub-channels if needed. Thus, it is only devices, such as device 1108, that are near the edge of a cell that will have the available bandwidth reduced. Contrast this with a CDMA system, for example, in which the bandwidth for all users is reduced, due to the spreading techniques used in such systems, by approximately a factor of 10 at all times. It can be seen, therefore, that the systems and methods for wireless communication over a wide bandwidth channel using a plurality of sub-channels not only improves the quality of service, but can also increase the available bandwidth significantly.

When there are three devices 1108, 1118, and 1116 near the edge of their respective adjacent cells 1102, 1104, and 1106, the sub-channels can be divided by three. Thus, device 1108, for example, can be assigned groups G1, G4, etc., device 1118 can be assigned groups G2, G5, etc., and device 1116 can be assigned groups G3, G6, etc. In this case the available bandwidth for these devices, i.e., devices near the edges of cells 1102, 1104, and 1106, is reduced by a factor of 3, but this is still better than a CDMA system, for example.

Figure 14:
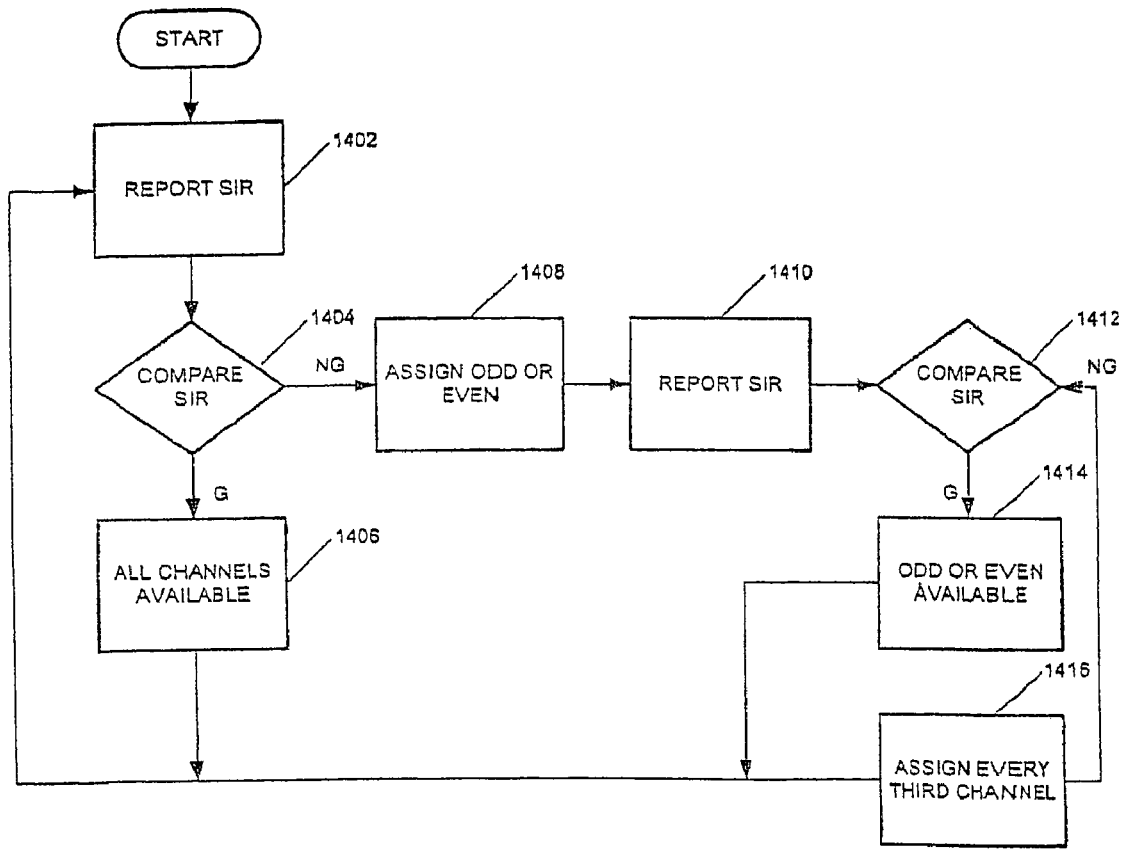
FIG. 14 is a flow chart illustrating the assignment of sub-channels based on SIR measurements in the wireless communication system of FIG. 11 in accordance with the invention.

The manner in which such a coordinated assignment of sub-channels can work is illustrated by the flow chart in FIG. 14. First in step 1402, a communication device, such as device 1108, reports the SIR for all sub-channel groups G1 to G8. The SIRs reported are then compared, in step 1404, to a threshold to determine if the SIR is sufficiently low for each group. Alternatively, device 1108 can make the determination and simply report which groups are above or below the SIR threshold. If the SIR levels are good for each group, then base station. 1110 can make each group available to device 1108, in step 1406. Periodically, device 1108 preferably measures the SIR level and updates base station 1110 in case the SIR as deteriorated. For example, device 1108 may move from near the center of cell 1102 toward the edge, where interference from an adjacent cell may affect the SIR for device 1108.

If the comparison in step 1404 reveals that the SIR levels are not good, then base station 1110 can be preprogrammed to assign either the odd groups or the even groups only to device 1108, which it will do in step 1408. Device 1108 then reports the SIR measurements for the odd or even groups it is assigned in step 1410, and they are again compared to a SIR threshold in step 1412.

It is assumed that the poor SIR level is due to the fact that device 1108 is operating at the edge of cell 1102 and is therefore being interfered with by a device such as device 1118. But device 1108 will be interfering with device 1118 at the same time. Therefore, the assignment of odd or even groups in step 1408 preferably corresponds with the assignment of the opposite groups to device 1118, by base station 1114. Accordingly, when device 1108 reports the SIR measurements for whichever groups, odd or even, are assigned to it, the comparison in step 1410 should reveal that the SIR levels are now below the threshold level. Thus, base station 1110 makes the assigned groups available to device 1108 in step 1414. Again, device 1108 preferably periodically updates the SIR measurements by returning to step 1402.

It is possible for the comparison of step 1410 to reveal that the SIR levels are still above the threshold, which should indicate that a third device, e.g., device 1116 is still interfering with device 1108. In this case, base station 1110 can be preprogrammed to assign every third group to device 1108 in step 1416. This should correspond with the corresponding assignments of non-interfering channels to devices 1118 and 1116 by base stations 1114 and 1112, respectively. Thus, device 1108 should be able to operate on the sub-channel groups assigned, i.e., G1, G4, etc., without undue interference. Again, device 1108 preferably periodically updates the SIR measurements by returning to step 1402. Optionally, a third comparison step (not shown) can be implemented after step 1416, to ensure that the groups assigned to device 1408 posses an adequate SIR level for proper operation. Moreover, if there are more adjacent cells, i.e., if it is possible for devices in a $4^{th}$ or even a $5^{th}$ adjacent cell to interfere with device 1108, then the process of FIG. 14 would continue and the sub-channel groups would be divided even further to ensure adequate SIR levels on the sub-channels assigned to device 1108.

Even though the process of FIG. 14 reduces the bandwidth available to devices at the edge of cells 1102, 1104, and 1106, the SIR measurements can be used in such a manner as to increase the data rate and therefore restore or even increase bandwidth. To accomplish this, the transmitters and receivers used in base stations 1102, 1104, and 1106, and in devices in communication therewith, e.g., devices 1108, 1114, and 1116 respectively, must be capable of dynamically changing the symbol mapping schemes used for some or all of the sub-channel. For example, in some embodiments, the symbol mapping scheme can be dynamically changed among BPSK, QPSK, 8PSK, 16QAM, 32QAM, etc. As the symbol mapping scheme moves higher, i.e., toward 32QAM, the SIR level required for proper operation moves higher, i.e., less and less interference can be withstood. Therefore, once the SIR levels are determined for each group, the base station, e.g., base station 1110, can then determine what symbol mapping scheme can be supported for each sub-channel group and can change the modulation scheme accordingly. Device 1108 must also change the symbol mapping scheme to correspond to that of the base stations. The change can be effected for all groups uniformly, or it can be effected for individual groups. Moreover, the symbol mapping scheme can be changed on just the forward link, just the reverse link, or both, depending on the embodiment.

Thus, by maintaining the capability to dynamically assign sub-channels and to dynamically change the symbol mapping scheme used for assigned sub-channels, the systems and methods described herein provide the ability to maintain higher available bandwidths with higher performance levels than conventional systems. To fully realize the benefits described, however, the systems and methods described thus far must be capable of implementation in a cost effect and convenient manner. Moreover, the implementation must include reconfigurability so that a single device can move between different types of communication described herein. The following descriptions detail example high level embodiments of hardware implementations configured to operate in accordance with the systems and methods described herein in such a manner as to provide the capability just described above.

5. Sample Transmitter Embodiments

Figure 15:
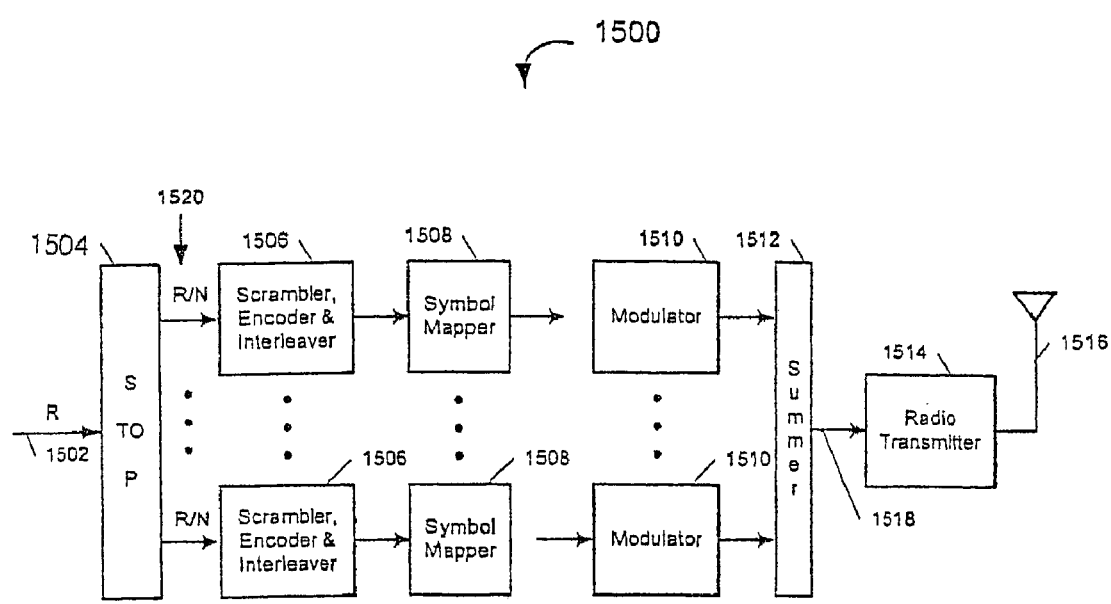
FIG. 15 is a logical block diagram of an example embodiment of transmitter configured in accordance with the invention.

FIG. 15 is logical block diagram illustrating an example embodiment of a transmitter 1500 configured for wireless communication in accordance with the systems and methods described above. The transmitter could, for example be within a base station, e.g., base station 606, or within a communication device, such as device 604, Transmitter 1500 is provided to illustrate logical components that can be included in a transmitter configured in accordance with the systems and methods described herein. It is not intended to limit the systems and methods for wireless communication over a wide bandwidth channel using a plurality of sub-channels to any particular transmitter configuration or any particular wireless communication system.

With this in mind, it can be seen that transmitter 1500 comprises a serial-to-parallel converter 1504 configured to receive a serial data stream 1502 comprising a data rate R. Serial-to-parallel converter 1504 converts data stream 1502 into N parallel data streams 1520, where N is the number of sub-channels 200. It should be noted that while the discussion that follows assumes that a single serial data stream is used, more than one serial data stream can also be used if required or desired. In any case, the data rate of each parallel data stream 1520 is then R/N. Each data stream 1520 is then sent to a scrambler, encoder, and interleaver block 1506. Scrambling, encoding, and interleaving are common techniques implemented in many wireless communication transmitters and help to provide robust, secure communication. Examples of these techniques will be briefly explained for illustrative purposes.

Scrambling breaks on the data to be transmitted in an effort to smooth out the spectral density of the transmitted data. For example, if the data comprises a long string of "1"s, there will be a spike in the spectral density. This spike can cause greater interference within the wireless communication system. By breaking up the data, the spectral density can be smoothed out to avoid any such peaks. Often, scrambling is achieved by XORing the data with a random sequence, Encoding, or coding, the parallel bit streams 1520 can, for example, provide Forward Error Correction (FEC). The purpose of FEC is to improve the capacity of a communication channel by adding some, carefully designed redundant information to the data being transmitted through the channel. The process of adding this redundant information is known as channel coding. Convolutional coding and block coding are the two major forms of channel coding. Convolutional codes operate on serial data, one or a few bits at a time. Block codes operate on relatively large (typically, up to a couple of hundred bytes) message blocks. There are a variety of useful convolutional and block codes, and a variety of algorithms for decoding the received coded information sequences to recover the original data. For example, convolutional encoding or turbo, coding with Viterbi decoding is a FEC technique that is particularly suited to a channel in which the transmitted signal is corrupted mainly by additive white gaussian noise (AWGN) or even a channel that simply experiences fading.

Convolutional codes are usually described using two parameters: the code rate convolutional encoder (k) to the number of channel symbols (n) output by the convolutional encoder in a given encoder cycle. A common code rate is ½, which means that 2 symbols are produced for every 1-bit input into the coder. The constraint length parameter, K, denotes the "length" of the convolutional encoder, i.e. how many k-bit stages are available to feed the combinatorial logic that produces the output symbols. Closely related to K is the parameter w, which indicates how many encoder cycles an input bit is retained and used for encoding after it first appears at the input to the convolutional encoder. The m parameter can be thought of as the memory length of the encoder.

Interleaving is used to reduce the effects of fading. Interleaving mixes up the order of the data so that if a fade interferes with a portion of the transmitted signal, the overall message will not be effected. This is because once the message is de-interleaved and decoded in the receiver, the data lost will comprise non-contiguous portions of the overall message. In other words, the fade will interfere with a contiguous portion of the interleaved message, but when the message is de-interleaved, the interfered with portion is spread throughout the overall message. Using techniques such as FEC, the missing information can then be filled in, or the impact of the lost data may just be negligible.

After blocks 1506, each parallel data stream 1520 is sent to symbol mappers 1508. Symbol mappers 1508 apply the requisite symbol mapping, e.g., BPSK, QPSK, etc., to each parallel data stream 1520. Symbol mappers 1508 are preferably programmable so that the modulation applied to parallel data streams can be changed, for example, in response to the SIR reported for each sub-channel 202. It is also preferable, that each symbol mapper 1508 be separately programmable so that the optimum symbol mapping scheme for each sub-channel can be selected and applied to each parallel data stream 1520.

After symbol mappers 1508, parallel data streams 1520 are sent to modulators 1510. Important aspects and features of example embodiments of modulators 1510 are described below. After modulators 1510, parallel data streams 1520 are sent to summer 1512, which is configured to sum the parallel data streams and thereby generate a single serial data stream 1518 comprising each of the individually processed parallel data streams 1520. Serial data stream 1518 is then sent to radio transmitter 1514, where it is modulated with an RF carrier, amplified, and transmitted via antenna 1516 according to known techniques. Radio module embodiments that can be used in conjunction with the systems and methods described herein are described below.

The transmitted signal occupies the entire bandwidth B of communication channel 100 and comprises each of the discrete parallel data streams 1520 encoded onto their respective sub-channels 102 within bandwidth B. Encoding parallel data streams 1520 onto the appropriate sub-channels 102 requires that each parallel data stream 1520 be shifted in frequency by an appropriate offset! This is achieved in modulator 1510.

Figure 16:
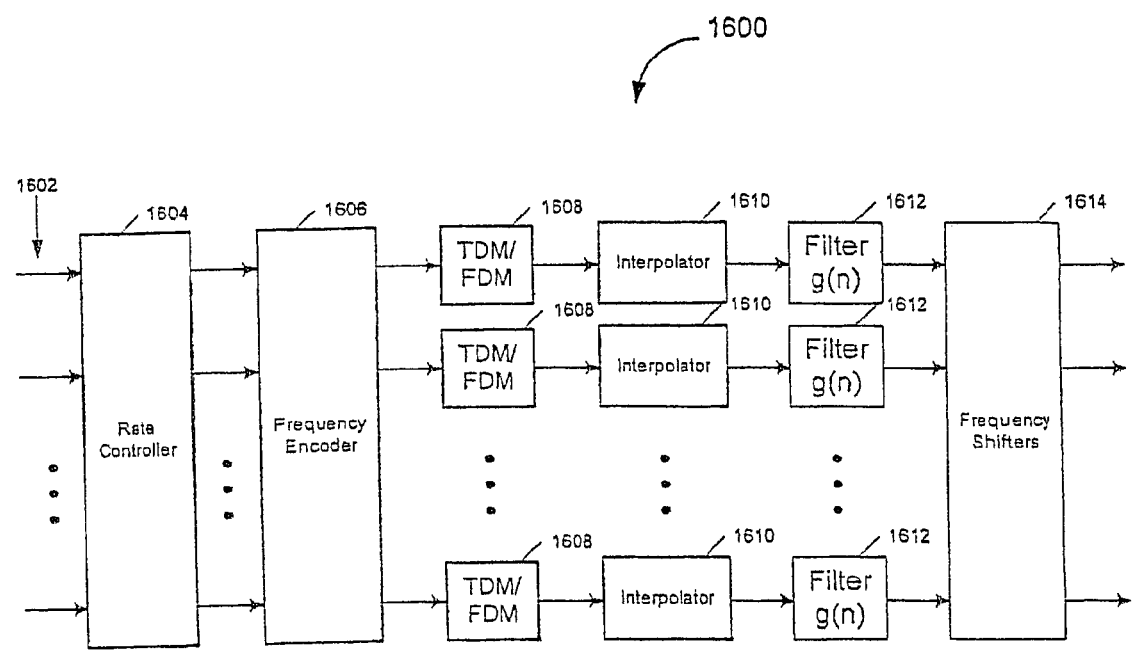
FIG. 16 is a logical block diagram of an example embodiment of a modulator configured in accordance with the present invention for use in the transmitter of FIG. 15.

FIG. 16 is a logical block diagram of an example embodiment of a modulator 1600 in accordance with the systems and methods described herein. Importantly, modulator 1600 takes parallel data streams 1602 performs Time Division Modulation (TDM) or Frequency Division Modulation (FDM) on each data stream 1602, filters them using filters 1612, and then shifts each data stream in frequency using frequency shifter 1614 so that they occupy the appropriate sub-channel. Filters 1612 apply the required pulse snapping, i.e., they apply the roll-off factor described in section 1. The frequency shifted parallel data streams 1602 are then summed and transmitted. Modulator 1600 can also include rate controller 1604, frequency encoder 1606, and interpolators 1610. All of the components shown in FIG. 16 are described in more detail in the following paragraphs and in conjunction with FIGS. 17-23.

Figure 17:
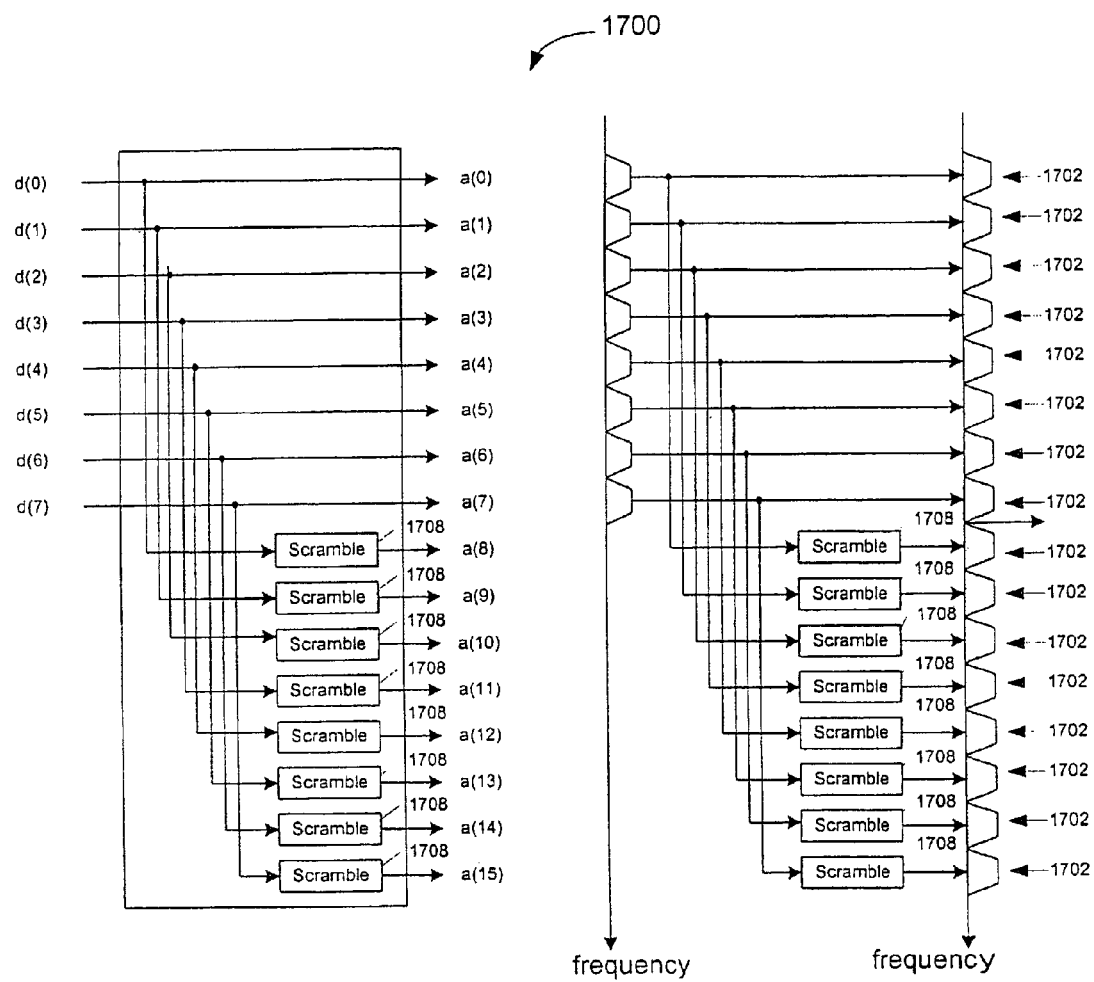
FIG. 17 is a diagram illustrating an example embodiment of a rate controller configured in accordance with the invention for use in the modulator of FIG. 16.

FIG. 17 illustrates one example embodiment of a rate controller 1700 in accordance with the systems and methods described herein. Rate control 1700 is used to control the data rate of each parallel data stream 1602. In rate controller 1700, the data rate is halved by repeating data streams d(0) to d(7), for example, producing streams a(0) to a(15) in which a(0) is the same as a(8), a(1) is the same as a(9), etc. FIG. 17 illustrates that the effect of repeating the data streams in this manner is to take the data streams that are encoded onto the first 8 sub-channels 1702, and duplicate them on the next 8 sub-channels 1702. As can be seen 7 sub-channels separate sub-channels 1702 comprising the same, or duplicate, data streams. Thus, if fading effects one sub-channel 1702, for example, the other sub-channels 1702 carrying the same data will likely not be effected, i.e., there is frequency diversity between the duplicate data streams. So by sacrificing data rate, in this case half the data rate, more robust transmission is achieved. Moreover, the robustness provided by duplicating the data streams d(0) to d(8) can be further enhanced by applying scrambling to the duplicated data streams via scramblers 1704.

It should be noted that the data rate can be reduced by more than half, e.g., by four or more. Alternatively, the data rate can also be reduced by an amount other than half. For example if information from n data stream is encoded onto m sub-channels, where m>n. Thus, to decrease the rate by ⅔, information from one data stream can be encoded on a first sub-channel, information from a second data stream can be encoded on a second data channel, and the sum or difference of the two data streams can be encoded on a third channel. In which case, proper scaling will need to be applied to the power in the third channel. Otherwise, for example, the power in the third channel can be twice the power in the first two.

Preferably, rate controller 1700 is programmable so that the data rate can be changed responsive to certain operational factors. For example, if the SIR reported for sub-channels 1702 is low, then rate controller 1700 can be programmed to provide more robust transmission via repetition to ensure that no data is lost due to interference. Additionally, different types of wireless communication system, e.g., indoor, outdoor, line-of-sight, may require varying degrees of robustness. Thus, rate controller 1700 can be adjusted to provide the minimum required robustness for the particular type of communication system. This type of programmability not only ensures robust communication, it can also be used to allow a single device to move between communication systems and maintain superior performance.

Figure 18:
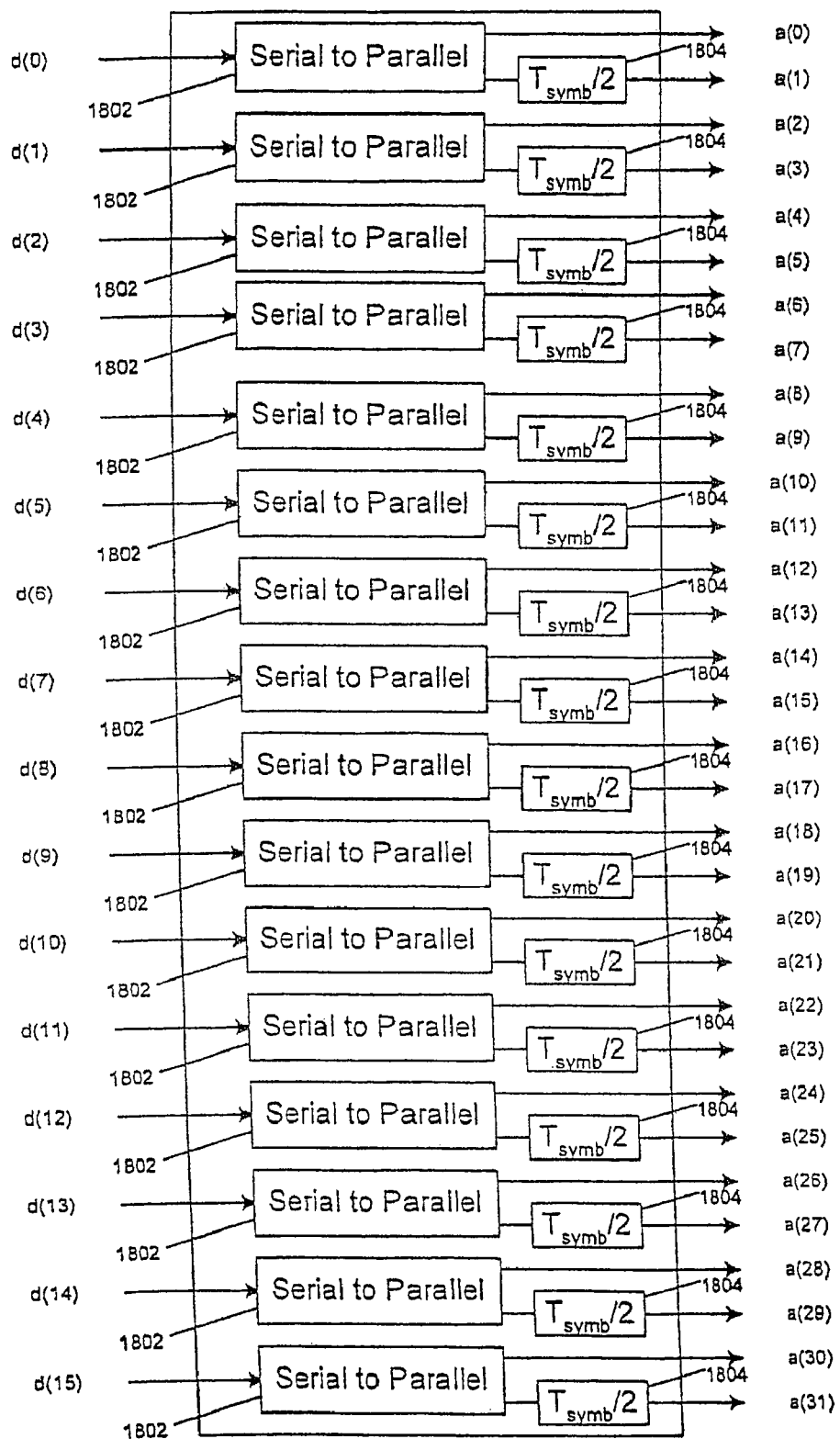
FIG. 18 is a diagram illustrating another example embodiment of a rate controller configured in accordance with the invention for use in the modulator of FIG. 16.

FIG. 18 illustrates an alternative example embodiment of a rate controller 1800 in accordance with the systems and methods described. In rate controller 1800 the data rate is increased instead of decreased. This is accomplished using serial-to-parallel converters 1802 to convert each data streams d(0) to d(15), for example, into two data streams. Delay circuits 1804 then delay one of the two data streams generated by each serial-to-parallel converter 1802 by ½ a symbol, period. Thus, data streams d(0) to d(15) are transformed into data streams a(0) to a(31). The data streams generated by a particular serial-to-parallel converter 1802 and associate delay circuit 1804 must then be summed and encoded onto the appropriate sub-channel. For example, data streams a(0) and a(1) must be summed and encoded onto the first sub-channel. Preferably, the data streams are summed subsequent to each data stream being pulsed shaped by a filter 1612.

Thus, rate controller 1604 is preferably programmable so that the data rate can be increased, as in rate controller 1800, or decreased, as in rate controller 1700, as required by a particular type of wireless communication system, or as required by the communication channel conditions or sub-channel conditions. In the event that the data rate is increased, filters 1612 are also preferably programmable so that they can be configured to apply pulse shaping to data streams a(0) to a(31), for example, and then sum the appropriate streams to generate the appropriate number of parallel data streams to send to frequency shifter 1614.

The advantage of increasing the data rate in the manner illustrated in FIG. 18 is that higher symbol mapping rates can essentially be achieved, without changing the symbol mapping used in symbol mappers 1508. Once the data streams are summed, the summed streams are shifted in frequency so that they reside in the appropriate sub-channel. But because the number of bits per each symbol has been doubled, the symbol mapping rate has been doubled. Thus, for example, a 4QAM symbol mapping can be converted to a 16 QAM symbol mapping, even if the SIR is too high for 16QAM symbol mapping to otherwise be applied. In other words, programming rate controller 1800 to increase the data rate in the manner illustrated in FIG. 18 can increase the symbol mapping even when channel conditions would otherwise not allow it, which in turn can allow a communication device to maintain adequate or even superior performance regardless of the type of communication system.

The draw back to increasing the data rate as illustrated in FIG. 18 is that interference is increased, as is receiver complexity. The former is due to the increased amount of data, the latter is due to the fact that each symbol cannot be processed independently because of the ½ symbol overlap. Thus, these concerns must be balanced against the increase symbol mapping ability when implementing a rate controller such as rate controller 1800.

Figure 19:
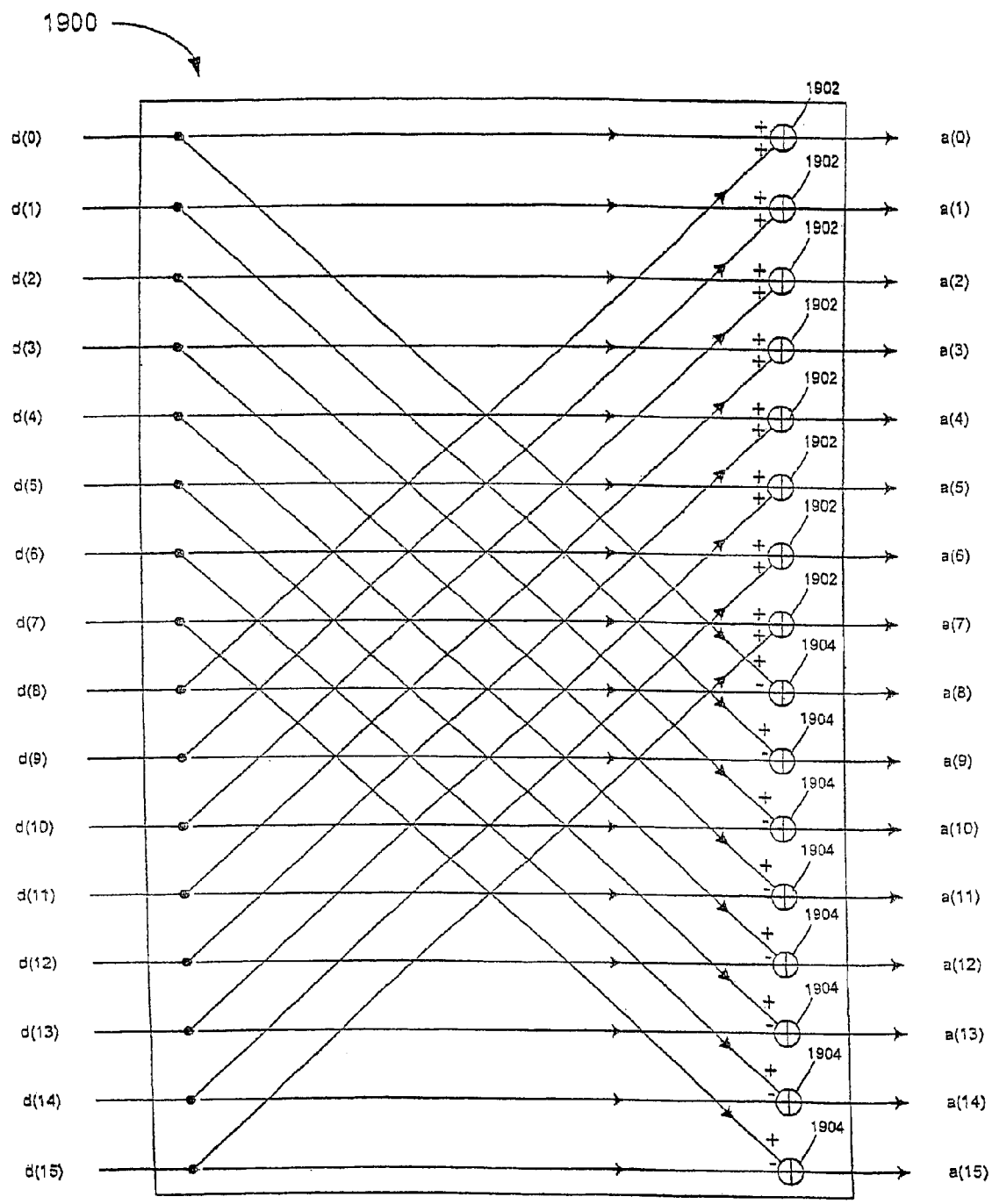
FIG. 19 is a diagram illustrating an example embodiment of a frequency encoder configured in accordance with the invention for use in the modulator of FIG. 16.

FIG. 19 illustrates one example embodiment of a frequency encoder 1900 in accordance with the systems and methods described herein. Similar to rate encoding, frequency encoding is preferably used to provide increased communication robustness. In frequency encoder 1900 the sum or difference of multiple data streams are encoded onto each sub-channel. This is accomplished using adders 1902 to sum data streams d(0) to d(7) with data streams d(8) to d(15), respectively, while adders 1904 subtract data streams d(0) to d(7) from data streams d(8) to d(15), respectively, as shown. Thus, data streams a(0) to a(15) generated by adders 1902 and 1904 comprise information related to more than one data streams d(0) to d(15). For example, a(0) comprises the sum of d(0) and d(8), i.e., d(0)+d(8), while a(8) comprises d(8)−d(0). Therefore, if either a(0) or a(8) is not received due to fading, for example, then both of data streams d(0) and d(8) can still be retrieved from data stream a(8).

Essentially, the relationship between data stream d(0) to d(15) and a(0) to a(15) is a matrix relationship. Thus, if the receiver knows the correct matrix to apply, it can recover the sums and differences of d(0) to d(15) from a(0) to a(15). Preferably, frequency encoder 1900 is programmable, so that it can be enabled and disabled in' order to provided robustness when required. Preferable, adders 1902 and 1904 are programmable also so that different matrices can be applied to d(0) to d(15)

Figure 20:
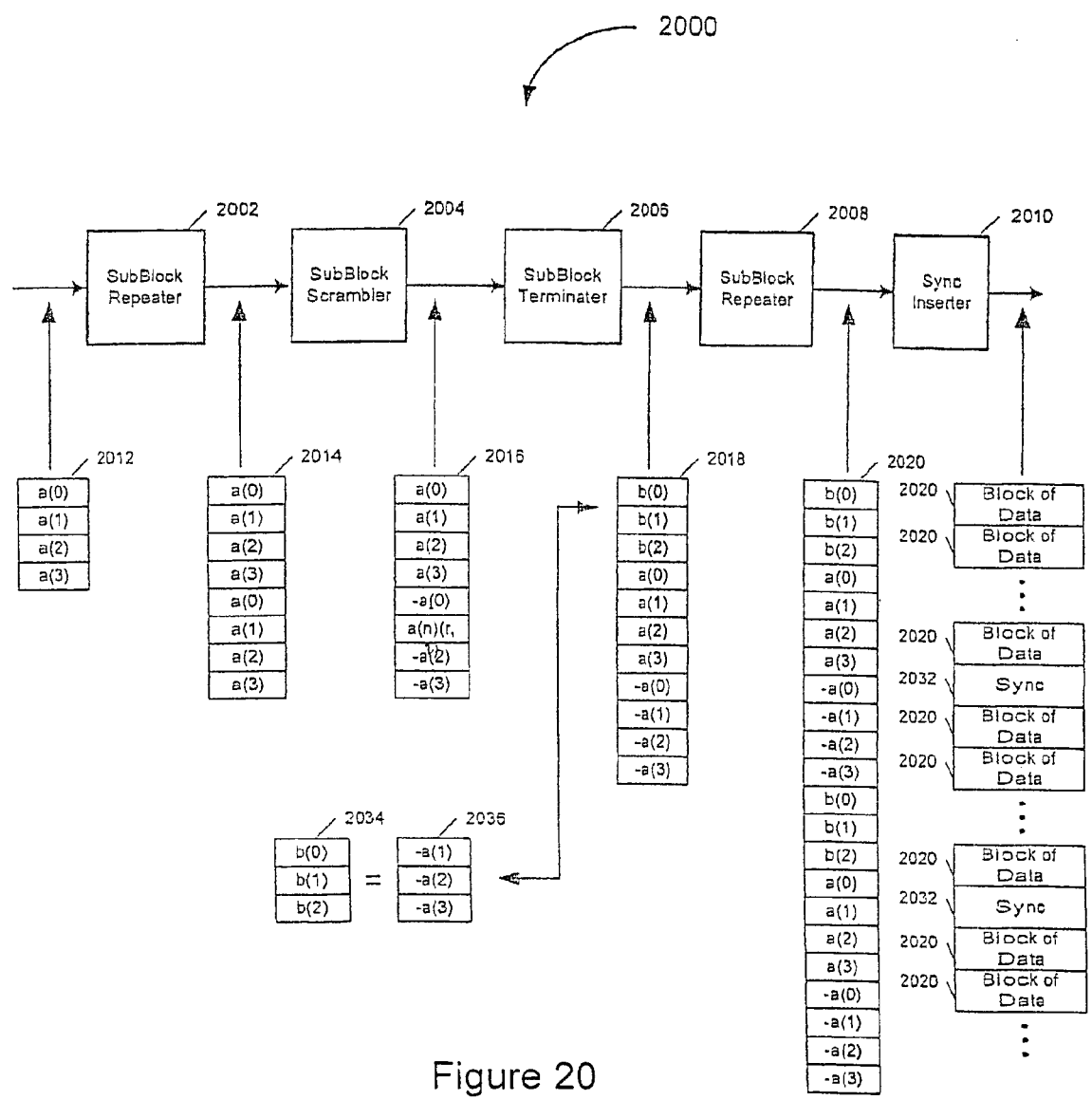
FIG. 20 is a logical block diagram of an example embodiment of a TDM/FDM block configured in accordance with the invention for use in the modulator of FIG. 16.

After frequency encoding, if it is included, data streams 1602 are sent to TDM/FDM blocks 1608. TDM/FDM blocks 1608 perform TDM or FDM on the data streams as required by the particular embodiment. FIG. 20 illustrates an example embodiment of a TDM/FDM block 2000 configured to perform TDM on a data stream. TDM/FDM block 2000 is provided to illustrate the logical components that can be included in a TDM/FDM block configured to perform TDM on a data stream. Depending on the actual implementation, some of the logical components may or may not be included. TDM/FDM block 2000 comprises a sub-block repeater 2002, a sub-block scrambler 2004, a sub-block terminator 2006, a sub-block repeater 2008, and a SYNC inserter 2010.

Sub-block repeater 2002 is configured to receive a sub-block of data, such as block 2012 comprising bits a(0) to a(3) for example. Sub-block repeater is then configured to repeat block 2012 to provide repetition, which in turn leads to more robust communication. Thus, sub-block repeater 2002 generates block 2014, which comprises 2 blocks 2012. Sub-block scrambler 2004 is then configured to receive block 2014 and to scramble it, thus generating block 2016. One method of scrambling can be to invert half of block 2014 as illustrated in block 2016. But other scrambling methods can also be implemented depending on the embodiment.

Sub-block terminator 2006 takes block 2016 generated by sub-block scrambler 2004 and adds a termination block 2034 to the front of block 2016 to form block 2018. Termination block 2034 ensures that each block can be processed independently in the receiver. Without termination block 2034, some blocks may be delayed due to multipath, for example, and they would therefore overlap part of the next block of data. But by including termination block 2034, the delayed block can be prevented from overlapping any of the actual data in the next block.

Termination block 2034 can be a cyclic prefix termination 2036. A cyclic prefix termination 2036 simply repeats the last few symbols of block 2018. Thus, for example, if cyclic prefix termination 2036 is three symbols long, then it would simply repeat the last three symbols of block 2018. Alternatively, termination block 2034 can comprise a sequence of symbols that are known to both the transmitter and receiver. The selection of what type of block termination 2034 to use can impact what type of equalizer is used in the receiver. Therefore, receiver complexity and choice of equalizers must be considered when determining what type of termination block 2034 to use in TDM/FDM block 2000.

After sub-block terminator 2006, TDM/FDM block 2000 can include a sub-block repeater 2008 configured to perform a second block repetition step in which block 2018 is repeated to form block 2020. In certain embodiments, sub-block repeater can be configured to perform a second block scrambling step as well. After sub-block repeater 2008, if included, TDM/FDM block 2000 comprises a SYNC inserter 210 configured to periodically insert an appropriate synchronization code 2032 after a predetermined number of blocks 2020 and/or to insert known symbols into each block. The purpose of synchronization code 2032 is discussed in sections.

Figure 21:
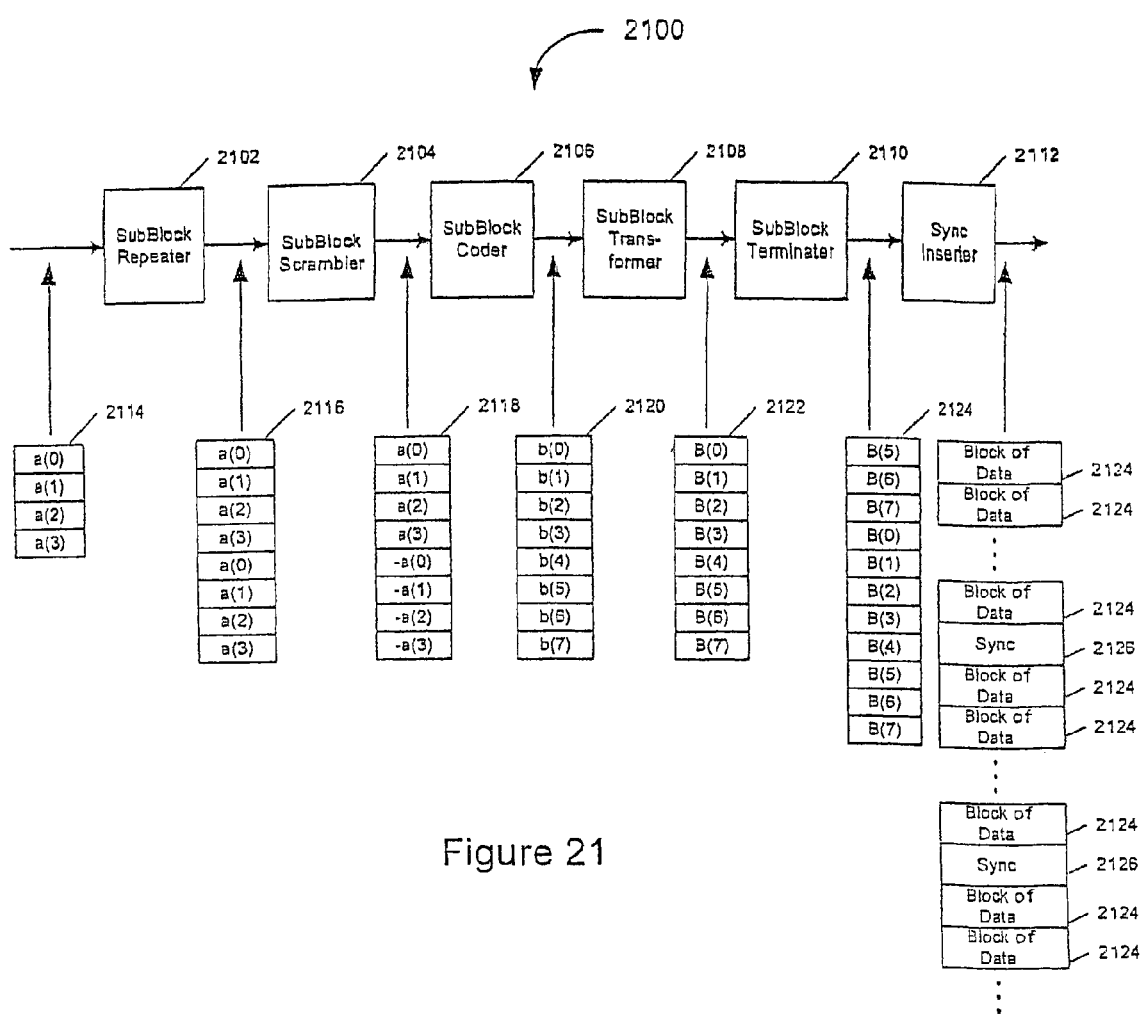
FIG. 21 is a logical block diagram of another example embodiment of a TDM/FDM block configured in accordance with the invention for use in the modulator of FIG. 16.

FIG. 21, on the other hand, illustrates an example embodiment of a TDM/FDM block 2100 configured for FDM, which comprises sub-block repeater 2102, sub-block scrambler 2104, block coder 2106, sub-block transformer 2108, sub-block terminator 2110, and SYNC inserter 2112. Sub-block repeater 2102 repeats block 2114 and generates block 2116. Sub-block scrambler then scrambles block 2116, generating block 2118. Sub-block coder 2106 takes block generates symbols b. This requires joint demodulation in the receiver, which is more robust but also more complex. Sub-block transformer 2108 then performs a transformation on block 2120, generating block 2122. Preferably, the transformation is an IFFT of block 2120, which allows for more efficient equalizers to be used in the receiver. Next, sub-block terminator 2110 terminates block 2122, generating block 2124 and SYNC inserter 2112 periodically inserts a synchronization code 2126 after a certain number of blocks 2124 and/or insert known symbols into each block. Preferably, sub-block terminator 2110 only uses cyclic prefix termination as described above. Again this allows for more efficient receiver designs.

TDM/FDM block 2100 is provided to illustrate the logical components that can be included in a TDM/FDM block configured to perform FDM on a data stream. Depending on the actual implementation, some of the logical components may or may not be included. Moreover, TDM/FDM block 2000 and 2100 are preferably programmable so that the appropriate logical components can be included as required by a particular implementation. This allows a device that incorporates one of blocks 2000 or 2100 to move between different systems with different requirements. Further, it is preferable that TDM/FDM block 1608 in FIG. 16 be programmable so that it can be programmed to perform TDM, such as described in conjunction with block 2000, or FDM, such as described in conjunction with block 2100, as required by a particular communication system.

After TDM/FDM blocks 1608, in FIG. 16, the parallel data streams are preferably passed to interpolators 1610.

After interpolators 1610, the parallel data streams are passed to filters 1612, which apply the pulse shaping described m conjunction with the roll-off factor of equation (2) in section 1. Then the parallel data streams are sent to frequency shifter 1614, which is configured to shift each parallel data stream by the frequency offset associated with the sub-channel to which the particular parallel data stream is associated.

Figure 22:
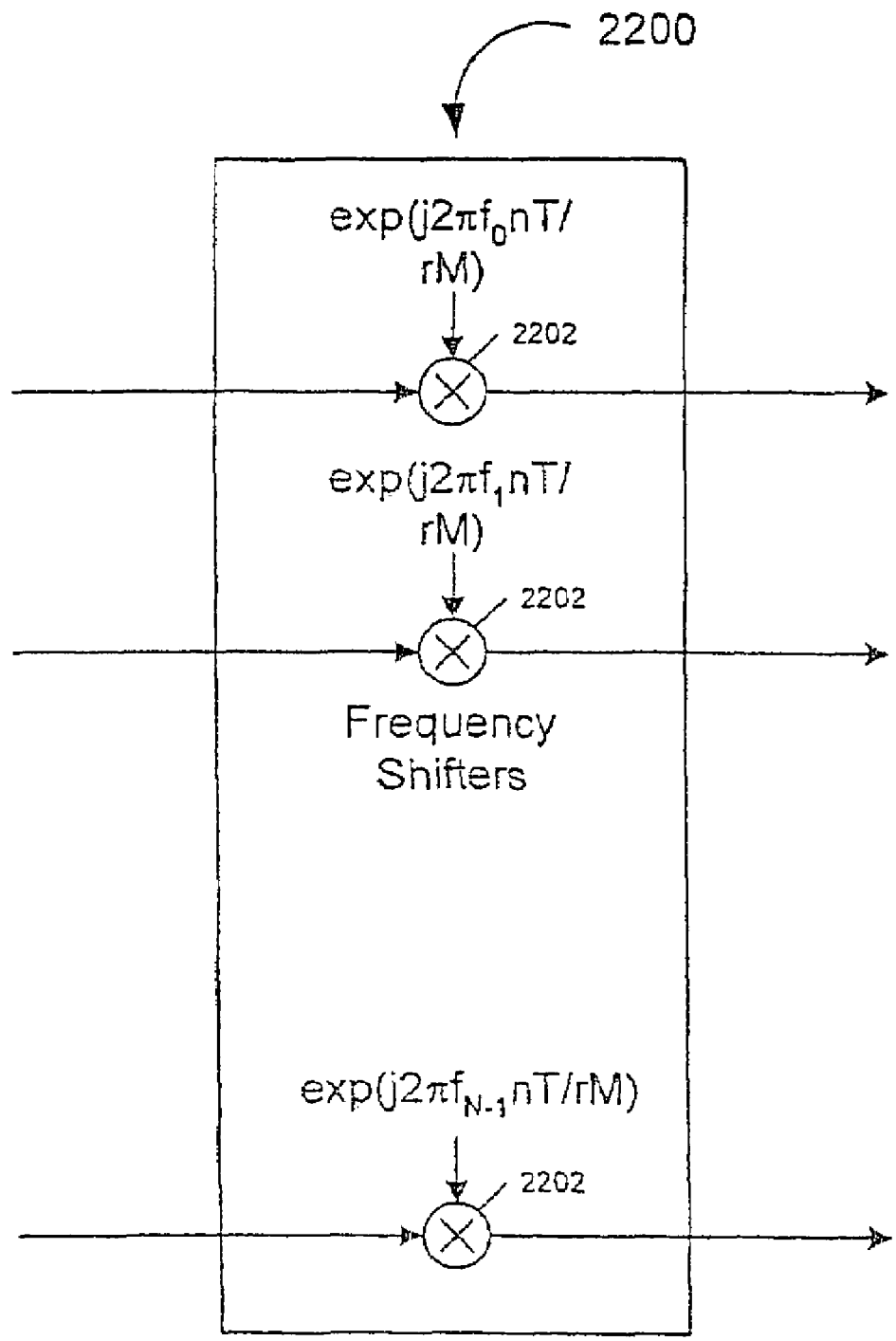
FIG. 22 is a logical block diagram of an example embodiment of a frequency shifter configured in accordance with the invention for use in the modulator of FIG. 16.

FIG. 22 illustrates an example embodiment of a frequency shifter 2200 in accordance with the systems and methods described herein. As can be seen, frequency shifter 2200 comprises multipliers 2202 configured to multiply each parallel data stream by the appropriate exponential to achieve the required frequency shift. Each exponential is of the form: $\exp(j2\pi f_c nT/rM)$, where c is the corresponding sub-channel, e.g., c=0 to N−1, and n is time. Preferably, frequency shifter 1614 in FIG. 16 is programmable so that various channel/sub-channel configurations can be accommodated for various different systems. Alternatively, an IFFT block can replace shifter 1614 and filtering can be done after the IFFT block. This type of implementation can be more efficient depending on the implementation.

After the parallel data streams are shifted, they are summed, e.g., in summer 1512 of FIG. 15. The summed data stream is then transmitted using the entire bandwidth B of the communication channel being used. But the transmitted data stream also comprises each of the parallel data streams shifted in frequency such that they occupy the appropriate sub-channel. Thus, each sub-channel may be assigned to one user, or each sub-channel may carry a data stream intended for different users. The assignment of sub-channels is described in section 3b. Regardless of how the sub-channels are assigned, however, each user will receive the entire bandwidth, comprising all the sub-channels, but will only decode those sub-channels assigned to the user.

6. Sample Receiver Embodiments

Figure 23:
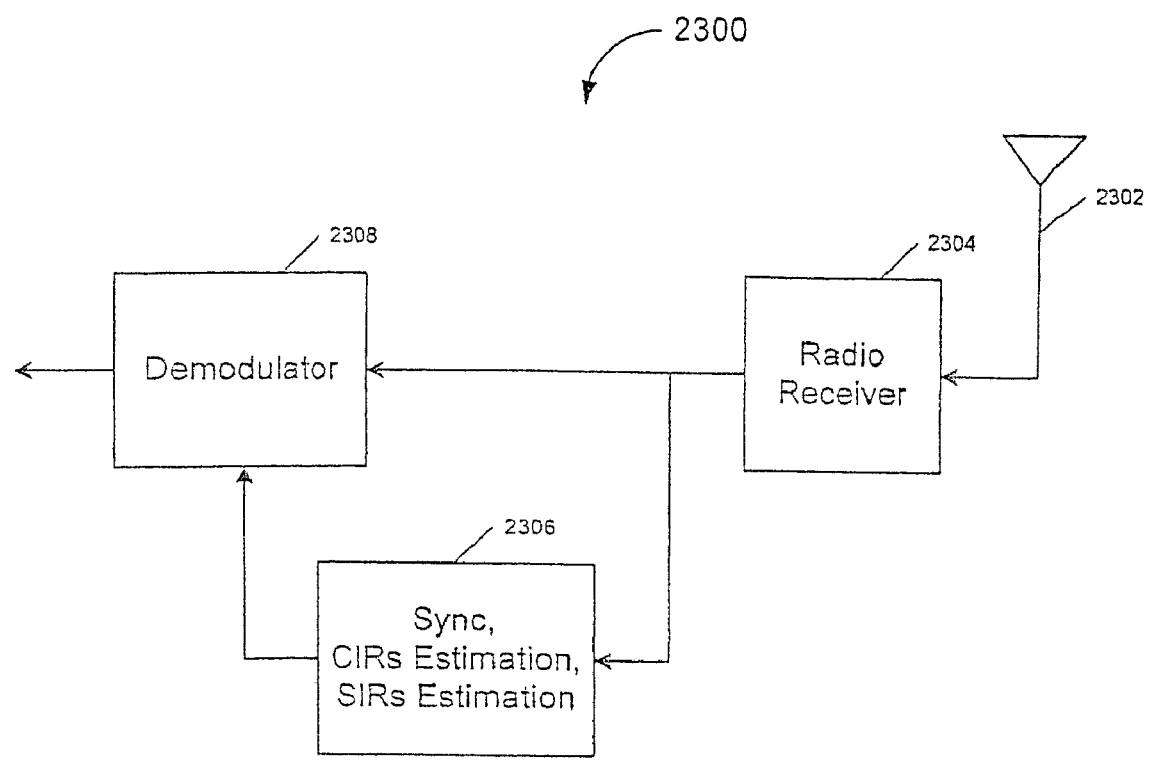
FIG. 23 is a logical block diagram of a receiver configured in accordance with the invention.

FIG. 23 illustrates an example embodiment of a receiver 2300 that can be configured in accordance with the present invention. Receiver 2300 comprises an antenna 2302 configured to receive a message transmitted by a transmitter, such as transmitter 1500. Thus, antenna 2302 is configured to receive a wide band message comprising the entire bandwidth B of a wide band channel that is divided into sub-channels of bandwidth B. As described above, the wide band message comprises a plurality of messages each encoded onto each of a corresponding sub-channel. All of the sub-channels may or may not be assigned to a device that includes receiver 2300; therefore, receiver 2300 may or may not be required to decode all of the sub-channels, After the message is received by antenna 2300, it is sent to radio receiver 2304, which is configured to remove the carrier associated with the wide band communication channel and extract a baseband signal comprising the data stream transmitted by the transmitter. Example radio receiver embodiments are described in more detail below.

The baseband signal is then sent to correlator 2306 and demodulator 2308. Correlator 2306 is configured to correlated with a synchronization code inserted in the data stream as described in section 3. It is also preferably configured to perform SIR and multipath estimations as described in section 3(b). Demodulator 2308 is configured to extract the parallel data streams from each sub-channel assigned to the device comprising receiver 2300 and to generate a single data stream therefrom.

Figure 24:
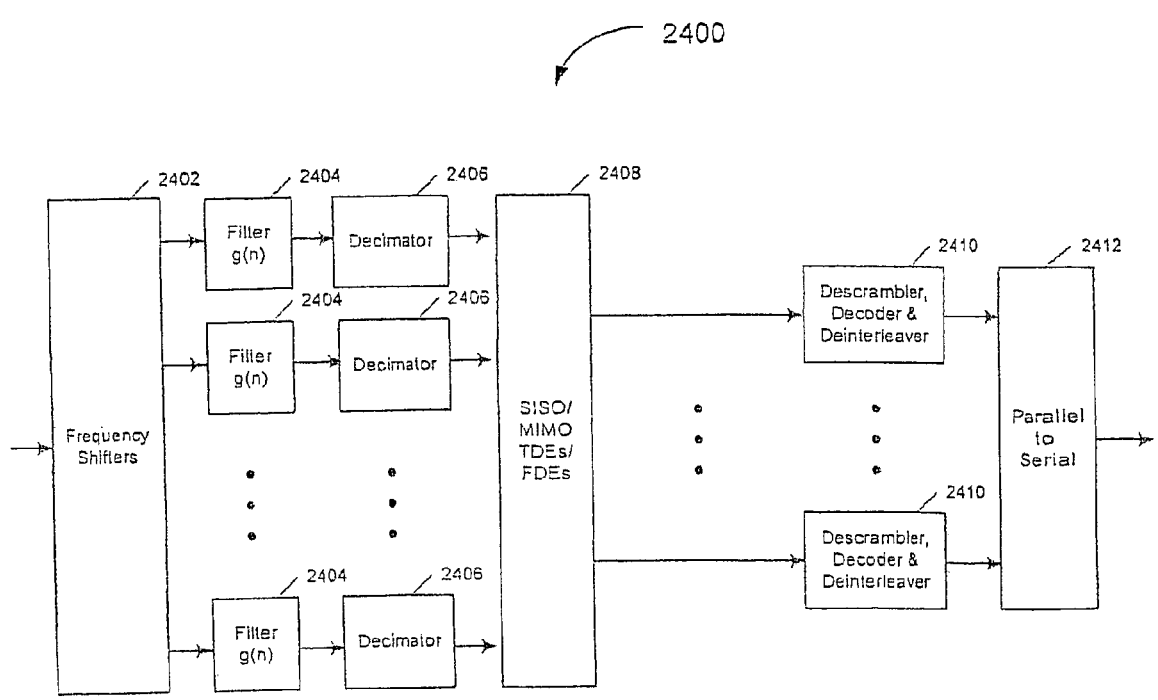
FIG. 24 is a logical block diagram of an example embodiment of a demodulator.

FIG. 24 illustrates an example embodiment of a demodulator 2400 in accordance with the systems and methods described herein. Demodulator 2400 comprises a frequency shifter 2402, which is configured to apply a frequency offset to the baseband data stream so that parallel data streams comprising the baseband data stream can be independently processed in receiver 2300. Thus, the output of frequency shifter 2402 is a plurality of parallel data streams, which are then preferably filtered by filters 2404. Filters 2404 apply a filter to each parallel data stream that corresponds to the pulse shape applied in the transmitter, e.g., transmitter 1500. Alternatively, an FFT block can replace shifter 2402 and filtering can be done after the FFT block. This type of implementation can be more efficient depending on the implementation.

Next, demodulator 2400 preferably includes decimators 2406 configured to decimate the data rate of the parallel bit streams. Sampling at higher rates helps to ensure accurate recreation of the data. But the higher the data rate, the larger and more complex equalizer 2408 becomes. Thus, the sampling rate, and therefore the number of samples, can be reduced by decimators 2406 to an adequate level that allows for a smaller and less costly equalizer 2408.

Equalizer 2408 is configured to reduce the effects of multipath in receiver 2300. Its operation will be discussed more fully below. After equalizer 2408, the parallel data streams are sent to de-scrambler, decoder, and de-interleaver 2410, which perform the opposite operations of scrambler, encoder, and interleaver 1506 so as to reproduce the original data generated in the transmitter. The parallel data streams are then sent to parallel to serial converter 2412, which generates a single serial data stream from the parallel data streams.

Equalizer 2408 uses the multipath estimates provided by correlator 2306 to equalize the effects of multipath in receiver 2300. In one embodiment, equalizer 2408 comprises Single-La Single-Out (SISO) equalizers operating on each parallel data stream in demodulator 2400. In this case, each SISO equalizer comprising equalizer 2408 receives a single input and generates a single equalized output. Alternatively, each equalizer can be a Multiple-In Multiple-Out (MIMO) or a Multiple-In Single-Out (MISO) equalizer. Multiple inputs can be required for example, when a frequency encoder or rate controller, such as frequency encoder 1900, is included in the transmitter. Because frequency encoder 1900 encodes information from more than one parallel data stream onto each sub-channel, each equalizers comprising equalizer 2408 need to equalize more than one sub-channel. Thus, for example, if a parallel data stream in demodulator 2400 comprises $d(1)+d(8)$, then equalizer 2408 will need to equalize both $d(1)$ and $d(8)$ together. Equalizer 2408 can then generate a single output corresponding to $d(1)$ or $d(8)$ (MISO) or it can generate both $d(1)$ and $d(8)$ (MIMO).

Equalizer 2408 can also be a time domain equalizer (TDE) or a frequency domain equalizer (FDE) depending on the embodiment. Generally, equalizer 2408 is a TDE if the modulator in the transmitter performs TDM on the parallel data streams, and a FDE if the modulator performs FDM. But equalizer 2408 can be an FDE even if TDM is used in the transmitter. Therefore, the preferred equalizer type should be taken into consideration when deciding what type of block termination to use in the transmitter. Because of power requirements, it is often preferable to use FDM on the forward link and TDM on the reverse link in a wireless communication system.

As with transmitter 1500, the various components comprising demodulator 2400 are preferably programmable, so that a single device can operate in a plurality of different systems and still maintain superior performance, which is a primary advantage of the systems and methods described herein. Accordingly, the above discussion provides systems and methods for implementing a channel access protocol that allows the transmitter and receiver hardware to be reprogrammed slightly depending on the communication system.

Thus, when a device moves from one system to another, it preferably reconfigures the hardware, i.e. transmitter and receiver, as required and switches to a protocol stack corresponding to the new system. An important part of reconfiguring the receiver is reconfiguring, or programming, the equalizer because multipath is a main problem for each type of system. The multipath, however, varies depending on the type of system, which previously has meant that a different equalizer is required for different types of communication systems. The channel access protocol described in the preceding sections, however, allows for equalizers to be used that need only be reconfigured slightly for operation in various systems.

a. Sample Equalizer Embodiment

Figure 25:
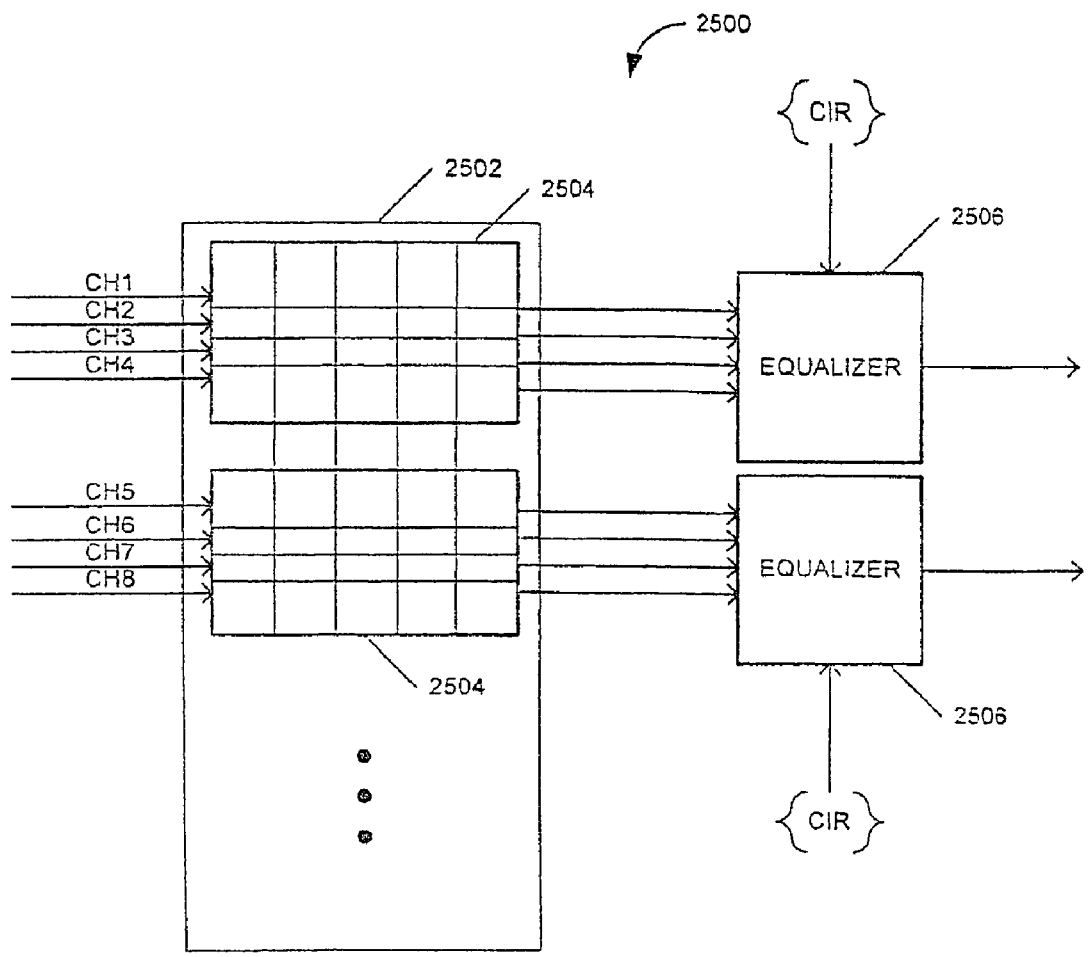
FIG. 25 is a logical block diagram of an example embodiment of an equalizer configured in accordance with the present invention for use in the demodulator of FIG. 24.

FIG. 25 illustrates an example embodiment of a receiver 2500 illustrating one way to configure equalizers 2506 in accordance with the systems and methods described herein. Before discussing the configuration of receiver 2500, it should be noted that one way to configure equalizers 2506 is to simply include one equalizer per channel (for the systems and methods described herein, a channel is the equivalent of a sub-channel as described above). A correlator, such as correlator 2306 (FIG. 23), can then provide equalizers 2506 with an estimate of the number, amplitude, and phase of any multipaths present, up to some maximum number. This is also known as the Channel Impulse Response (CIR). The maximum number of multipaths is determined based on design criteria for a particular implementation. The more multipaths included in the CIR the more path diversity the receiver has and the more robust communication in the system will be. Path diversity is discussed a little more fully below.

If there is one equalizer 2506 per channel, the CIR is preferably provided directly to equalizers 2506 from the correlator (not shown). If such a correlator configuration is used, then equalizers 2506 can be run at a slow rate, but the overall equalization process is relatively fast. For systems with a relatively small number of channels, such a configuration is therefore preferable. The problem, however, is that there is large variances in the number of channels used in different types of communication systems. For example, an outdoor system can have has many as 256 channels. This would require 256 equalizers 2506, which would make the receiver design too complex and costly. Thus, for systems with a lot of channels, the configuration illustrated in FIG. 25 is preferable. In receiver 2500, multiple channels share each equalizer 2506. For example, each equalizer can be shared by 4 channels, e.g., CH1-Ch4, Ch5-CH8, etc., as illustrated in FIG. 25. In which case, receiver 2500 preferably comprises a memory 2502 configured to store information arriving on each channel.

Memory 2502 is preferably divided into sub-sections 2504, which are each configured to store information for a particular subset of channels. Information for each channel in each subset is then alternately sent to the appropriate equalizer 2506, which equalizes the information based on the CIR provided for that channel. In this case, each equalizer must run much faster than it would if there was simply one equalizer per channel. For example, equalizers 2506 would need to run 4 or more times as fast in order to effectively equalize 4 channels as opposed to 1. In addition, extra memory 2502 is required to buffer the channel information. But overall, the complexity of receiver 2500 is reduced, because there are fewer equalizers. This should also lower the overall cost to implement receiver 2500.

Preferably, memory 2502 and the number of channels that are sent to a particular equalizer is programmable. In this way, receiver 2500 can be reconfigured for the most optimum operation for a given system. Thus, if receiver 2500 were moved from an outdoor system to an indoor system with fewer channels, then receiver 2500 can preferably be reconfigured so that there are fewer, even as few as 1, channel per equalizer. The rate at which equalizers 2506 are run is also preferably programmable such that equalizers 2506 can be run at the optimum rate for the number of channels being equalized.

In addition, if each equalizer 2506 is equalizing multiple channels, then the CIR for those multiple paths must alternately be provided to each equalizer 2506. Preferably, therefore, a memory (not shown) is also included to buffer the CIR information for each channel. The appropriate CIR information is then sent to each equalizer from the CIR memory (not shown) when the corresponding channel information is being equalized. The CIR memory (not shown) is also preferably programmable to ensure optimum operation regardless of what type of system receiver 2500 is operating in.

Returning to the issue of path diversity, the number of paths used by equalizers 2506 must account for the delay spread $d_s$ in the system. For example, if the system is an outdoor system operating in the 5 GHz range, the communication channel can comprise a bandwidth of 125 MHz, e.g., the channel can extend from 5.725 GHz to 5.85 GHz. If the channel is divided into 512 sub-channels with a roll-off factor r of 0.125, then each sub-channel will have a bandwidth of approximately 215 KHz, which provides approximately a 4.6 µs symbol duration. Since the worst case delay spread $d_s$ is 20 µs, the number of paths used by equalizers 2504 can be set to a maximum of 5. Thus, there would be a first path PI at 0 µs, a second path P2 at 4.6 µs, a third path P3 at 9.2 µs, a fourth path P4 at 13.8 µs, and fifth path P5 at 18.4 µs as, which is close to the delay spread $d_s$.

In another embodiment, a sixth path can be included so as to completely cover the delay spread $d_s$; however, 20 µs is the worst case. In fact, a delay spread $d_s$ of 3 µs is a more typical value. In most instances, therefore, the delay spread $d_s$ will actually be shorter and an extra path is not needed. Alternatively, fewer sub-channels can be used, thus providing a larger symbol duration, instead of using an extra path. But again, this would typically not be needed.

As explained above, equalizers 2506 are preferably configurable so that they can be reconfigured for various communication systems. Thus, for example, the number of paths used must be sufficient regardless of the type of communication system. But this is also dependent on the number of sub-channels used. If, for example, receiver 2500 went from operating in the above described outdoor system to an indoor system, where the delay spread $d_s$ is on the order of 1 µs, then receiver 2500 can preferably be reconfigured for 32 sub-channels and 5 paths. Assuming the same overall bandwidth of 125 MHz, the bandwidth of each sub-channel is approximately 4 MHz and the symbol duration is approximately 250 ns.

Therefore, there will be a first path PI at 0 µs and subsequent paths P2 to P5 at 250 ns, 500 ns, 750 ns, and 1 µs, respectively. Thus, the delay spread $d_s$ should be covered for the indoor environment. Again, the 1 µs $d_s$ is worst case so the 1 µs $d_s$ provided in the above example will often be more than is actually required. This is preferable, however, for indoor systems, because it can allow operation to extend outside of the inside environment, e.g., just outside the building in which the inside environment operates. For campus style environments, where a user is likely to be traveling between buildings, this can be advantageous.

7. Sample Embodiment of a Wireless Communication Device

Figure 26:
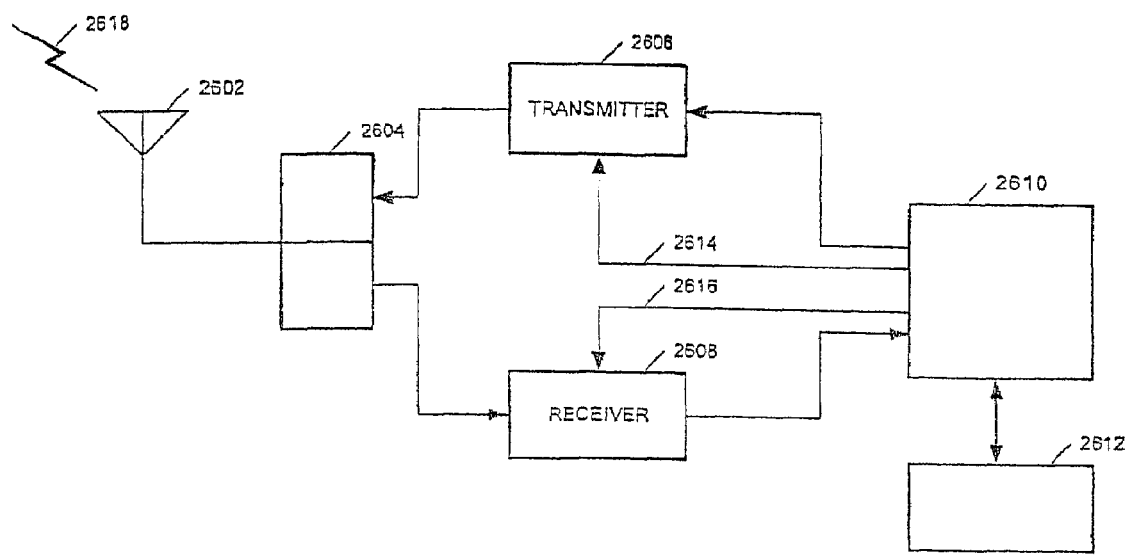
FIG. 26 is a logical block diagram of an example embodiment of a wireless communication device configured in accordance with the invention.

FIG. 26 illustrates an example embodiment of a wireless communication device in accordance with the systems and methods described herein. Device 2600 is, for example, a portable communication device configured for operation in a plurality of indoor and outdoor communication systems. Thus, device 2600 comprises an antenna 2602 for transmitting and receiving wireless communication signals over a wireless communication channel 2618. Duplexer 2604, or switch, can be included so that transmitter 2606 and receiver 2608 can both use antenna 2602, while being isolated from each other. Duplexers, or switches used for this purpose, are well known and will not be explained herein.

Transmitter 2606 is a configurable-transmitter configured to implement the channel access protocol described above. Thus, transmitter 2606 is capable of transmitting and encoding a wideband communication signal comprising a plurality of sub-channels. Moreover, transmitter 2606 is configured such that the various subcomponents that comprise transmitter 2606 can be reconfigured, or programmed, as described in section 5. Similarly, receiver 2608 is configured to implement the channel access protocol described above and is, therefore, also configured such that the various sub-components comprising receiver 2608 can be reconfigured, or reprogrammed, as described in section 6.

Transmitter 2606 and receiver 2608 are interfaced with processor 2610, which can comprise various processing, controller, and/or Digital Signal Processing (DSP) circuits. Processor 2610 controls the operation of device 2600 including encoding signals to be transmitted by transmitter 2606 and decoding signals received by receiver 2608. Device 2610 can also include memory 2612, which can be configured to store operating instructions, e.g., firmware/software, used by processor 2610 to control the operation of device 2600.

Processor 2610 is also preferably configured to reprogram transmitter 2606 and receiver 2608 via control interfaces 2614 and 2616, respectively, as required by the wireless, communication system in which device 2600 is operating. Thus, for example, device 2600 can be configured to periodically ascertain the availability is a preferred communication system. If the system is detected, then processor 2610 can be configured to load the corresponding operating instruction from memory 2612 and reconfigure transmitter 2606 and receiver 2608 for operation in the preferred system.

For example, it may preferable for device 2600 to switch to an indoor wireless LAN if it is available. So device 2600 may be operating in a wireless WAN where no wireless LAN is available, while periodically searching for the availability of an appropriate wireless LAN. Once the wireless LAN is detected, processor 2610 will load the operating instructions, e.g., the appropriate protocol stack, for the wireless LAN environment and will reprogram transmitter 2606 and receiver 2608 accordingly. In this manner, device 2600 can move from one type of communication system to another, while maintaining superior performance.

It should be noted that a base station configured in accordance with the systems and methods herein will operate in a similar manner as device 2600; however, because the base station does not move from one type of system to another, there is generally no need to configure processor 2610 to reconfigure transmitter 2606 and receiver 2608 for operation in accordance with the operating instruction for a different type of system. But processor 2610 can still be configured to reconfigure, or reprogram the sub-components of transmitter 2606 and/or receiver 2608 as required: by the operating conditions within the system as reported by communication devices in communication with the base station. Moreover, such a base station can be configured in accordance with the systems and methods described herein to implement more than one mode of operation. In which case, controller 2610 can be configured to reprogram transmitter 2606 and receiver 2608 to implement the appropriate mode of operation.

8. Bandwidth Recovery

As described above in relation to FIGS. 11-14, when a device, such as device 1118 is near the edge of a communication cell 1106, it may experience interference from base station 1112 of an adjacent communication cell 1104. In this case, device 1118 will report a low SIR to base station 1114, which will cause base station 1114 to reduce the number of sub-channels assigned to device 1118. As explained in relation to FIGS. 12 and 13, this reduction can comprise base station 1114 assigning only even sub-channels to device 1118. Preferably, base station 1112 is correspondingly assigning only odd sub-channels to device 1116.

In this manner, base station 1112 and 1114 perform complementary reductions in the channels assigned to devices 1116 and 1118 in order to prevent interference and improve performance of devices 1116 and 1118. The reduction in assigned channels reduces the overall bandwidth available to devices 1116 and 1118. But as described above, a system implementing such a complementary reduction of sub-channels will still maintain a higher bandwidth than conventional systems. Still, it is preferable to recover the unused sub-channels, or unused bandwidth, created by the reduction of sub-channels in response to a low reported SIR.

Figure 27:
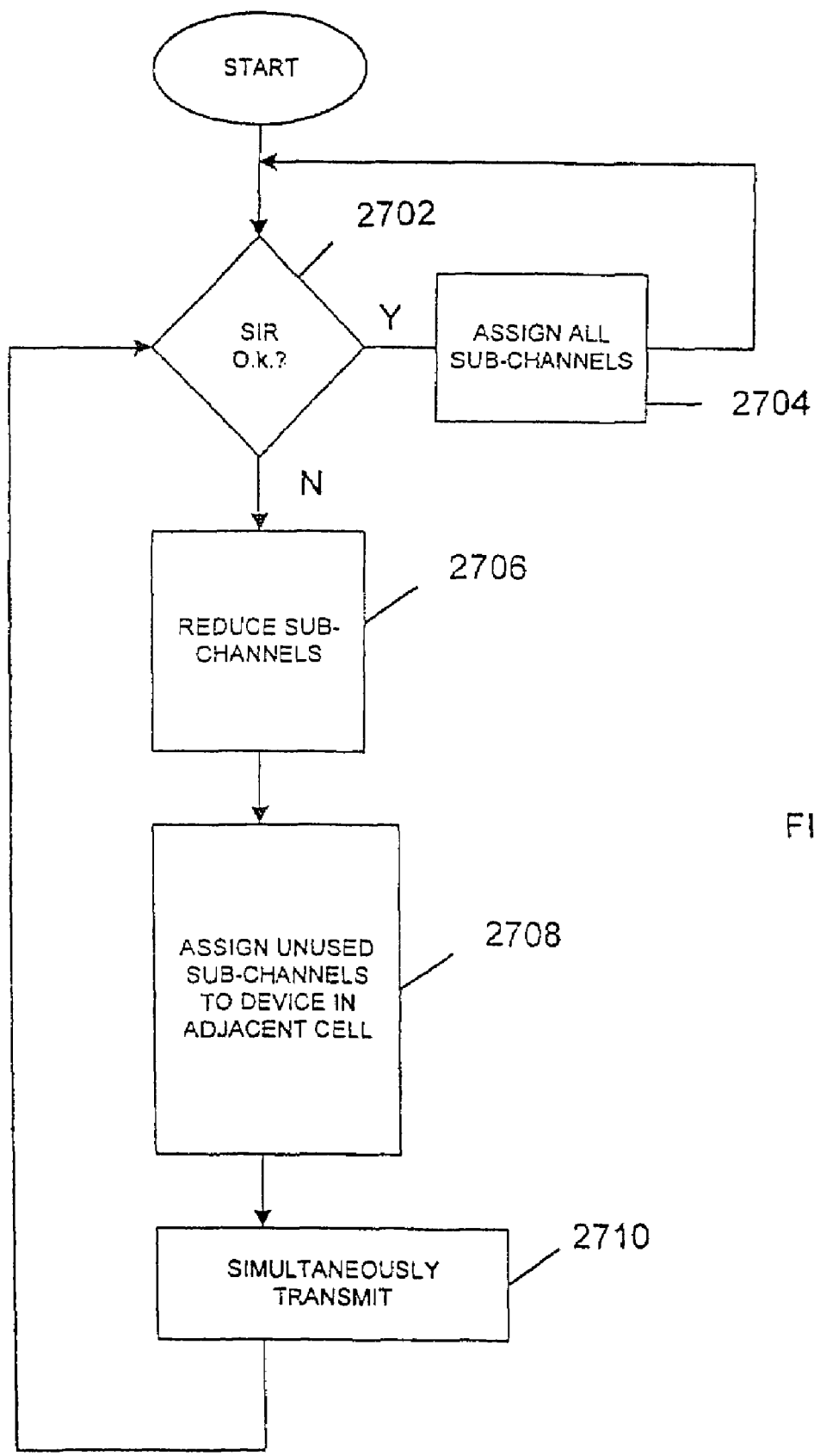
FIG. 27 is a flow chart illustrating an exemplary method for recovering bandwidth in a wireless communication network in accordance with the invention.

One method for recovering the unused bandwidth is illustrated in the flow chart of FIG. 27. First, in step 2702, base station 1114 receives SIR reports for different groups of sub-channels from device 1118 as described above. If the group SIR reports are good, then base station 1114 can assign all sub-channels to device 1118 in step 2704. If, however, some of the group SIR reports received in step 2702 are poor, then base station 1114 can reduce the number of sub-channels assigned to device 1118, e.g., by assigning only even sub-channels, in step 2706. At the same time, base station 1112 is preferably performing a complementary reduction in the sub-channels assigned to device 1116, e.g., by assigning only odd sub-channels.

At this point, each base station has unused bandwidth with respect to devices 1116 and 1118. To recover this bandwidth, base station 1114 can, in step 2708, assign the unused odd sub-channels to device 1116 in adjacent ceil 1104. It should be noted that even though cells 1102, 1104, and 1106 are illustrated as geometrically shaped, non-overlapping coverage areas, the actual coverage areas do not resemble these shapes. The shapes are essentially functions used to plan and describe a wireless communication system 1100. Therefore, base station 1114 can in fact communicate with device 1116, even though it is in adjacent cell 1104.

Once base station 1114 has assigned the odd sub-channels to device 1116, in step 2708, base station 1112 and 1114 communicate with device 1116 simultaneously over the odd sub-channels in step 2710. Preferably, base station 1112 also assigns the unused even sub-channels to device 1118 in order to recover the unused bandwidth in cell 1104 as well.

In essence, spatial diversity is achieved by having both base station 1114 and 1112 communicate with device 1116 (and 1118) over the same sub-channels. Spatial diversity occurs when the same message is transmitted simultaneously over statistically independent communication paths to the same receiver. The independence of the two paths improves the overall immunity of the system to fading. This is because the two paths will experience different fading effects. Therefore, if the receiver cannot receive the signal over one path due to fading, then it will probably still be able to receive the signal over the other path, because the fading that effected the first path will not effect the second. As a result, spatial diversity improves overall system performance by improving the Bit Error Rate (BER) in the receiver, which effectively increases the deliverable data rate to the receiver, i.e., increase the bandwidth.

For effective spatial diversity, base stations 1112 and 1114 ideally transmit the same information at the same time over the same sub-channels. As mentioned above, each base station in system 1100 is configured to transmit simultaneously, i.e., system 1100 is a TDM system with synchronized base stations. Base stations 1112 and 1114—also assigned the same sub-channels to device 1116 in step 2708. Therefore, all that is left is to ensure that base stations 1112 and 1114 send the same information. Accordingly, the information communicated to device 1116 by base stations 1112 and 1114 is preferably coordinated so that the same information is transmitted at the same time. The mechanism for enabling this coordination is discussed more fully below. Such coordination, however, also allows encoding that can provide further performance enhancements within system 1100 and allow a greater percentage of the unused bandwidth to be recovered.

One example coordinated encoding scheme that can be implemented between base stations 1112 and 1114 with respect to communications with device 1116 is Space-Time-Coding (STC) diversity. STC is illustrated by system 2800 in FIG. 28. In system 2800, transmitter 2802 transmits a message over channel 2808 to receiver 2806. Simultaneously, transmitter 2804 transmits a message over channel 2810 to receiver 2806. Because channels 2808 and 2810 are independent, system 2800 will have spatial diversity with respect to communications from transmitters 2802 and 2804 to receiver 2806. In addition, however, the data transmitted by each transmitter 2802 and 2804 can be encoded to also provide time diversity. The following equations illustrate the process of encoding and decoding data in a STC system, such as system 2800.

First, channel 2808 can be denoted hn and channel 2810 can be denoted gn, where:

$$h_n = \alpha_h e^{j\theta_h}; \text{ and} \quad (1)$$

$$g_n = \alpha_g e^{j\theta_g}. \quad (2)$$

Figure 28:
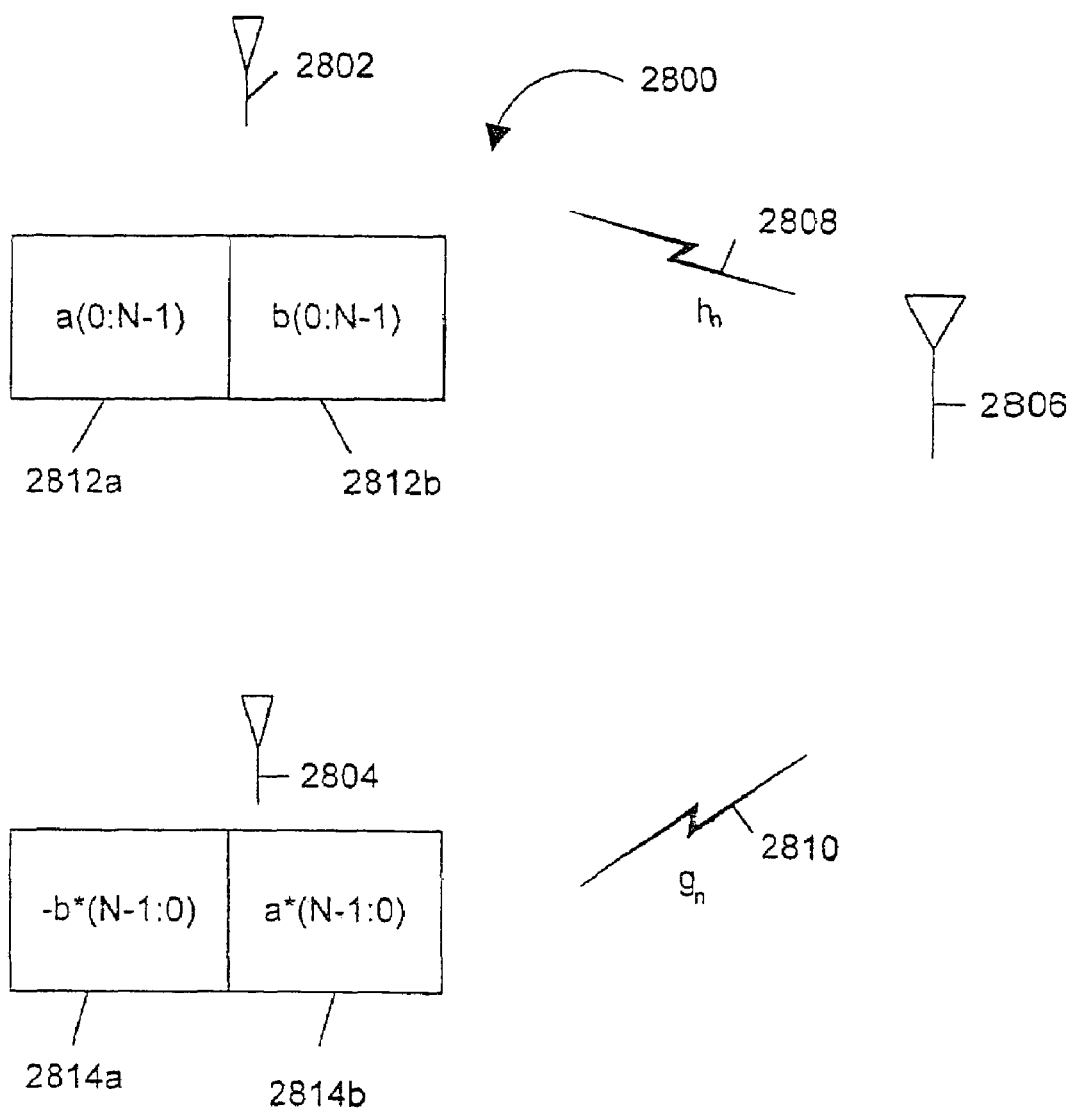
FIG. 28 is a diagram illustrating an exemplary wireless communication network in which the method of FIG. 27 can be implemented.

Second, we can look at two blocks of data 2812a and 2812b to be transmitted by transmitter 2802 as illustrated in FIG. 28. Block 2812a comprises N-symbols denoted as $a_0$, $a_1$, $a_2$, . . . , $a_{N-1}$, or a(0:N−1). Block 2812 b transmits N-symbols of data denoted b(0:N−1). Transmitter 2804 simultaneously transmits two block of data 2814a and 2814b. Block 2814a is the negative inverse conjugate of block 2812b and can therefore be described as −b*(N−1:0). Block 2814b is the inverse conjugate of block 2812a and can therefore be described as a*(N−1:0). It should be noted that each block of data in the forgoing description will preferably comprise a cyclical prefix as described above.

When blocks 2812a, 2812b, 2814a, and 2814b are received in receiver 2806, they are combined and decoded in the following manner: First, the blocks will be combined in the receiver to form the following blocks, after discarding the cyclical prefix:

$$\text{Block1} = a(0:N-1) \times h_n - b^*(N-1:0) \times g_n; \text{ and} \quad (3)$$

$$\text{Block2} = b(0:-N-1) \times h_n + a^*(N-1:0) \times g_n. \quad (4)$$

Where the symbol ⊗ represents a cyclic convolution.

Second, by taking an IFFT of the blocks, the blocks can be described as:

$$\text{Block1} = A_n * H_n - B_n^* * G_n; \text{ and} \quad (5)$$

$$\text{Block2} = B_n * H_n - A_n^* * G_n. \quad (6)$$

Where n=0 to N−1.

In equations (5) and (6) $H_n$ and $G_n$ will be known, or can be estimated. But to solve the two equations and determine $A_n$ and $B_n$, it is preferable to turn equations (5) and (6) into two equations with two unknowns. This can be achieved using estimated signals $X_n$ and $Y_n$ as follows:

$$X_n = A_n * H_n - B_n^* * G_n; \text{ and} \quad (7)$$

$$Y_n = B_n * H_n + A_n^* * G_n. \quad (8)$$

To generate two equations and two unknowns, the conjugate of $Y_n$ can be used to generate the following two equations:

$$X_n = A_n * H_n - B_n^* * G_n; \text{ and} \quad (9)$$

$$Y_n^* = B_n^* * H_n^* + A_n * G_n^*. \quad (10)$$

Thus, the two unknowns are $A_n$ and $B_n^*$ and equations (9) and (10) define a matrix relationship in terms of these two unknowns as follows:

$$\begin{bmatrix} X_n \\ Y_n^* \end{bmatrix} = \begin{bmatrix} H_n & -G_n \\ G_n^* & H_n^* \end{bmatrix} * \begin{bmatrix} A_n \\ B_n^* \end{bmatrix} \quad (11)$$

Which can be rewritten as:

$$\begin{bmatrix} A_n \\ B_n^* \end{bmatrix} = \frac{1}{|H_n|^2 + |G_n|^2} * \begin{bmatrix} H_n^* & G_n \\ -G_n^* & H_n \end{bmatrix} * \begin{bmatrix} X_n \\ Y_n^* \end{bmatrix} \quad (12)$$

Signals $A_n$ and $B_n$ can be determined using equation (12). It should be noted, that the process just described is not the only way to implement STC. Other methods can also be implemented in accordance with the systems and methods described herein. Importantly, however, by adding time diversity, such as described in the preceding equations, to the space diversity already achieved by using base stations 1112 and 1114 to communicate with device 1116 simultaneously, the BER can be reduced even further to recover even more bandwidth.

Figure 29:
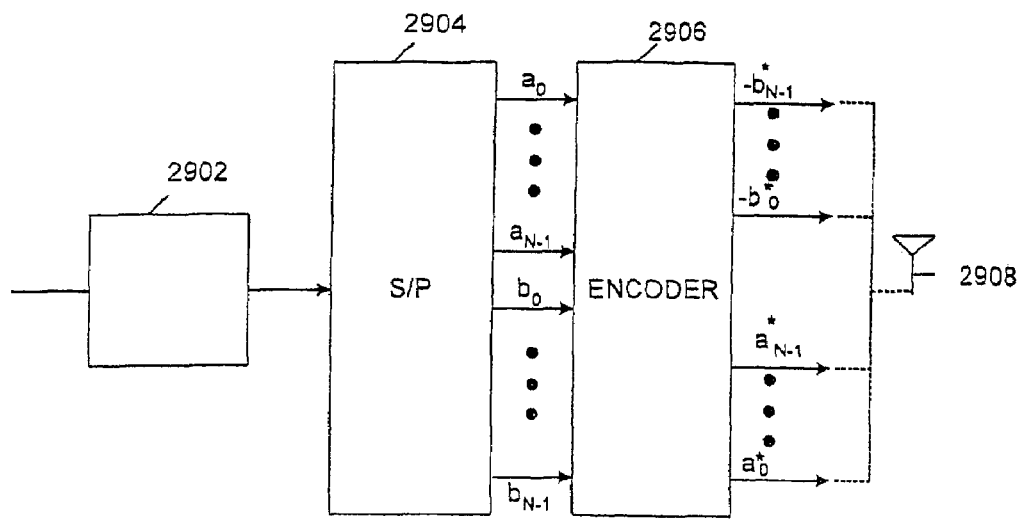
FIG. 29 is a logical block diagram illustrating an exemplary transmitter that can be used in the network of FIG. 28 to implement the method of FIG. 27.
Figure 30:
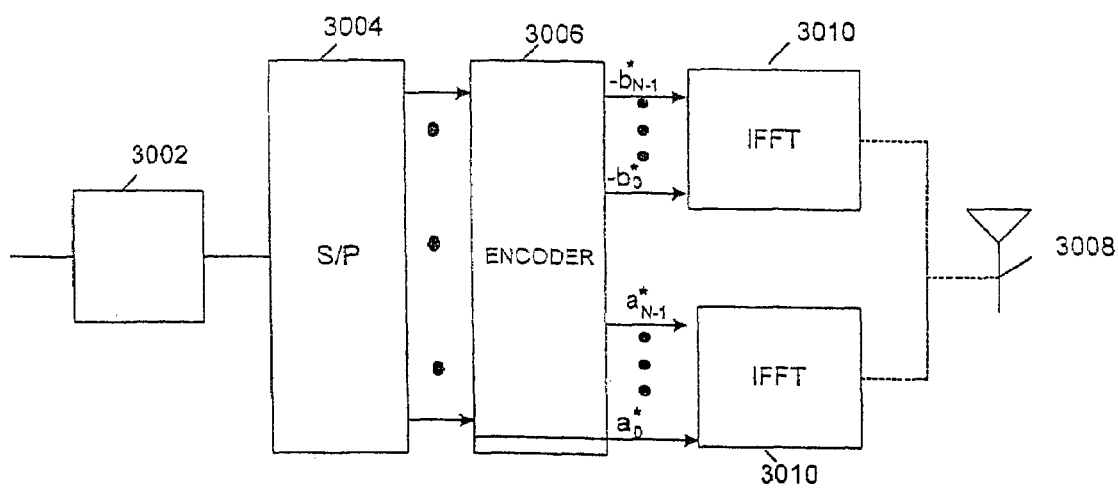
FIG. 30 is a logical block diagram illustrating another exemplary transmitter that can be used in the network of FIG. 28 to implement the method of FIG. 27.

An example transmitter 2900 configured to communicate using STC in accordance with the systems and methods described herein is illustrated in FIG. 29. Transmitter 2900 includes a block storage device 2902, a serial-to-parallel converter 2904, encoder 2906, and antenna 2908. Block storage device 2902 is included in transmitter 2900 because a 1 block delay is necessary to implement the coding illustrated in FIG. 28. This is because transmitter 2804 first transmits −$b_n$*(n=N−1 to 0). But $b_n$ is the second block, so if transmitter 2900 is going to transmit −$b_n$* first, it must store two blocks, e.g., $a_n$ and $b_n$, and then generate block 2814a and 2814b (see FIG. 28).

Serial-to-parallel converter 2904 generates parallel bit streams from the bits of blocks $a_n$ and $b_n$. Encoder 2906 then encodes the bit streams as required, e.g., encoder 2906 can generate −$b_n$* and $a_n$* (see blocks 2814a and 2814b in FIG. 28). The encoded blocks are then combined into a single transmit signal as described above and transmitted via antenna 2908.

Transmitter 2900 preferably uses TDM to transmit messages to receiver 2806. Transmitter 3000 also includes block storage device 3002, a serial-to-parallel converter 3004, encoder 3006, and antenna 3008, which are configured to perform in the same manner as the corresponding components in transmitter 2900. But in addition, transmitter 3000 includes IFFTs 3010 to take the IFFT of the blocks generated by encoder 2906. Thus, transmitter 3000 transmits −$B_n$* and $A_n$* as opposed to −$b_n$* and $a_n$*, which provides space, frequency, and time diversity.

Figure 31:
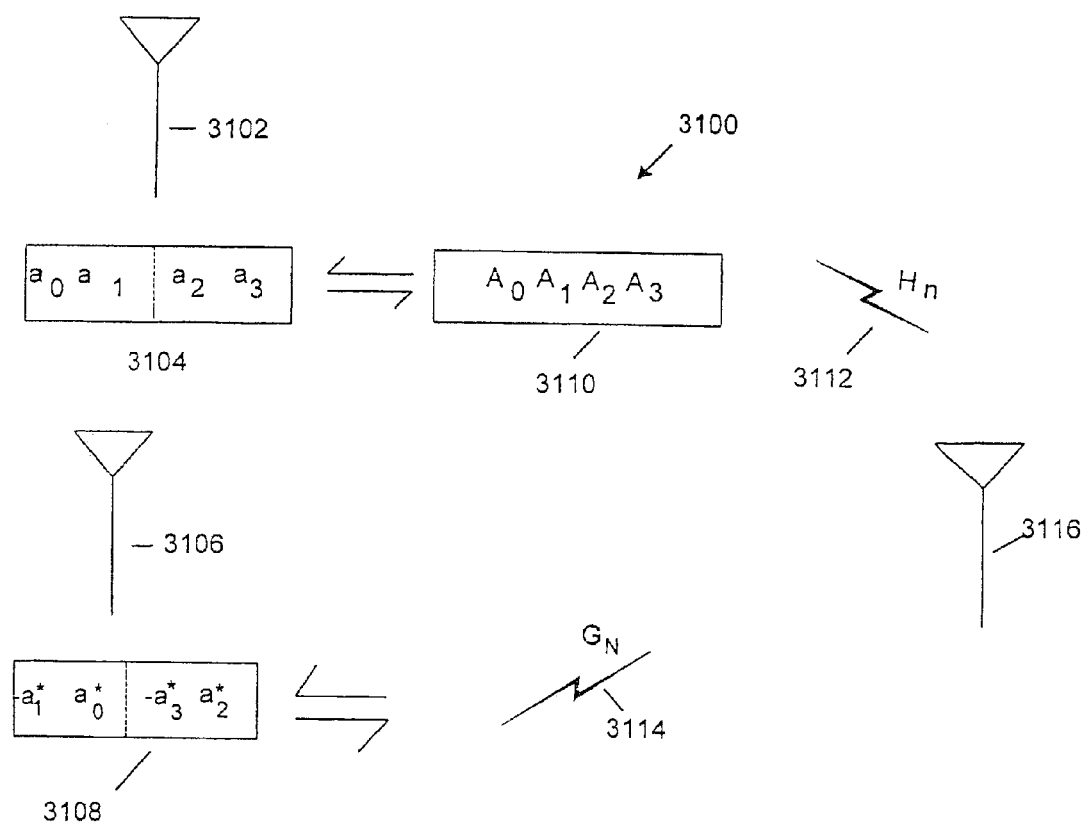
FIG. 31 is a diagram illustrating another exemplary wireless communication network in which the method of FIG. 27 can be implemented.

FIG. 31 illustrates an alternative system 3100 that also uses FDM but that eliminates the 1 block delay associated with transmitters 2900 and 3000. In system 3100, transmitter 3102 transmits over channel 3112 to receiver 3116. Transmitter 3106 transmits over channel 3114 to receiver 3116. As with transmitters 2802 and 2804, transmitters 3102 and 3106 implement an encoding scheme designed to recover bandwidth in system 3100. In system 3100, however, the coordinated encoding occurs at the symbol level instead of the block level.

Thus, for example, transmitter 3102 can transmit block 3104 comprising symbols $a_0$, $a_1$, $a_2$, and $a_3$. In which case, transmitter 3106 will transmit a block 3108 comprising symbols $-a_1^*$, $a_0^*$ $-a_3^*$, and $a_2^*$. As can be seen, this is the same encoding scheme used by transmitters 2802 and 2804, but implemented at the symbol level instead of the block level As such, there is no need to delay one block before transmitting. An EFFT of each block 3104 and 3108 can then be taken and transmitted using FDM. An IFFT 3110 of block 3104 is shown in FIG. 31 for purposes of illustration.

Channels 3112 and 3114 can be described by $H_n$ and $G_n$, respectively. Thus, in receiver 3116 the following symbols will be formed:

$$(A_0^*H_0)-(A_1^{^*}*G_0)$$

$$(A_1^*H_1)+(A_0^{^*}*G_1)$$

$$(A_2^*H_2)-(A_3^{^*}*G_2)$$

$$(A_3^*H_3)+(A_2^{^*}*G_3)$$

In time, each symbol $a_n$(n=0 to 3) occupies a slightly different time location. In frequency, each symbol $A_n$(n=0 to 3) occupies a slightly different frequency. Thus, each symbol $A_n$ is transmitted over a slightly different channel, i.e., $H_n$(n=0 to 3) or $G_n$ (n=0 to 3), which results in the combinations above.

As can be seen, the symbol combinations formed in the receiver are of the same form as equations (5) and (6) and, therefore, can be solved in the same manner, but without the one block delay.

In order to implement STC or Space Frequency Coding (SFC) diversity as described above, bases stations 1112 and 1114 must be able to coordinate encoding of the symbols that are simultaneously sent to a particular device, such as device 1116 or 1118. Fortunately, base stations 1112 and 1114 are preferably interfaced with a common network interface server. For example, in a LAN, base stations 1112 and 1114 (which would actually be service access points in the case of a LAN) are interfaced with a common network interface server that connects the LAN to a larger network such as a Public Switched Telephone Network (PSTN). Similarly, in a wireless WAN, base stations 1112 and 1114 are typically interfaced with a common base station control center or mobile switching center. Thus, coordination of the encoding can be enabled via the common connection with the network interface server. Bases station 1112 and 1114 can then be configured to share information through this common connection related to communications with devices at the edge of cells 1104 and 1106. The sharing of information, in turn, allows time or frequency diversity coding as described above.

It should be noted that other forms of diversity, such as polarization diversity or delay diversity, can also be combined with the spatial diversity in a communication system designed in accordance with the systems and methods described herein. The goal being to combine alternative forms of diversity with the spatial diversity in order to recover larger amounts of bandwidth. It should also be noted, that the systems and methods described can be applied regardless of he number of base stations, devices, and communication cells involved.

Briefly, delay diversity can preferably be achieved in accordance with the systems and methods described herein by cyclical shifting the transmitted blocks. For example, one transmitter can transmit a block comprising $A_0$, $A_1$, $A_2$, and $A_3$ in that order, while the other transmitter transmits the symbols in the following order $A_3$, $A_0$, $A_1$, and $A_2$. Therefore, it can be seen that the second transmitter transmits a cyclically shifted version of the block transmitted by the first transmitter. Further, the shifted block can be cyclically shifted by more then one symbol of required by a particular implementation.

9. Forward Error Correction

Forward Error Correction (FEC) is used to control errors in a communication system. When FEC is included, extra bits are transmitted with the data that can be used by the receiver to check for errors in the data that was received. Depending on the implementation, the receiver can then ask that the data be resent if too many errors are detected. Alternatively, the receiver can include some mechanism by which it tries to correct detected errors.

Figure 32:
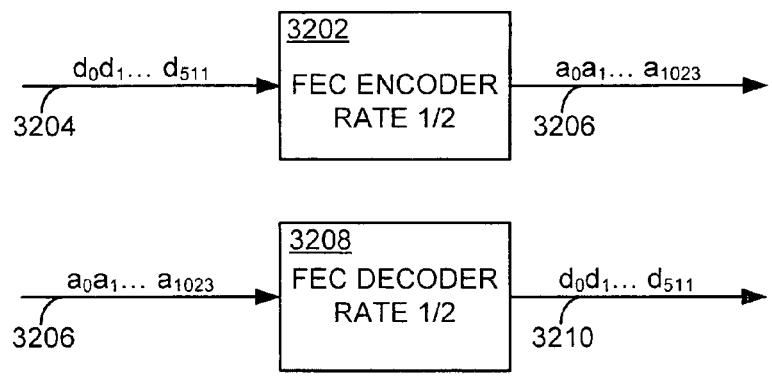
FIG. 32 is a diagram illustrating an exemplary FEC encoder and exemplary FEC decoder.

Accordingly, as can be seen in FIG. 32, an FEC encoder 3202 adds bits to an input data stream 3204 to create an output data stream 3206 that necessarily has a higher data rate due to the added bits. In the example of FIG. 32, FEC encoder 3202 is a ½ rate FEC encoder, which means that for every input bit $d_n$, FEC encoder 3202 adds a bit that can be used to detect errors when data stream 3206 is decoded. Thus, the data rate of output 3206 is twice that of input 3204. Data stream 3206 can then be modulated and transmitted to a receiver. In the receiver, an FEC decoder 3208 can be used to remove the extra bits and detect errors in the original data. Thus, FEC decoder 3208 should match FEC encoder 3202, i.e., FEC decoder 3208 should be a ½ rate FEC decoder, in the above example.

Figure 33:
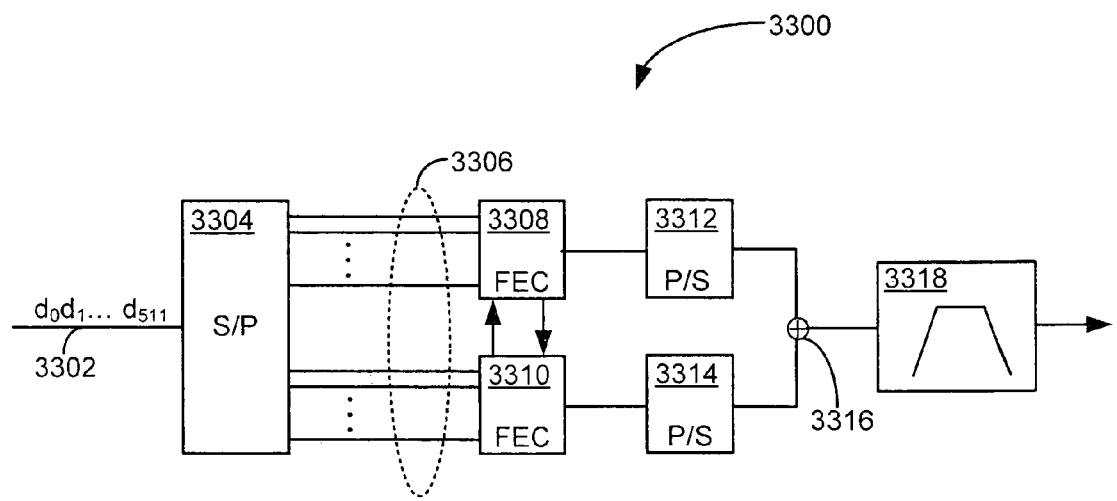
FIG. 33 is a diagram illustrating an example FEC encoder configured in accordance with one embodiment.

A problem with conventional FEC encoders and decoders is that the data rates can be too high for conventional technology. This can be especially true, for example, in an ultra-wideband application, where the data rates can be extremely high. One way to overcome this problem in accordance with the systems and methods described herein is illustrated in FIG. 33, which depicts a portion of a transmitter chain 3300. In the example of FIG. 33, a data stream 3302, with a data rate (R) is first split into a plurality of parallel data streams 3306 in serial to parallel converter 3304, each with a lower data rate (R/n) where n is the number of parallel data streams 3306. The parallel data streams 3306 can then be encoded using a plurality of FEC encoders. Here two encoders 3308 and 3310 are illustrated. Thus, each of FEC encoders 3308 and 3310 can, depending on the implementation, handle half as much data and operate at a lower speed than required in a conventional system. More generally, FEC encoders 3308 and 3310 can be configured to assist each other with FEC encoding and reduce the overall load on each FEC encoder in the system. This, of course, requires some coordination, or message passing, between the two FEC encoders.

The outputs of FEC encoders 3308 and 3310 can then, for example, be passed through Parallel to serial converters 3312 and 3314 and combined via combiner 3316 into a single data stream with FEC encoding. The single data stream can then be optional filtered and/or pulse shaped before being modulated an transmitted, e.g., via optional block 3318.

Figure 34:
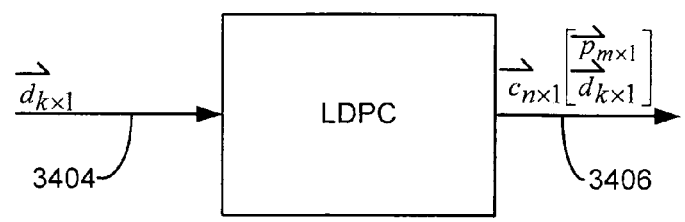
FIG. 34 is a diagram illustrating a FEC encoder configured to generated a code word from input data in accordance with one embodiment.

In another example embodiment, of an FEC encoder configured in accordance with the systems and methods described herein, a code word is generated from an input data word by adding parity bits to the data word as illustrated in FIG. 34. In this example embodiment, FEC encoder 3402, referred to as a LDPC, takes data word 3404 and generates output code word 3406. As can be seen, the data word and code word are illustrated in matrix form. Thus, for example, the data word is a matrix comprising Arrows and 1 column.

In one embodiment of an LDPC 3402, the code word can be generated using a generator matrix as illustrated by the following equation:

$$\vec{C}_{N\times 1} = G_{N\times K} * \vec{d}_{K\times 1} \tag{13}$$

where: $G_{N\times K}$ is the Generator Matrix

N=M+k;

R=k/N;

if R=½, then M=k.

The generator matrix can, in turn, he generated from an identify matrix and a parity check matrix as illustrated in the following equation:

$$G = [I; P] \tag{14}$$

where: I=the identity matrix; and

P=the parity matrix.

Alternatively, a parity matrix H can be used to generate the code word C according to the following:

$$H_{M\times N} * \vec{C}_{N\times 1} = \vec{0}_{M\times 1} \tag{15}$$

The parity matrix H can then be defined as:

$$H_{M\times N} = [H^P_{M\times M} H^D_{M\times K}] \tag{16}$$

Accordingly, and dropping the subscripts for simplicity:

$$[H^P H^D] * \begin{bmatrix} \vec{P} \\ \vec{d} \end{bmatrix} = 0, \text{ or} \tag{17}$$

$$(H^P * \vec{P}) + (H^D * \vec{d}) = 0 \tag{18}$$

The goal now is to solve for $\vec{P}$, since $\vec{d}$ is known, i.e., it is the input data. To facilitate finding $\vec{P}$ in one embodiment, $H^P$ is configured as a dual diagonal matrix with M rows and M columns. Dual diagonal matrices are well known and will not be described here; however and exemplary one is illustrated by the following:

$$H^P = \begin{bmatrix} 1 & 1 & 0 & 0 & \ldots & 0 \\ 0 & 1 & 1 & 0 & \ldots & 0 \\ 0 & 0 & 1 & 1 & \ldots & 0 \\ 0 & 0 & 0 & 1 & \ldots & \\ & & & & & 1 \\ 0 & 0 & 0 & \ldots & 0 & 1 \end{bmatrix} \tag{19}$$

Further, $H^D$ can, depending on the embodiment, be formed from a matrix of matrices. In one embodiment, this matrix of matrices is itself block cyclic. For example, in one embodiment, 4 matrices A, B, C and D can be used as in the following:

$$H^D = \begin{bmatrix} A & B & C & D \\ B & C & D & A \\ C & D & A & B \\ D & A & B & C \end{bmatrix} \tag{20}$$

Here, each of the matrices A, B, C, and D will have k/4 rows and k/4 columns.

Thus, an encoder and decoder configured in accordance with the systems and methods described herein can be optimized for a dual diagonal $H^P$ and a block cyclic $H^D$, as explained below. Many methods can be used to generate matrices A, B, C, and D consistent with the systems and methods described herein. One example method, however, will be described in the following paragraphs. This example method will assume, for the time being, that k=16 and therefore k/4−=4. Then an identity matrix I can be used, such as the following:

$$I = \begin{bmatrix} 1 & 0 & 0 & 0 \\ 0 & 1 & 0 & 0 \\ 0 & 0 & 1 & 0 \\ 0 & 0 & 0 & 1 \end{bmatrix} \tag{21}$$

Each of matrices A, B, C, and D can then be generated from this identity matrix I. For example, a permutation vector, in this example of length 4, can then be used to generate A. Of course, other methods for generating matrices A, B, C, and D can be used consistently with the systems and methods described herein. Thus, the matrix A can, e.g., have the following form, once an appropriate permutation vector is used to modify identity matrix I:

$$A = \begin{bmatrix} 0 & 0 & 0 & 1 \\ 1 & 0 & 0 & 0 \\ 0 & 0 & 1 & 0 \\ 0 & 1 & 0 & 0 \end{bmatrix} \tag{22}$$

Basically, as can be seen, a permutation vector can be used to shift the positions of the 1's in identity matrix I. In one embodiment, a single permutation matrix can be required. Once the first matrix A is generated using the single permutation vector, then the other matrices B, C, and D can be generated by shifting matrix A. For example, in one embodiment, each subsequent matrices B, C, and D is generated by shifting the previous matrix, starting with A, by 90°. Thus, B would be as follows:

$$B = \begin{bmatrix} 1 & 0 & 0 & 0 \\ 0 & 0 & 1 & 0 \\ 0 & 0 & 0 & 1 \\ 0 & 1 & 0 & 0 \end{bmatrix} \tag{23}$$

But as can be seen, in the example embodiment for generating matrices A, B, C, and D described above, each row has only a single 1.

In one embodiment, Galois Field algebra (GF(2)) can be used to define the following equations for use in solving for $\vec{P}$:

1+1=0;

1−1=0;

1+0=1;

0+1=1;

0+1=1; and

0−1=−1=1. (24)

Thus, even results are equal to 0, while odd results are equal to 1.

Now returning to the equation at issue:

$(H^P * \vec{P}) + (H^D * \vec{d}) = 0$ (18)

This can be rewritten as:

$(H^P * \vec{P}) = -(H^D * \vec{d})$ (25)

But using the equations (24), −1=1, therefore:

$(H^P * \vec{P}) = (H^D * \vec{d})$ (26)

In one embodiment, the following equation can be used:

$(H^D * \vec{d}) = \vec{u}$ (27)

Accordingly:

$(H^P * \vec{P}) = \vec{u}$ (28)

Equation (28) can be implemented effectively if $\vec{u}$ can be generated efficiently. In one embodiment, based on the examples above, if k=6, then $\vec{u}$ can be determined as follows:

$$\begin{bmatrix} 1 & 1 & 0 & 0 & 0 & 0 \\ 0 & 1 & 1 & 0 & 0 & 0 \\ 0 & 0 & 1 & 1 & 0 & 0 \\ 0 & 0 & 0 & 1 & 1 & 0 \\ 0 & 0 & 0 & 0 & 1 & 1 \\ 0 & 0 & 0 & 0 & 0 & 1 \end{bmatrix} * \begin{bmatrix} p_5 \\ p_4 \\ p_3 \\ p_2 \\ p_1 \\ p_0 \end{bmatrix} = \begin{bmatrix} u_5 \\ u_4 \\ u_3 \\ u_2 \\ u_1 \\ u_0 \end{bmatrix}$$ (29)

This will result in the following equations:

$p_0 = u_0$;

$p_1 + p_0 = u_1$;

$p_2 + p_1 = u_2$; (30)

$p_3 + p_2 = u_3$;

$p_4 + p_3 = u_4$;

$p_5 + p_4 = u_5$;

The equations of (30) define the following general equation:

$p_n = u_n - p_{n-1}$ (31)

Figure 35:
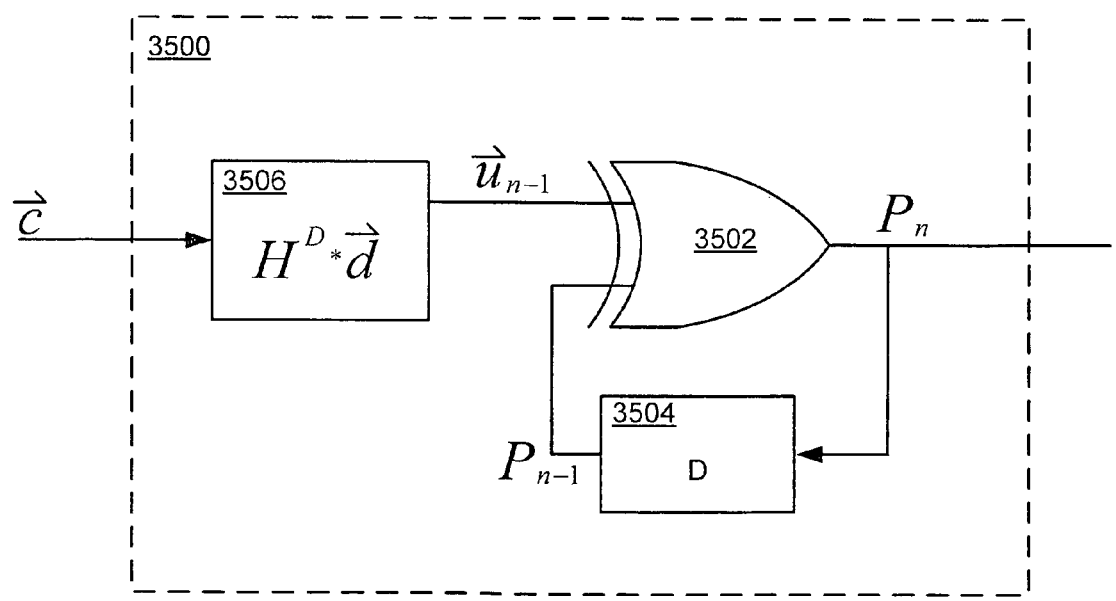
FIG. 35 is a diagram illustrating the encoder of FIG. 34 in more detail.

This equation then suggest a configuration for an LDPC encoder 3500, such as that illustrated in FIG. 35. As can be seen, the $\vec{u}$ values are fed into Exclusive-OR (XOR) 3502, the output of which is fed through a delay 3504 and back to the other input of XOR 3502. A remaining issue, however, is the generation of the $\vec{u}$ terms. In other words, the equation $(H^P * \vec{P}) = \vec{u}$ as implemented by block 3506 should also be done in the most efficient manner possible.

In the example above, $H^D$ was partitioned in 4 s, therefore $\vec{d}$ should also be partitioned by 4 as illustrated in the following:

$$\vec{u} = \begin{bmatrix} A & B & C & D \\ D & A & B & C \\ C & D & A & B \\ B & C & D & A \end{bmatrix} * \begin{bmatrix} \vec{d}_A \\ \vec{d}_B \\ \vec{d}_C \\ \vec{d}_D \end{bmatrix}$$ (32)

Figure 36:
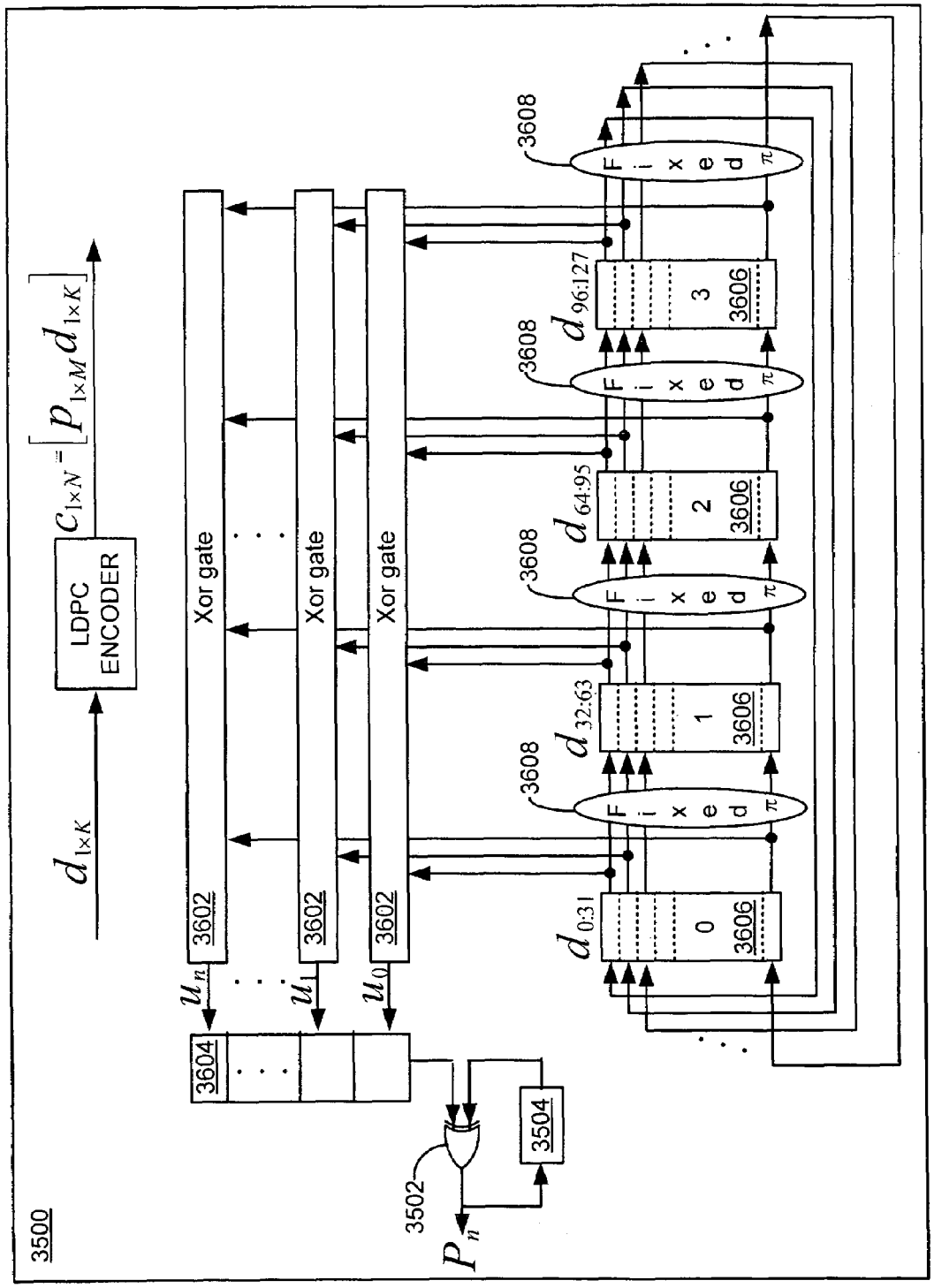
FIG. 36 is a diagram illustrating further detail for the encoder of FIG. 34.

The above equation can be implemented efficiently, for example, using a circuit such as the example circuit illustrated in FIG. 36. The circuit of FIG. 36 is generalized for the more realistic situation where k=128; however, it will be appreciated that the example embodiments described herein are not limited to any particular lengths or configurations. As can be seen, the circuit of FIG. 36 uses a bank of cyclic shift registers 3606 to implement $\vec{d}$. The outputs of shift registers 3606 can then be passed to a plurality XORs 3602 as shown. Thus, XORs 3202 collect the appropriate outputs from shift registers 3606 in order to generate the $\vec{u}$ terms.

But since it is known, in the examples above, that the output of each cyclic shift register will only have one 1, due to the fact that A, B, C, and D have only one 1 in each row, the outputs of cyclic shift registers 3606 can be rearranged and fixed so that, e.g., the first outputs of each go to the first XOR 3202, the second outputs go to the second XOR 3202, etc. Accordingly, efficient fixed connections 3608 can be used to reduce the complexity of LDPC 3500. The $\vec{u}$ terms can then be registered and fed to XOR 3502 as illustrated.

Accordingly, if everything is segmented by 4s as illustrated in the above examples, then the cyclic shift registers 3606 can be shifted k/4 times. On each clock cycle, k/4 of the solution would be generated, such that it takes k/4 cycles to get the entire solution. This can result in a highly parallel encoder, such as that illustrated in FIG. 36, for high speed operation. The result can also be a low cost encoder, because the hardware required can be reduced to ¼th that required by conventional circuits through the reuse of the components.

The LDPC encoder of FIG. 3600 can, therefore, be used to generate code word $\vec{C}$, which can be modulated and transmitted. But the receiver will receive $\vec{C}$ corrupted by noise as illustrated in the following:

$\vec{x} = (1 - 2\vec{C}) + \text{(noise)}$ (33)

The job of the decoder is then to extract $\vec{d}$ from the signal represented by equation (33). In one embodiment, this can be accomplished by making soft decisions as to the value of $\vec{x}$ and combining it with hard decisions related to the sign $\vec{d}$ such that $\vec{x}$ can then be accurately determined. The soft decisions can be based on a multilevel possibility. For example, if 4 bits are used in 2's complement, then you can have up to 16 levels. In one embodiment, the levels can, for example, be from −8 to 7. Alternatively, using offset 2's complement, the levels can be from −7.5 to 7.5. An advantage of the later is that the levels are not biased, e.g., toward the negative. An advantage of the former, however, is that it includes the level 0. Of course, any level scheme can be used as long as it allows for accurate determinations of $\vec{d}$.

The levels can be used to determine the probabilities of the value of $\vec{x}$ and ultimately $\vec{d}$. For example, if the level determined for $\vec{x}$ is 7 or 7.5, then the decoder can be configured to see this as a high probability that the value is 1. If the level is −8 or −7.5, then this can be seen as a high probability that the value is −1.

Parity check equations can then be generated from the following:

$$\begin{bmatrix} 1 & 1 & 0 & 0 & \cdots & 0 \\ 0 & 1 & 1 & 0 & \cdots & 0 \\ 0 & 0 & 1 & 1 & \cdots & 0 \\ 0 & 0 & 0 & 1 & \cdots & \\ & & & & & 1 \\ 0 & 0 & 0 & \cdots & 0 & 1 \end{bmatrix} * \begin{bmatrix} A & B & C & D \\ B & C & D & A \\ C & D & A & B \\ D & A & B & C \end{bmatrix} * \begin{bmatrix} x_0 \\ x_1 \\ x_2 \\ \\ x_{n-1} \end{bmatrix} \quad (34)$$

This will a set of parity equations in which, based on the examples above, there will be 6 terms, except in the last one, because there is exactly one 1 in each row of A, B, C, and D. The first of these parity equations would then, e.g., look like the following, based on the above examples:

$$S_0 = x_0 + x_1 + x_2 + x_3 + x_4 + x_5 \quad (35)$$

Figure 37:
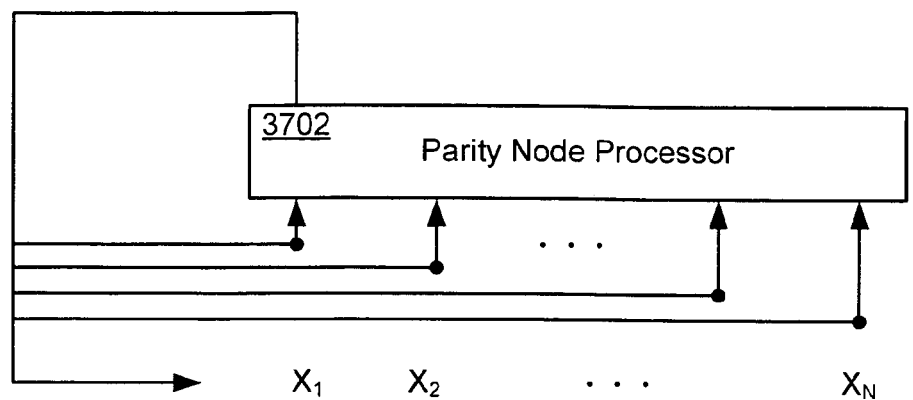
FIG. 37 is a diagram illustrating an example parity node processor that can be included in a decoder in accordance with one embodiment.

Then, if $S_o = +1$, then the operation can be viewed as passing. If, on the other hand, it is −1, then it can be viewed as a failure. A parity node processor 3702 can be used to implement equation (35), as illustrated by the example embodiment depicted in FIG. 37. Message passing algorithms can be used to allow each such node 3702 to make final estimations.

Figure 39:
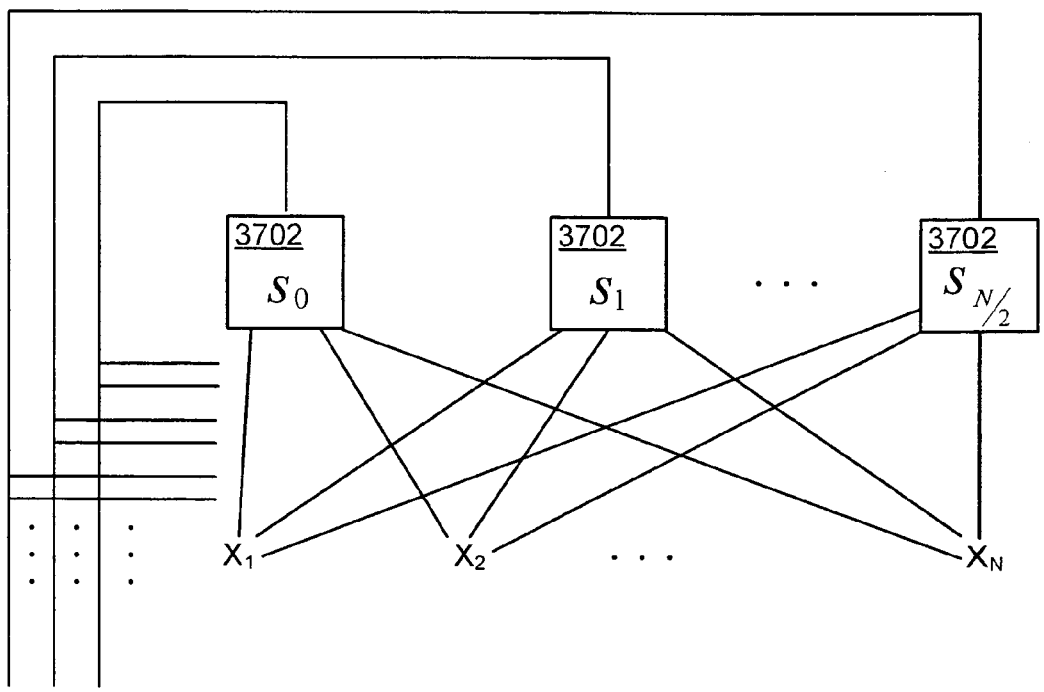
FIG. 39 is a diagram illustrating the parity node processor of FIG. 37 in more detail.

FIG. 39 is a diagram illustrating and example embodiment in which a plurality of parity node processors 3702 are configured in accordance with the systems and methods described herein. Thus, each node 3702 receives information as to what the values $x_0, x_1, \ldots x_N$ are believed to be. A given node 3702 can then process this information and produce estimates as to what the node believes the output of the other nodes should be and feed this information back in such a manner that the subsequent input to the other nodes is modified. It should be noted, therefore, that in such an embodiment, a node does not produce information to be feedback to its own input related to what it believes its own output should be.

Figure 38:
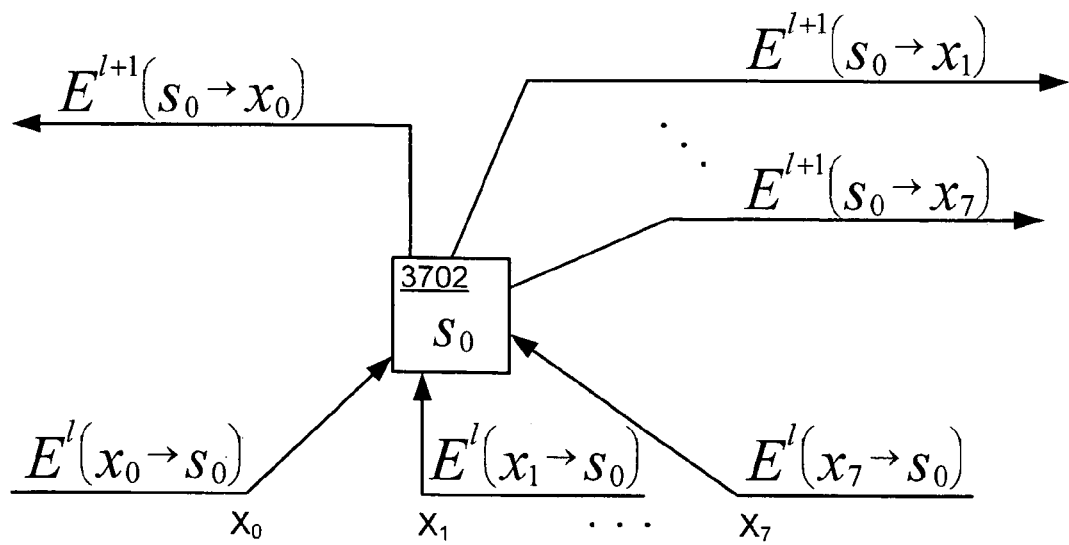
FIG. 38 is a diagram illustrating one node of the parity node processor of FIG. 37.

This is illustrated in FIG. 38 for a single node processor at time=0. As can be seen, information for each bit is provided to node 3702, which processes the information and produces information related to what it determines each bit should be. These input and outputs can be referred to as edges (E). Each output edge is feedback to the relevant input bit. The node processors 3702 will, therefore, comprise storage to store the information being fed to it and processed as required. As a result, both storage and routing overheads can become excessive.

For example, when information related to bit $x_0$ is fed to node $S_0$, the information from each other node related to $x_0$ is also added into the information provided to $s_0$. This is illustrated by the following:

$$x_0 + E^{l+1}(s_1 \to x_0) + E^{l+1}(S_2 \to x_0) + \quad (36)$$

Again, as mentioned above, in this embodiment, the edge produce by node $S_0$ is not fed back to bit $x_0$.

Figure 40:
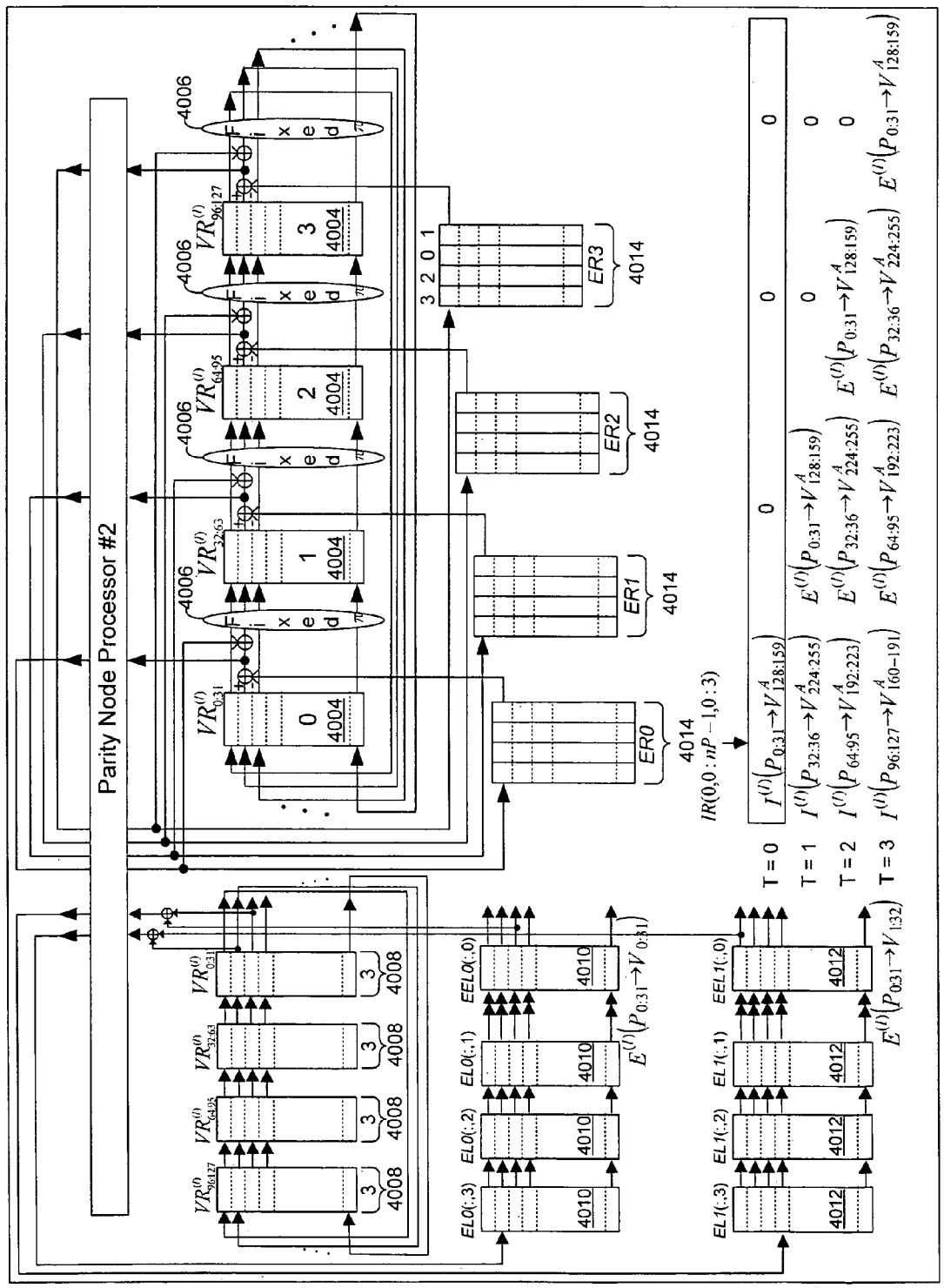
FIG. 40 is a diagram illustrating a parity node processor configured in accordance with one embodiment.

FIG. 40 is a diagram illustrating an example decoder 4000 that can be configured to reduce storage and routing overhead in accordance with one embodiment of the systems and methods described herein. The basic premise behind decoder 4000 is that all the edges produced from parity node processor 4002 can be added and then the last edge for each node, produced by that node, can be subtracted out. Thus, on the right hand side of FIG. 40, a given row can be updated for all edges and then shifted in shift registers 4004. The appropriate edge can then be subtracted out for each row using the data provided from registers 4014, as opposed to doing each row, storing the result and updating it with information from other nodes.

It should be noted that the output of shift registers 4004 can be rearranged and fixed to reduce routing overhead. It should also be noted that this process provides an approximation of the correct data; however, the results converge and ultimately provide the same answer. On the left hand side of decoder 4000, each shift register 4008 gets information from only two nodes 3702, e.g., via registers 4010 and 4012.

Figure 41:
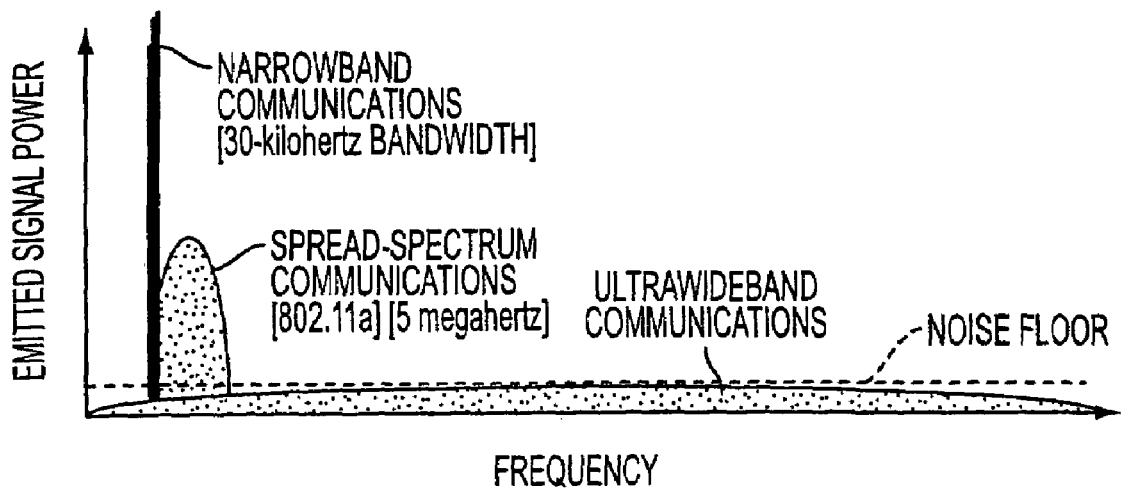
FIG. 41 is an illustration of different communication methods.
Figure 42:
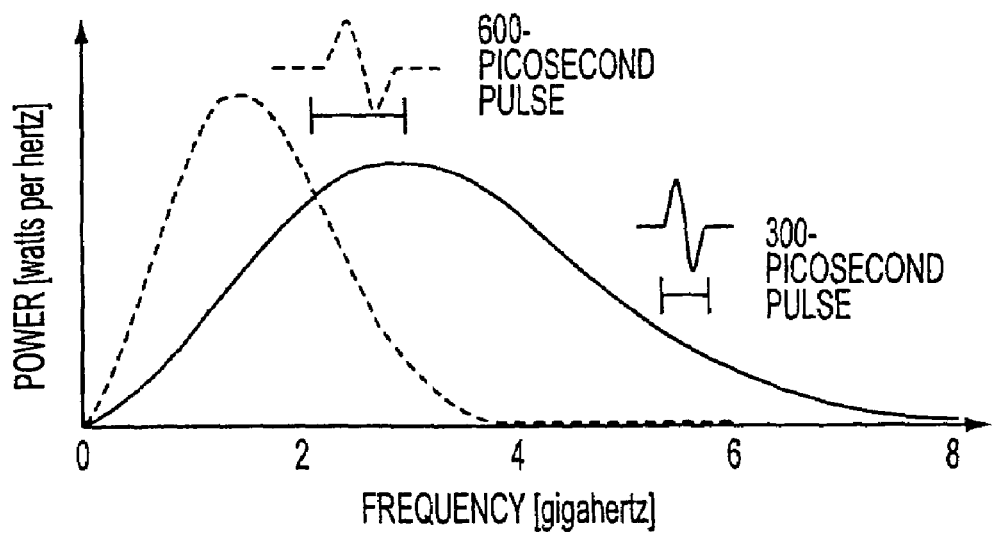
FIG. 42 is an illustration of two ultra-wideband pulses.

With reference to FIGS. 41 and 42, additional embodiments of the present invention will now be described. The embodiments described below employ ultra-wideband communication technology. Referring to FIGS. 41 and 42, ultra-wideband (UWB) communication technology employs discrete pulses of electromagnetic energy that are emitted at, for example, nanosecond or picosecond intervals (generally tens of picoseconds to hundreds of nanoseconds in duration). For this reason, ultra-wideband is often called "impulse radio." That is, the UWB pulses may be transmitted without modulation onto a sine wave, or a sinusoidal carrier, in contrast with conventional carrier wave communication technology. Thus, UWB generally requires neither an assigned frequency nor a power amplifier.

Another example of sinusoidal carrier wave communication technology is illustrated in FIG. 41. IEEE 802.11a is a wireless local area network (LAN) protocol, which transmits a sinusoidal radio frequency signal at a 5 GHz center frequency, with a radio frequency spread of about 5 MHz. As defined herein, a carrier wave is an electromagnetic wave of a specified frequency and amplitude that is emitted by a radio transmitter in order to carry information. The 802.11 protocol is an example of a carrier wave communication technology. The carrier wave comprises a substantially continuous sinusoidal waveform having a specific narrow radio frequency (5 MHz) that has a duration that may range from seconds to minutes.

In contrast, an ultra-wideband (UWB) pulse may have a 2.0 GHz center frequency, with a frequency spread of approximately 4 GHz, as shown in FIG. 42, which illustrates two typical UWB pulses. FIG. 42 illustrates that the shorter the UWB pulse in time, the broader the spread of its frequency spectrum. This is because bandwidth is inversely proportional to the time duration of the pulse. A 600-picosecond UWB pulse can have about a 1.8 GHz center frequency, with a frequency spread of approximately 1.6 GHz and a 300-picosecond UWB pulse can have about a 3 GHz center frequency, with a frequency spread of approximately 3.2 GHz. Thus, UWB pulses generally do not operate within a specific frequency, as shown in FIG. 41. In addition, either of the pulses shown in FIG. 42 may be frequency shifted, for example, by using heterodyning, to have essentially the same bandwidth but centered at any desired frequency. And because UWB pulses are spread across an extremely wide frequency range, UWB communication systems allow communications at very high data rates, such as 100 megabits per second or greater.

Also, because the UWB pulses are spread across an extremely wide frequency range, the power sampled in, for example, a one megahertz bandwidth, is very low. For example, UWB pulses of one nano-second duration and one milliwatt average power (0 dBm) spreads the power over the entire one gigahertz frequency band occupied by the pulse. The resulting power density is thus 1 milliwatt divided by the 1,000 MHz pulse bandwidth, or 0.001 milliwatt per megahertz (−30 dBm/MHz).

Generally, in the case of wireless communications, a multiplicity of UWB pulses may be transmitted at relatively low power density (milliwatts per megahertz). However, an alternative UWB communication system may transmit at a higher power density. For example, UWB pulses may be transmitted between 30 dBm to −50 dBm.

Several different methods of ultra-wideband (UWB) communications have been proposed. For wireless UWB communications in the United States, all of these methods must meet the constraints recently established by the Federal Communications Commission (FCC) in their Report and Order issued Apr. 22, 2002 (ET Docket 98-153). Currently, the FCC is allowing limited UWB communications, but as UWB systems are deployed, and additional experience with this new technology is gained, the FCC may expand the use of UWB communication technology. It will be appreciated that the present invention may be applied to current forms of UWB communications, as well as to future variations and/or varieties of UWB communication technology.

For example, the April 22 Report and Order requires that UWB pulses, or signals occupy greater than 20% fractional bandwidth or 500 megahertz, whichever is smaller. Fractional bandwidth is defined as 2 times the difference between the high and low 10 dB cutoff frequencies divided by the sum of the high and low 10 dB cutoff frequencies. However, these requirements for wireless UWB communications in the United States may change in the future.

Communication standards committees associated with the International Institute of Electrical and Electronics Engineers (IEEE) are considering a number of ultra-wideband (UWB) wireless communication methods that meet the current constraints established by the FCC. One UWB communication method may transmit UWB pulses that occupy 500 MHz bands within the 7.5 GHz FCC allocation (from 3.1 GHz to 10.6 GHz). In one embodiment of this communication method, UWB pulses have about a 2-nanosecond duration, which corresponds to about a 500 MHz bandwidth. The center frequency of the UWB pulses can be varied to place them wherever desired within the 7.5 GHz allocation. In another embodiment of this communication method, an Inverse Fast Fourier Transform (IFFT) is performed on parallel data to produce 122 carriers, each approximately 4.125 MHz wide. In this embodiment, also known as Orthogonal Frequency Division Multiplexing (OFDM), the resultant UWB pulse, or signal is approximately 506 MHz wide, and has a 242 nanosecond duration. It meets the FCC rules for UWB communications because it is an aggregation of many relatively narrow band carriers rather than because of the duration of each pulse.

Another UWB communication method being evaluated by the IEEE standards committees comprises transmitting discrete UWB pulses that occupy greater than 500 MHz of frequency spectrum. For example, in one embodiment of this communication method, UWB pulse durations may vary from 2 nanoseconds, which occupies about 500 MHz, to about 133 picoseconds, which occupies about 7.5 GHz of bandwidth. That is, a single UWB pulse may occupy substantially all of the entire allocation for communications (from 3.1 GHz to 10.6 GHz).

Yet another UWB communication method being evaluated by the IEEE standards committees comprises transmitting a sequence of pulses that may be approximately 0.7 nanoseconds or less in duration, and at a chipping rate of approximately 1.4 giga pulses per second. The pulses are modulated using a Direct-Sequence modulation technique, and is called DS-UWB. Operation in two bands is contemplated, with one band is centered near 4 GHz with a 1.4 GHz wide signal, while the second band is centered near 8 GHz, with a 2.8 GHz wide UWB signal. Operation may occur at either or both of the UWB bands. Data rates between about 28 Megabits/second to as much as 1,320 Megabits/second are contemplated.

Thus, described above are three different methods of wireless ultra-wideband (UWB) communication. It will be appreciated that the present invention may be employed using any one of the above-described methods, variants of the above methods, or other UWB communication methods yet to be developed.

Certain features of the present invention may be employed in an ultra-wideband (UWB) communication system to provide forward error correction (FEC). For example, in one embodiment, an ultra-wideband transmitter includes a processor configured to generate data for transmission in the form of a plurality of ultra-wideband pulses. The transmitter includes a FEC encoder that generates a code word based on the data. The FEC includes a plurality of cyclic shift registers configured to receive and process the data, a plurality of fixed connections between each of the plurality of cyclic shift registers and a plurality of XOR gates communicating with the plurality of fixed connections. In one embodiment, the fixed connections are arranged such that the first fixed connection communicates with the first of the plurality of XOR gates, the second fixed connection communicates with the second of the plurality of XOR gates, and so on until the last of the fixed connections communicates with the last of the plurality of XOR gates.

Generally, the FEC encoder encodes data words into code words that comprise a parity matrix. In one embodiment, the encoder is optimized based on the properties of the parity matrix in order to reduce routing overhead and size.

The UWB devices, systems and/or methods in the above-described embodiments communicate with each other by transmitting and receiving a plurality of discrete electromagnetic pulses, as opposed to a substantially continuous carrier wave. Each pulse may have a duration that can range between about 10 picoseconds to about 1 microsecond, and a power that may range between about +30 dBm to about −60 dBm, as measured at a single frequency.

The present invention may be employed in any type of network, be it wireless, wire, or a mix of wire media and wireless components. That is, a network may use both wire media, such as coaxial cable, and wireless devices, such as satellites, or cellular antennas. As defined herein, a network is a group of points or nodes connected by communication paths. The communication paths may use wires or they may be wireless. A network as defined herein can interconnect with other networks and contain sub-networks. A network as defined herein can be characterized in terms of a spatial distance, for example, such as a local area network (LAN), a personal area network (PAN), a metropolitan area network (MAN), a wide area network (WAN), and a wireless personal area network (WPAN), among others. A network as defined herein can also be characterized by the type of data transmission technology used by the network, such as, for example, a Transmission Control Protocol/Internet Protocol (TCP/IP) network, a Systems Network Architecture network, among others. A network as defined herein can also be characterized by whether it carries voice, data, or both kinds of signals. A network as defined herein may also be characterized by users of the network, such as, for example, users of a public switched telephone network (PSTN) or other type of public network, and private networks (such as within a single room or home), among others. A network as defined herein can also be characterized by the usual nature of its connections, for example, a dial-up network, a switched network, a dedicated network, and a non-switched network, among others. A network as defined herein can also be characterized by the types of physical links that it employs, for example, optical fiber, coaxial cable, a mix of both, unshielded twisted pair, and shielded twisted pair, among others.

The present invention may be employed in any type of wireless network, such as a wireless PAN, LAN, MAN, or WAN. In addition, the present invention may be employed in wire media, as the present invention dramatically increases the bandwidth of conventional networks that employ wire media, such as hybrid fiber-coax cable networks, or CATV networks, yet it can be inexpensively deployed without extensive modification to the existing wire media network.

Thus, it is seen that systems and methods of ultra-wideband communications are provided. One skilled in the art will appreciate that the present invention can be practiced by other than the above-described embodiments, which are presented in this description for purposes of illustration and not of limitation. The specification and drawings are not intended to limit the exclusionary scope of this patent document. It is noted that various equivalents for the particular embodiments discussed in this description may practice the invention as well. That is, while the present invention has been described in conjunction with specific embodiments, it is evident that many alternatives, modifications, permutations and variations will become apparent to those of ordinary skill in the art in light of the foregoing description. Accordingly, it is intended that the present invention embrace all such alternatives, modifications and variations as fall within the scope of the appended claims. The fact that a product, process or method exhibits differences from one or more of the above-described exemplary embodiments does not mean that the product or process is outside the scope (literal scope and/or other legally-recognized scope) of the following claims.

What is claimed is:

1. An ultra-wideband transmitter, comprising:
   a processor configured to generate data to be transmitted in the form of a plurality of ultra-wideband pulses by the transmitter, and
   a forward error correction encoder configured to generate a code word based on the data, the forward error correction encoder comprising:
      a plurality of cyclic shift registers configured to receive and process the data;
      a plurality of fixed connections between each of the plurality of cyclic shift registers,
      a plurality of XOR gates communicating with the plurality of fixed connections, the fixed connections arranged such that the first fixed connection communicates with the first of the plurality of XOR gates, the second fixed connection communicates with the second of the plurality of XOR gates, and so on until the last of the fixed connections communicates with the last of the plurality of XOR gates;
   further comprising a register configured to store an output of each of the plurality of XOR gates; and;
   further comprising a register XOR gate communicating with the register, the register XOR gate configured to XOR an output of the register with a delayed version of the output of the register.

2. An ultra-wideband transmitter, comprising:
   a processor configured to generate data to be transmitted in the form of a plurality of ultra-wideband pulses by the transmitter, and
   a forward error correction encoder configured to generate a code word based on the data, the forward error correction encoder comprising:
      a plurality of cyclic shift registers configured to receive and process the data;
      a plurality of fixed connections between each of the plurality of cyclic shift registers,
      a plurality of XOR gates communicating with the plurality of fixed connections, the fixed connections arranged such that the first fixed connection communicates with the first of the plurality of XOR gates, the second fixed connection communicates with the second of the plurality of XOR gates, and so on until the last of the fixed connections communicates with the last of the plurality of XOR gates;
   wherein the code word is generated using a parity matrix, and the parity matrix comprises a matrix of cyclic matrices; and
   wherein a first of the cyclic matrices is generated from an identity matrix and a permutation vector, and each of the subsequent cyclic matrices are generated by rotating the previous cyclic matrix.

3. An ultra-wideband transmitter, comprising:
   a processor configured to generate data to be transmitted in the form of a plurality of ultra-wideband pulses by the transmitter, and
   a forward error correction encoder configured to generate a code word based on the data, the forward error correction encoder comprising:
      a plurality of cyclic shift registers configured to receive and process the data;
      a plurality of fixed connections between each of the plurality of cyclic shift registers,
      a plurality of XOR gates communicating with the plurality of fixed connections, the fixed connections arranged such that the first fixed connection communicates with the first of the plurality of XOR gates, the second fixed connection communicates with the second of the plurality of XOR gates, and so on until the last of the fixed connections communicates with the last of the plurality of XOR gates;
   wherein the plurality of fixed connections are arranged based on a dual diagonal matrix and a cyclic matrix.

* * * * *